US009184160B2

(12) United States Patent
Yamazaki

(10) Patent No.: US 9,184,160 B2
(45) Date of Patent: Nov. 10, 2015

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 198 days.

(21) Appl. No.: 13/748,978

(22) Filed: Jan. 24, 2013

(65) Prior Publication Data

US 2013/0193433 A1 Aug. 1, 2013

(30) Foreign Application Priority Data

Jan. 26, 2012 (JP) ................................. 2012-013985

(51) Int. Cl.
*H01L 29/04* (2006.01)
*H01L 27/06* (2006.01)
(Continued)

(52) U.S. Cl.
CPC ........ *H01L 27/0629* (2013.01); *H01L 27/1225* (2013.01); *H01L 27/1255* (2013.01); *H01L 29/66969* (2013.01); *H01L 27/1156* (2013.01)

(58) Field of Classification Search
CPC .................................................. H01L 27/1255
USPC .............................................. 257/57, 59, 72
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1 737 044 A1 12/2006
EP 2 226 847 A2 9/2010
(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Samuel Gebremariam
(74) *Attorney, Agent, or Firm* — Fish & Richardson P.C.

(57) ABSTRACT

A semiconductor device having high electric characteristics and in which a capacitor is efficiently formed even if the semiconductor device has a miniaturized structure. In a top-gate (also referred to as staggered) transistor using an oxide semiconductor film as its active layer, a source electrode and a drain electrode has a two-layer structure (a first electrode film and a second electrode film). Then, a capacitor is formed using a film formed using a material and a step similar to those of the first electrode film, a gate insulating film, and a gate electrode. Accordingly, the transistor and the capacitor can be formed through the same process efficiently. Further, the second electrode is connected onto the oxide semiconductor film between a first electrode and a channel formation region of the transistor. Accordingly, resistance between source and drain electrodes can be reduced; therefore, electric characteristics of the semiconductor device can be improved.

14 Claims, 23 Drawing Sheets

(51) Int. Cl.
*H01L 29/66* (2006.01)
*H01L 27/12* (2006.01)
*H01L 27/115* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,245,331 | B2 | 7/2007 | Yamazaki et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,714,950 | B2 | 5/2010 | Yamazaki et al. |
| 7,732,819 | B2 | 6/2010 | Akimoto et al. |
| 7,791,072 | B2 | 9/2010 | Kumomi et al. |
| 8,143,134 | B2 | 3/2012 | Shichi et al. |
| 8,228,454 | B2 | 7/2012 | Yamazaki et al. |
| 8,237,166 | B2 | 8/2012 | Kumomi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1* | 5/2007 | Akimoto .................. 257/61 |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0220906 | A1* | 9/2011 | Huang et al. .................. 257/72 |
| 2012/0164817 | A1 | 6/2012 | Shichi et al. |
| 2012/0295375 | A1 | 11/2012 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2010-109345 A | 5/2010 |
| JP | 2011-211208 A | 10/2011 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

(56) References Cited

OTHER PUBLICATIONS

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5Δ) Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

(56) References Cited

OTHER PUBLICATIONS

Kimizuka, N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White TANDEM OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electro-optic device, a semiconductor circuit, and electronic equipment are all semiconductor devices.

2. Description of the Related Art

Transistors in which an active layer is formed using a semiconductor thin film which is formed over a substrate having an insulating surface are widely used in electronic devices such as integrated circuits (ICs) and image display devices (display devices). A silicon-based semiconductor material is widely known as a material for a semiconductor thin film applicable to a transistor. As another material, an oxide semiconductor has been attracting attention.

For example, a transistor whose active layer includes an amorphous oxide including indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

It is clear that higher performance (e.g., higher operation speed, lower power consumption, and the like) of semiconductor devices such as integrated circuits (ICs) and image display devices (display devices) is needed in the future. In addition, it is important to manufacture a semiconductor device through a manufacturing process as simple as possible in order to reduce time and cost for a manufacture of the semiconductor device.

To achieve high performance of a semiconductor device, high operation speed, low power consumption, high integration, and the like of a transistor included in the semiconductor device are needed, and in order to achieve them, it is necessary to miniaturize the transistor. Further, for high operation speed of a semiconductor device, resistance between a source electrode and a drain electrode needs to be reduced. Moreover, for low power consumption of a semiconductor device, a leakage current generated in the semiconductor device needs to be reduced.

Further, how efficiently capacitors provided in various portions in a semiconductor device are formed influences time and cost for a manufacture of the semiconductor device. Moreover, it can influence the degree of integration and the like of the semiconductor device.

In view of the above problems, an object of an embodiment of the present invention is to provide a semiconductor device having high electric characteristics and in which a capacitor is efficiently formed even if the semiconductor device has a miniaturized structure.

In a top-gate (also referred to as staggered) transistor, a source electrode and a drain electrode has a two-layer structure (in this specification, the lower electrode film is referred to as a first electrode film and the upper electrode film is referred to as a second electrode film). Then, a capacitor is formed using the first electrode film, a gate insulating film, and a gate electrode of the transistor. Accordingly, the transistor and the capacitor can be formed through the same process; therefore, the capacitor can be efficiently formed.

Further, the second electrode film is connected onto the oxide semiconductor film between the first electrode film and a channel formation region of the transistor (that is, over the oxide semiconductor film which overlaps with neither the first electrode film nor the gate electrode). Accordingly, resistance between a source electrode and a drain electrode of the transistor can be reduced; therefore, electric characteristics of the semiconductor device can be improved.

Note that the semiconductor device has a layered structure (also referred to as a stacked structure) of an element formation layer including a transistor using a silicon-based semiconductor material and an element formation layer including a transistor using an oxide semiconductor material. By using the above structure for the transistor using an oxide semiconductor material, since the transistor using an oxide semiconductor material has extremely small off-state current (in this specification, off-state current refers to current flowing between a source and a drain of the transistor when the transistor is off), power consumption of the semiconductor device can be reduced in addition to the above-described effects.

That is, one embodiment of the present invention is a semiconductor device including a first element formation layer including a transistor and a capacitor. The transistor includes an oxide semiconductor film provided over an insulating surface and including a first region functioning as a channel formation region and second regions sandwiching the first region in the channel length direction, a gate insulating film provided over the oxide semiconductor film, a gate electrode overlapping with the first region with the gate insulating film provided therebetween, a second insulating film covering at least a side surface of the gate electrode, a first electrode film covering an end portion of the oxide semiconductor film and electrically connected to the second regions, and a second electrode film electrically connected to the first electrode film and the second regions. The capacitor includes a lower electrode film, an inter-electrode insulating film over the lower electrode film, and an upper electrode film over the inter-electrode insulating film. The first electrode film and the lower electrode film have the same composition, the gate insulating film and the inter-electrode insulating film have the same composition, and the gate electrode and the upper electrode film have the same composition.

The above structure of the semiconductor device enables the transistor and the capacitor to be formed through the same process; therefore, the capacitor can be efficiently formed. Further, the second electrode film is connected onto the oxide semiconductor film between the first electrode film and the channel formation region of the transistor. Accordingly, resistance between the source electrode and the drain electrode can be reduced; therefore, electric characteristics of the semiconductor device can be improved.

Note that in the above-described structure of the semiconductor device, it is preferable that a second element formation layer including a transistor formed using silicon, germanium, or a compound semiconductor material for its active layer be provided under the first element formation layer, and the transistor included in the second element formation layer be electrically connected at least to the transistor or the capacitor included in the first element formation layer. The transistor of the first element formation layer using an oxide semiconductor material for its active layer (including the channel formation region) enables holding of charge for a long time, and the transistor of the second element formation layer using silicon, germanium, or a compound semiconductor material for its active layer can operate at high speed easily; thus, the semiconductor device has high performance with low power consumption.

Further, in the above-described structure of the semiconductor device, the active layer of the transistor included in the second element formation layer can be formed using a film obtained by separation of part of a single crystal semiconductor substrate or a compound semiconductor substrate, whereby the thickness of the transistor can be thin. Accordingly, the transistor can be made a partial depleted or fully depleted transistor; accordingly, the semiconductor device with high speed operation and low power consumption can be achieved.

Further, in the above-described structure of the semiconductor device, the second element formation layer can be positioned over a flexible substrate and the first element formation layer can be positioned over the second element formation layer, whereby the semiconductor device can have added values such that the semiconductor device can be mounted even on a curved surface or an uneven surface, the device is less likely to be damaged even when dropped, or the device is light in weight.

Further, one embodiment of the present invention is a method for manufacturing a semiconductor device including a first element formation layer including a transistor and a capacitor, including the following steps for forming the first element formation layer including the transistor and the capacitor: forming of forming an oxide semiconductor film over an insulating surface, which includes a first region functioning as a channel formation region and second regions sandwiching the first region in the channel length direction, forming a first electrode film covering an end portion of the oxide semiconductor film and electrically connected to the second regions and an upper electrode film of the capacitor through the same step, forming a gate insulating film over the oxide semiconductor film and an inter-electrode insulating film of the capacitor through the same step, forming a gate electrode provided over the first oxide semiconductor film with the gate insulating film provided therebetween and an upper electrode film of the capacitor through the same step, forming a second insulating film covering at least a side surface of the gate electrode, forming a second electrode film electrically connected to the first electrode film and the second region.

By manufacturing the semiconductor device by the above method, the transistor and the capacitor can be formed through the same process; therefore, the capacitor can be efficiently formed. Further, since the second electrode film is connected onto the oxide semiconductor film between the first electrode film and the channel formation region of the transistor. Resistance between the source electrode and the drain electrode of the transistor can be reduced; accordingly, electric characteristics of the semiconductor device can be improved.

Note that in the above-described method for manufacturing the semiconductor device, a second element formation layer including a transistor formed using silicon, germanium, or a compound semiconductor material for its active layer is formed, the first element formation layer is formed over the second element formation layer, and the transistor included in the second element formation layer is electrically connected at least to the transistor or the capacitor included in the first element formation layer, whereby the semiconductor device with higher speed operation and low power consumption can be achieved.

Further, in the above-described method for manufacturing the semiconductor device, the active layer of the transistor included in the second element formation layer can be formed using a film obtained by separation of part of a single crystal semiconductor substrate or a compound semiconductor substrate, whereby the thickness of the transistor can be thin. Accordingly, the transistor can be made a partial depleted or fully depleted transistor; accordingly, the semiconductor device with high speed operation and low power consumption can be achieved.

Note that the first element formation layer and the second element formation layer over the first element formation layer can be formed over a flexible substrate, whereby the semiconductor device can have added values such that the semiconductor device can be mounted even on a curved surface or an uneven surface, the device is less likely to be damaged even when dropped, or the device is light in weight.

A source electrode and a drain electrode of a transistor has a two-layer structure, and a capacitor is formed using a first electrode film, a gate insulating film, and a gate electrode of the transistor. Accordingly, the transistor and the capacitor can be formed through the same process; therefore, the capacitor can be efficiently formed.

Further, a second electrode film is connected onto an oxide semiconductor film between the first electrode film and a channel formation region of the transistor. Accordingly, resistance between the source electrode and the drain electrode can be reduced; therefore, electric characteristics of the semiconductor device can be improved.

DETAILED DESCRIPTION OF THE INVENTION

Figure 1A:
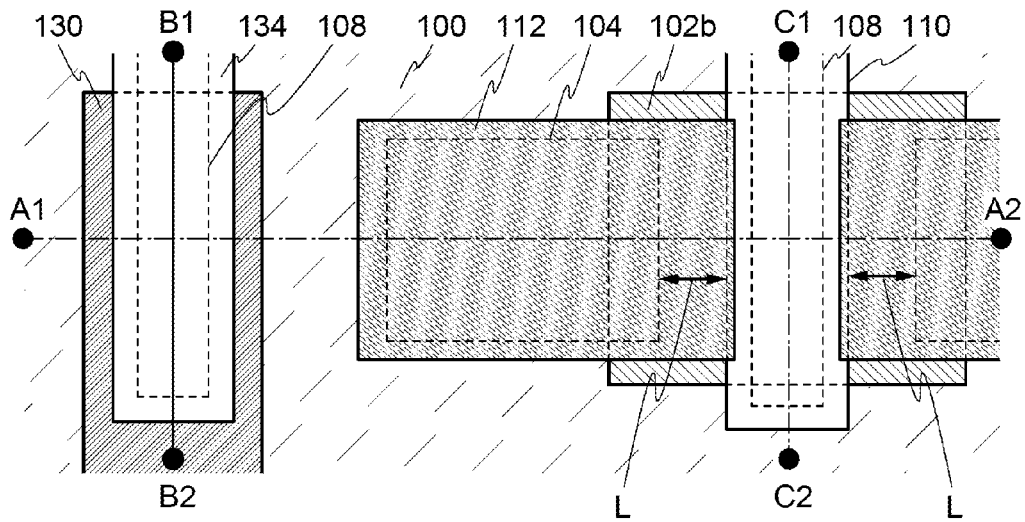
FIGS. 1A to 1D illustrate a structure of a semiconductor device described in Embodiment 1.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that in the following embodiments, the same portions or portions having similar functions are denoted by the same reference numerals in different drawings, and explanation thereof will not be repeated.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

In this specification and the like, the term such as "over" or "under" does not necessarily mean that a component is placed "directly on" or "directly underneath" another component. For example, the expression "B over A" can mean the case where another component is provided between A and B.

Further, in this specification and the like, the expression a "pair of B sandwiching A" does not necessarily mean B is in direct contact with A. For example, the expression may mean a "pair of B sandwiching A with C provided therebetween" (e.g., B\C\A\C\B).

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are an electrode and a wiring.

Embodiment 1

In this embodiment, an example of a structure of a semiconductor device and a method for manufacturing the semiconductor device will be described with reference to FIGS. 1A to 1D, FIGS. 2A to 2C-2, FIGS. 3A to 3D, FIGS. 4A to 4D, FIG. 5, FIGS. 6A to 6C, and FIG. 7.

<Example of Structure of Semiconductor Device>

Figure 1B:
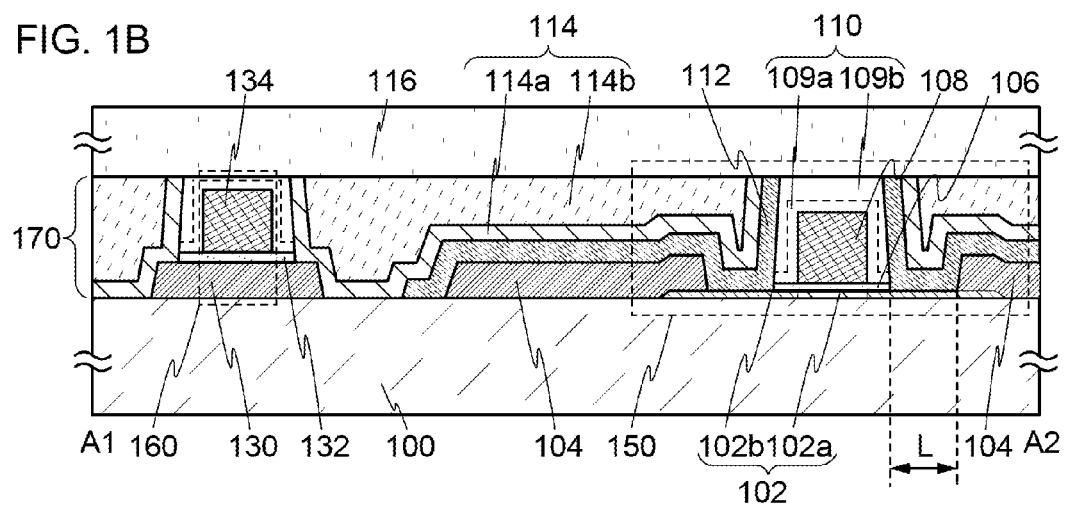
Figure 1C:
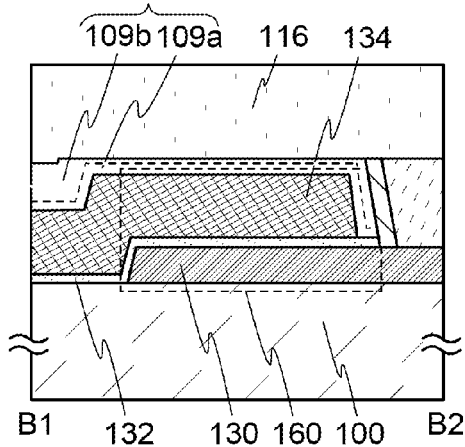
Figure 1D:
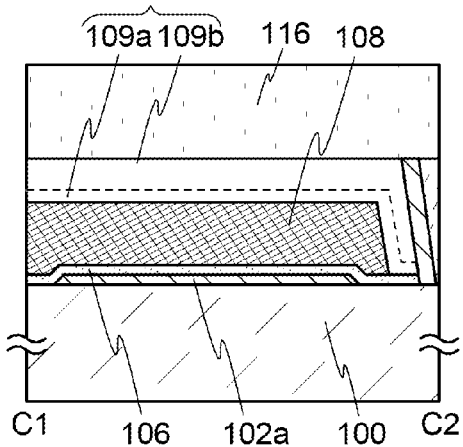

FIGS. 1A to 1D show an example of a plan view and cross-sectional views of a semiconductor device including an element formation layer 170 including a top-gate transistor 150 and a capacitor 160. FIG. 1A is a plan view, FIG. 1B is a cross-sectional view taken along a dashed-dotted line A1-A2 in FIG. 1A, FIG. 1C is a cross-sectional view taken along a dashed-dotted line B1-B2 in FIG. 1A, and FIG. 1D is a cross-sectional view taken along a dashed-dotted line C1-C2 in FIG. 1A.

The element formation layer 170 in FIGS. 1A to 1D includes the transistor 150 and the capacitor 160. The transistor 150 has a structure which includes: an oxide semiconductor film 102 provided over a substrate 100 having an insulating surface and including a first region 102a which functions as a channel formation region and second regions 102b sandwiching the first region 102a in the channel length direction; a pair of first electrode films 104 covering an end portion of the oxide semiconductor film 102 and electrically connected to the second regions 102b; a gate insulating film 106 provided over at least the first region 102a; a gate electrode 108 provided over the first region 102a with the gate insulating film 106 provided therebetween; a second insulating film 110 provided on at least a side surface of the gate electrode 108; and a pair of second electrode films 112 sandwiching the gate electrode 108, which is electrically connected to the first electrode film 104 and the second regions 102b. In this specification, an element formation layer including a transistor in which an oxide semiconductor film is used as its active layer is also referred to as a first element formation layer in some cases. Further, the capacitor 160 includes a lower electrode film 130, an upper electrode film 134, and an inter-electrode insulating film 132 which is sandwiched between the lower electrode film 130 and the upper electrode film 134.

The first electrode film 104 and the lower electrode film 130 have the same composition, the gate insulating film 106 and the inter-electrode insulating film 132 have the same composition, and the gate electrode 108 and the upper electrode film 134 have the same composition. That is, the first electrode film 104 and the lower electrode film 130 are formed through the same step, the gate insulating film 106 and the inter-electrode insulating film 132 are formed through the same step, and the gate electrode 108 and the upper electrode film 134 are formed through the same step. Accordingly, when the transistor 150 is formed, the capacitor 160 is also formed at the same time; thus, the capacitor can be formed efficiently.

Further, a third insulating film 114 is provided over the transistor 150 and the capacitor 160, so that the element formation layer 170 is formed. As illustrated in FIG. 1B, by providing a fourth insulating film 116 having high surface planarity over the element formation layer 170, it becomes easy to form a wiring (for example, formation of a leading wiring or the like electrically connected to the transistor 150 or the capacitor 160) over the element formation layer 170. In the plan view illustrated in FIG. 1A, the third insulating film 114, the fourth insulating film 116, and the like are omitted to avoid complexity.

Note that in this embodiment, the components of the transistor 150 and the capacitor 160, and the third insulating film 114 are collectively referred to as the element formation layer 170, because the third insulating film 114 is formed at the same level (in the same layer) as the transistor 150 and the capacitor 160. However, it is not necessary to include the third insulating film 114 in the element formation layer 170; a structure consisting of the components of the transistor 150 and the capacitor 160 can be referred to as the element formation layer 170.

For a transistor in which a semiconductor thin film is used as an active layer, in order to miniaturize the transistor, a top-gate structure (also referred to as a staggered structure, a forward staggered structure, or the like) in which a gate electrode is used as a mask to form a channel formation region in a self-aligned manner is used.

In a top-gate transistor, in order to form a capacitor through the same manufacturing process as the transistor, an electrode (which corresponds to the first electrode film 104 in this embodiment and also referred to as a source electrode or a drain electrode) connected to a semiconductor film functioning as an active layer of the transistor is used as the lower electrode film of the capacitor and a gate electrode of the transistor (which corresponds to the gate electrode 108 in this embodiment) is used as the upper electrode film of the capacitor in some cases. In the above structure, it is necessary to form a gap between the gate electrode and the electrode connected to the semiconductor film functioning as an active layer so as not to be electrically connected to each other. For example, in FIG. 1B, a portion between the first electrode film 104 and the first region 102a corresponds to the gap.

However, when the gap is formed, that portion becomes a resistance component between the source electrode and the drain electrode of the transistor 150, which causes a decrease in the on-state current (a current flowing between the source and the drain when the transistor is on) or an increase in variations in the electric characteristics (e.g., variations in threshold voltage) of the transistor 150; thus, electric characteristics of the semiconductor device are adversely affected.

Thus, as illustrated in FIGS. 1A to 1D, the electrode functioning as the source electrode or the drain electrode has at least two-layer structure (the first electrode film 104 and the second electrode film 112) and the second electrode film 112 is electrically connected to at least part of the portion between the first electrode film 104 and the first region 102a (that is, a portion over the second region 102b in a range indicated by an arrow L) and over the first electrode film 104, whereby the resistance component between the source electrode and the drain electrode of the transistor 150 can be reduced; therefore, the semiconductor device can have favorable electric characteristics even if each semiconductor element (specifically a transistor) included in the semiconductor device has a miniaturized structure.

Further, the first electrode film 104, the gate insulating film 106, and the gate electrode 108 which are components of the transistor 150 are the same films as the lower electrode film 130, the inter-electrode insulating film 132, and the upper electrode film 134 of the capacitor 160, respectively; therefore, the transistor 150 and the capacitor 160 can be efficiently formed through the same process.

Note that in the semiconductor device of this embodiment, the element formation layer 170 is provided over the substrate 100 having an insulating surface. As the substrate 100 having an insulating surface, for example, a substrate provided with an insulating film on its surface may be used, or a substrate having an element formation layer consisting of a single layer or a plurality of layers including a transistor which has a different structure from the element formation layer 170 (e.g., in which the active layer is different from the active layer of the transistor of the element formation layer 170 (that is, a transistor in which a semiconductor other than an oxide semiconductor is used for its active layer)) over the substrate and provided with an insulating film in the top layer of the element formation layer may be used. A semiconductor device in which an element formation layer having a different structure from the element formation layer 170 is provided under the element formation layer 170 is described in detail in Embodiments 5 and 6.

<Method for Manufacturing Semiconductor Device>

An example of a manufacturing process of the semiconductor device illustrated in FIGS. 1A to 1D is described with reference to FIGS. 2A to 2C-2, FIGS. 3A to 3D, FIGS. 4A to 4D, FIG. 5, FIGS. 6A to 6D, and FIG. 7.

Figure 2A:
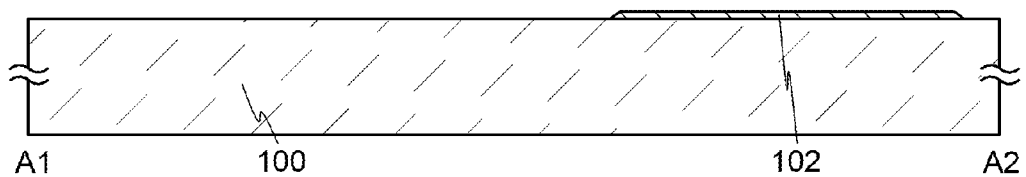
FIGS. 2A to 2C-2 illustrate a method for manufacturing the semiconductor device described in Embodiment 1.

First, an oxide semiconductor film is formed over the substrate 100 having an insulating surface, a mask is formed over the oxide semiconductor film by a photolithography method, a printing method, an inkjet method, or the like, and part of the oxide semiconductor film is selectively removed with the mask to form the oxide semiconductor film 102 (see FIG. 2A). Note that before the formation of the oxide semiconductor film 102, treatment (also referred to as reverse sputtering treatment) in which an argon gas is introduced and plasma is generated to remove powdery substances (also referred to as particles or dust) or an organic substance attached on the surface of the substrate 100 having an insulating surface is preferably performed. Note that instead of argon, a gas of nitrogen, helium, oxygen or the like may be used.

As described above, as the substrate 100 having an insulating surface, for example, a substrate provided with an insulating film on its surface may be used, or a substrate over which an element formation layer consisting of a single layer or a plurality of layers, which has a structure different from the element formation layer 170 and which includes an insulating film in the top layer of the element formation layer may be used.

Although there is no particular limitation on the above-described substrate, it is necessary that the substrate have heat resistance to withstand at least a heat treatment performed later. For example, a glass substrate of barium borosilicate glass, aluminoborosilicate glass, or the like, a ceramic substrate, a quartz substrate, or a sapphire substrate can be used. As long as the substrate 100 has an insulating surface, a single crystal semiconductor substrate or a polycrystalline semiconductor substrate of silicon, silicon carbide, or the like; a compound semiconductor substrate of silicon germanium or the like; an SOI substrate; or the like can be used.

The described-above term "SOI substrate" means a structure (silicon on insulator) in which a silicon thin film is provided on a surface of the insulating film; however, here, the "SOI substrate" is not limited to the above meaning and means a structure (semiconductor on insulator) in which a semiconductor film is provided on the insulating surface (or an insulating substrate). The "SOI substrate" in this specification encompasses a structure in which a silicon thin film is provided over a quartz substrate (silicon on quartz, also abbreviated to SOQ in some cases), a structure in which a gallium nitride (GaN) thin film or a silicon carbide (SiC) thin film is provided instead of the silicon thin film, or the like.

Note that a film from which oxygen is released by heat treatment (hereinafter, referred to as an oxygen supply film, and a description of the following oxygen supply film can be referred to for an oxygen supply film 105a described below) is preferably formed in the top layer (that is, a layer in contact with the oxide semiconductor film 102) of the substrate 100 having an insulating surface. The reason is described below.

When oxygen vacancy exists in the first region 102a which functions as a channel formation region of the transistor 150, electric charge is generated due to oxygen vacancy in some cases. In general, part of oxygen vacancy in the oxide semiconductor film serves as a donor and causes release of an electron which is a carrier. As a result, the threshold voltage of a transistor shifts in the negative direction. Accordingly, an oxygen supply film is preferably formed in a top layer of the substrate 100 having an insulating surface.

When an oxygen supply film exists in the top layer of the substrate 100 having an insulating surface, after the oxide semiconductor film to be described later is formed, part of oxygen in the oxygen supply film is released by heat treatment; therefore, the oxygen can be supplied to the oxide semiconductor film and oxygen vacancy in the oxide semiconductor film can be filled, which can suppress the shift of the threshold voltage of the transistor in the negative direction. In particular, the oxygen supply film preferably contains oxygen which exceeds at least the stoichiometric composition. For example, in the case where silicon oxide is used for the oxygen supply film, a film of silicon oxide represented by $SiO_{2+\alpha}$ ($\alpha>0$) is preferably used. Note that a region containing a larger amount of oxygen than the stoichiometric composition (hereinafter referred to as "an oxygen-excessive region" in some cases) may exist in at least part of the oxygen supply film.

Note that "a film from which oxygen is released by heat treatment" described above refers to a film whose amount of released oxygen when converted into oxygen atoms in thermal desorption spectroscopy (TDS) is greater than or equal to $1.0\times10^{19}$ atoms/cm$^3$, preferably greater than or equal to $3.0\times10^{19}$ atoms/cm$^3$, further preferably greater than or equal to $1.0\times10^{20}$ atoms/cm$^3$, still further preferably greater than or equal to $3.0\times10^{20}$ atoms/cm$^3$.

Here, a method in which the amount of released oxygen is measured by being converted into oxygen atoms using TDS analysis will now be described.

The amount of released gas in TDS analysis is proportional to an integral value of a spectrum. Therefore, the amount of released gas can be calculated from the ratio between the integral value of the measured spectrum and the reference value of a standard sample. The reference value of a standard sample refers to the ratio of the density of a predetermined atom contained in a sample to the integral value of the spectrum.

For example, the number of released oxygen molecules ($N_{O2}$) from an insulating film can be found according to Formula 1 with the TDS analysis results of a silicon wafer containing hydrogen at a predetermined density which is the standard sample and the TDS analysis results of the insulating film. Here, all spectra having a mass-to-charge ratio (M/z) of 32 which are obtained by the TDS analysis are assumed to originate from an oxygen molecule. $CH_3OH$, which is given as a gas where M/z=32, is not taken into consideration on the assumption that it is unlikely to be present. Further, an oxygen molecule including an oxygen atom where M/z=17 or 18 which is an isotope of an oxygen atom is not taken into consideration either because the proportion of such a molecule in the natural world is minimal.

[FORMULA 1]

$$N_{O2} = \frac{N_{H2}}{S_{H2}} \times S_{O2} \times a \quad (1)$$

$N_{H2}$ is the value obtained by conversion of the number of hydrogen molecules desorbed from the standard sample into densities. $S_{H2}$ is the integral value of the spectrum when the standard sample is subjected to the TDS analysis. Here, the reference value of the standard sample is set to $N_{H2}/S_{H2}$. $S_{O2}$ is the integral value of the spectrum when the insulating film is subjected to TDS analysis. $\alpha$ is a coefficient which influences spectrum intensity in TDS analysis. Refer to Japanese Published Patent Application No. H6-275697 for details of Formula 1. Note that the amount of released oxygen from the above insulating film is measured with a thermal desorption spectroscopy apparatus produced by ESCO Ltd., EMD-WA1000S/W using a silicon wafer containing hydrogen atoms at $1\times10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

For the introduction of oxygen into the oxide semiconductor layer, heat treatment performed under an oxygen atmosphere, an ion implantation method, an ion doping method, a plasma immersion ion implantation method, plasma treatment performed under an atmosphere containing oxygen, or the like can be employed.

Further, in the case where the hydrogen concentration in an insulating film containing excess oxygen is greater than or equal to $7.2\times10^{20}$ atoms/cm$^3$, variation in initial characteristics of the transistor is increased, L length dependence of electric characteristics of the transistor is increased, and the transistor is significantly deteriorated in the BT stress test; therefore, the hydrogen concentration in the insulating film containing excess oxygen is preferably less than $7.2\times10^{20}$ atoms/cm$^3$. In other words, the hydrogen concentration in the oxide semiconductor film is preferably less than or equal to $5\times10^{19}$ atoms/cm$^3$, and the hydrogen concentration in the insulating film containing excess oxygen is preferably less than $7.2\times10^{20}$ atoms/cm$^3$. A method for forming a film having a low hydrogen concentration is described in detail later.

Note that in the case where oxygen is supplied from the oxygen supply film to the oxide semiconductor film by heat treatment, it is preferable that a film having a low oxygen or water vapor permeability (also referred to as a low moisture permeability) be formed under the oxygen supply film (that is, to a surface of the oxygen supply film opposite to the surface in contact with the oxide semiconductor film) so that oxygen released from the oxygen supply film can be supplied to the oxide semiconductor film efficiently. For example, under the oxygen supply film, an aluminum oxide film, an aluminum oxynitride film, an aluminum nitride oxide film, or the like may be formed as a barrier film. In the case of using an aluminum oxide film, the aluminum oxide film preferably has a high density (film density of higher than or equal to 3.2 g/cm$^3$, preferably higher than or equal to 3.6 g/cm$^3$).

The oxide semiconductor film may be formed by a sputtering method, a molecular beam epitaxy (MBE) method, a CVD method, a pulse laser deposition method, an atomic layer deposition (ALD) method, or the like. Further, the oxide semiconductor film 102 may be formed using a sputtering apparatus which performs deposition with surfaces of a plurality of substrates set substantially perpendicular to a surface of a sputtering target, which is a so-called columnar plasma (CP) sputtering system. Note that the thickness of the oxide semiconductor film is greater than 5 nm and less than or equal to 200 nm, preferably greater than or equal to 10 nm and less than or equal to 30 nm.

To reduce oxygen vacancy in the oxide semiconductor film 102 as much as possible, it is preferable that the oxide semiconductor film 102 be deposited with a deposition atmosphere in which an oxygen gas accounts for a large proportion; therefore, it can be said that it is preferable to use a sputtering apparatus into which oxygen can be introduced and in which the gas flow rate can be adjusted. Further, 90% or more of the gas introduced into a deposition chamber of the sputtering apparatus is an oxygen gas, and in the case where another gas is used in addition to the oxygen gas, a rare gas is preferably used. Further, it is more preferable that the gas introduced into the deposition chamber be only an oxygen gas and the percentage of an oxygen gas in the deposition atmosphere be as closer to 100% as possible.

Further, when the oxide semiconductor film 102 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the oxide semiconductor film 102 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. Note that the above hydrogen concentration in the oxide semiconductor film is measured by secondary ion mass spectrometry (SIMS).

For the above-described reason, it is preferable that the gas used for deposition of the oxide semiconductor film 102 does not contain an impurity such as water, hydrogen, a hydroxyl group, or hydride. Further, it is preferable to use a gas having a purity greater than or equal to 6N, preferably greater than or equal to 7N (i.e., the impurity concentration in the gas is less than or equal to 1 ppm, preferably less than or equal to 0.1 ppm).

Further, in deposition of the oxide semiconductor film 102, in order to remove moisture (including water, water vapor, hydrogen, a hydroxyl group, or hydroxide) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water (H$_2$O) (more preferably, also a compound containing a carbon atom), and the like are removed, whereby the concentration of an impurity such as hydrogen or moisture in the oxide semiconductor film 102 formed in the deposition chamber can be reduced.

On the other hand, when the oxide semiconductor film 102 contains an alkali metal or an alkaline earth metal, the alkali metal or the alkaline earth metal and an oxide semiconductor are bonded to each other, so that carriers are generated in some cases, which causes an increase in the off-state current of a transistor. Accordingly, the concentration of an alkali metal or an alkaline earth metal in the oxide semiconductor film 102 is lower than or equal to $1\times10^{18}$ atoms/cm$^3$, preferably lower than or equal to $2\times10^{16}$ atoms/cm$^3$.

Note that a target used in the sputtering apparatus preferably has a relative density greater than or equal to 90% and less than or equal to 100%, preferably greater than or equal to 95% and less than or equal to 99.9%. With the use of a target having a high relative density, the deposited oxide semiconductor film 102 is made dense.

An oxide semiconductor material used for the oxide semiconductor film 102 contains at least indium (In). In particular, In and zinc (Zn) are preferably contained. In addition, as a stabilizer for reducing the variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; an oxide containing two kinds of metals such as an In—Zn-based oxide, an In—Mg-based oxide, or an In—Ga-based oxide; an oxide containing three kinds of metals such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; an oxide containing four kinds of metals such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by InMO$_3$(ZnO)$_m$ (m>0) may be used as an oxide semiconductor. Note that M represents one or more metal elements selected from Ga, Fe, Mn, and Co. Alternatively, as the oxide semiconductor, a material represented by In$_2$SnO$_5$(ZnO)$_n$ (n>0) may be used.

The deposited oxide semiconductor film 102 is in a single crystal state, a polycrystalline (also referred to as polycrystal) state, an amorphous state, or the like.

The oxide semiconductor film 102 may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, the oxide semiconductor film 102 may include a CAAC-OS. In the CAAC-OS, for example, c-axes are aligned, and a-axes and/or b-axes are not macroscopically aligned.

For example, the oxide semiconductor film 102 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, the oxide semiconductor film 102 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the oxide semiconductor film 102 may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that the oxide semiconductor film 102 may be in a single-crystal state, for example.

The oxide semiconductor film 102 preferably includes a plurality of crystal parts. In each of the crystal parts, a c-axis is preferably aligned in a direction parallel to a normal vector of a surface where the oxide semiconductor film 102 is formed or a normal vector of a surface of the oxide semiconductor film 102. Note that, among crystal parts, the directions of the a-axis and the b-axis of one crystal part may be different from those of another crystal part. An example of such an oxide semiconductor film is a CAAC-OS film.

The oxide semiconductor film 102 is preferably a CAAC-OS (c-axis aligned crystalline oxide semiconductor) film.

The CAAC-OS film is not absolutely single crystal. The CAAC-OS film, for example, includes an oxide semiconductor film with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

With the use of the CAAC-OS film in a transistor, change in electric characteristics of the transistor due to irradiation with visible light or ultraviolet light is small. Thus, the transistor has high reliability.

In order to form the CAAC-OS film as the oxide semiconductor film 102, the surface where the oxide semiconductor film 102 is formed is preferably amorphous. When the surface where the oxide semiconductor film 102 is formed is crystalline, crystallinity of the oxide semiconductor film 102 is easily disordered and the CAAC-OS film is not easily formed.

Further, the surface where the oxide semiconductor film 102 is formed may have a CAAC structure. In the case where the surface where the oxide semiconductor film 102 is formed has the CAAC structure, the oxide semiconductor film 102 easily becomes the CAAC-OS film.

Note that nitrogen may be substituted for part of oxygen included in the oxide semiconductor film.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm. Therefore, planarization treatment is preferably performed on a surface over which the oxide semiconductor is to be formed. As the planarization treatment, chemical mechanical polishing (CMP) treatment, a dry etching method, or the like may be used. Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface over which the oxide semiconductor is to be formed can be further improved.

Note that, $R_a$ is obtained by three-dimension expansion of arithmetic mean deviation so as to be able to apply it to a plane. The $R_a$ can be expressed as an "average value of the absolute values of deviations from a reference surface to a specific surface" and is defined by the formula 2 below.

$$R_a = \frac{1}{S_0} \int_{y1}^{y2} \int_{x1}^{x2} |f(x, y) - Z_0| dx dy \qquad \text{[FORMULA 2]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the xy plane, and $Z_0$ represents the height of the reference surface (the average height of the specific surface). Ra can be measured using an atomic force microscope (AFM).

In the case where the CAAC-OS film is deposited as the oxide semiconductor film 102, any of the following three methods may be employed. The first method is the one in which the oxide semiconductor film 102 is deposited at a temperature higher than or equal to 200° C. and lower than or equal to 450° C., so that the oxide semiconductor film 102 serves as the CAAC-OS film. The second method is the one in which the oxide semiconductor film 102 is deposited and then subjected to heat treatment at a temperature higher than or equal to 200° C. and lower than or equal to 700° C., so that the oxide semiconductor film 102 serves as the CAAC-OS film. The third is a method in which two layers are deposited for formation of an oxide semiconductor film. After a first oxide semiconductor film with a small thickness is deposited, heat treatment is performed on the oxide semiconductor film at a temperature higher than or equal to 200° C. and lower than or equal to 700° C., so that the first oxide semiconductor film serves as a CAAC-OS film. Then, a second oxide semiconductor film is deposited over the first oxide semiconductor film using a crystal in the first oxide semiconductor film as a seed crystal, whereby a CAAC-OS film is obtained.

Note that the oxide semiconductor film 102 may have a structure in which a plurality of oxide semiconductor films is stacked. For example, the oxide semiconductor film 102 may have a layered structure of a first oxide semiconductor film and a second oxide semiconductor film which are formed using metal oxides with different compositions. For example, the first oxide semiconductor film may be formed using an oxide containing three kinds of metals, and the second oxide semiconductor film may be formed using an oxide containing two kinds of metals. Alternatively, for example, both the first oxide semiconductor film and the second oxide semiconductor film may be formed using oxide containing three kinds of metals.

Further, the constituent elements of the first oxide semiconductor film and the second oxide semiconductor film may be the same as each other but the composition of the constituent elements of the first oxide semiconductor film and the second oxide semiconductor film may be different from each other. For example, the ratio of the number of atoms in the first oxide semiconductor film may be In:Ga:Zn=1:1:1, and the ratio of the number of atoms in the second oxide semiconductor film may be In:Ga:Zn=3:1:2. Alternatively, the ratio of the number of atoms in the first oxide semiconductor film, may be In:Ga:Zn=1:3:2, and the ratio of the number of atoms in the second oxide semiconductor film may be In:Ga:Zn=2:1:3.

At this time, one of the first oxide semiconductor layer and the second oxide semiconductor layer, which is closer to the gate electrode 108 (on a channel side) preferably contains In and Ga at a proportion of In>Ga. The other which is farther from the gate electrode (on a back channel side) preferably contains In and Ga at a proportion of In≤Ga.

In an oxide semiconductor, the s orbital of heavy metal mainly contributes to carrier transfer, and as the In content in the oxide semiconductor is increased, overlap of the s orbital tends to increase. Therefore, an oxide having a composition of In>Ga has higher mobility than an oxide having a composition of In≤Ga. Further, in Ga, the formation energy of an oxygen vacancy is larger and thus an oxygen vacancy is less likely to occur than in In; therefore, the oxide having a composition of In≤Ga has more stable characteristics than the oxide having a composition of In>Ga.

Application of an oxide semiconductor containing In and Ga at a proportion of In>Ga on a channel side, and an oxide semiconductor containing In and Ga at a proportion of In≤Ga on a back channel side allows the mobility and reliability of the transistor to be further improved.

Further, the first oxide semiconductor film and the second oxide semiconductor film may be formed using oxide semiconductors having different crystallinity. That is, the oxide semiconductor film 102 may be formed by combining a single crystal oxide semiconductor, a polycrystalline oxide semiconductor, an amorphous oxide semiconductor, and a CAAC-OS as appropriate. Note that by applying an amorphous oxide semiconductor to at least one of the first oxide semiconductor film and the second oxide semiconductor film, internal stress or external stress of the oxide semiconductor film 102 can be relieved, variation in characteristics of the transistor is reduced, and reliability of the transistor can be further improved.

On the other hand, the amorphous oxide semiconductor easily absorbs an impurity such as hydrogen which serves as a donor, and in which oxygen vacancies easily occurs, so that the amorphous oxide semiconductor is likely to be made n-type. Therefore, as the oxide semiconductor film on the channel side, an oxide semiconductor having crystallinity, such as a CAAC-OS, is preferably used.

Further, the oxide semiconductor film 102 may have a stacked-layer structure including three or more layers in which an amorphous oxide semiconductor film is interposed between a plurality of oxide semiconductor films having crystallinity. Furthermore, a structure in which an oxide semiconductor film having crystallinity and an amorphous oxide semiconductor film are alternately stacked may be employed. These two structures used so that the oxide semiconductor film 102 has a stacked-layer structure including a plurality of layers can be combined as appropriate.

Note that in the case where the oxide semiconductor film 102 has a stacked-layer structure including a plurality of layers, oxygen may be introduced each time the oxide semiconductor film is formed. Oxygen can be introduced by the substrate 100 having an insulating surface. Note that in plasma treatment under an atmosphere containing oxygen, the plasma treatment is performed in a state where a DC bias is applied to the substrate side (a bias application apparatus provided on the substrate side or the substrate itself), whereby oxygen plasma is likely to enter the oxide semiconductor film 102, which is preferable. The applied bias power may be adjusted as appropriate in consideration of the thickness of the oxide semiconductor film 102 or damage to the oxide semiconductor film 102 by practitioners.

Oxygen is introduced each time the oxide semiconductor film is formed, whereby the effect of reducing oxygen vacancy in the oxide semiconductor can be improved.

Figure 2B:
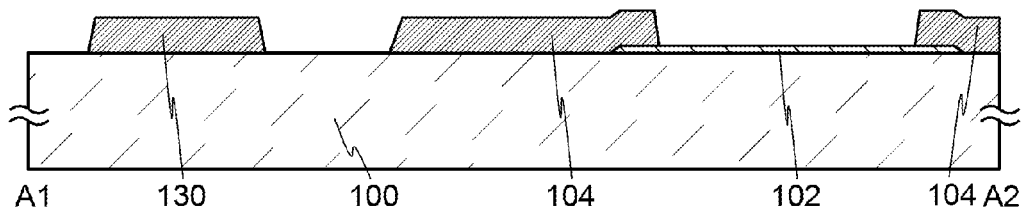

Next, a conductive film is formed over the substrate 100 having an insulating surface and the oxide semiconductor film 102, a mask is formed over the conductive film by a photolithography method, a printing method, an inkjet method, or the like, and part of the conductive film is selectively removed with the mask to be patterned (see FIG. 2B).

In the transistor 150, the patterned conductive film covers an end portion of the oxide semiconductor film 102 and functions as the first electrode film 104 electrically connected to the second region 102b which is formed in the oxide semiconductor film 102 in a later step. Further, in the capacitor 160, the patterned conductive film functions as the lower electrode film 130.

The conductive film for forming the first electrode film 104 and the lower electrode film 130 may be formed by a physical vapor deposition (PVD) method such as a vacuum evaporation method or a sputtering method or a chemical vapor deposition (CVD) method such as a plasma CVD method. The thickness of the conductive film is greater than or equal to 50 nm and less than or equal to 1000 nm, and is preferably greater than or equal to 100 nm and less than or equal to 700 nm.

As a material of the conductive film, a material which is capable of withstanding heat treatment performed in the manufacturing process of the transistor 150 and the capacitor 160 is used. For example, a metal film containing an element selected from aluminum, chromium, copper, tantalum, titanium, molybdenum, and tungsten, or a metal nitride film containing any of the above elements as its component (e.g., a titanium nitride film, a molybdenum nitride film, or a tungsten nitride film) can be used. Alternatively, a film of a high-melting-point metal such as titanium, molybdenum, or tungsten or a metal nitride film thereof (e.g., a titanium nitride film, a molybdenum nitride film, or a tungsten nitride film) may be formed over or/and under a metal film of aluminum, copper, or the like. Alternatively, the conductive film may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials to which silicon oxide is added can be used.

Note that when the first electrode film 104 and the lower electrode film 130 are formed, the oxide semiconductor film 102 is variously damaged (for example, when the conductive film is formed by a sputtering method, a constituent element of the conductive film collides with the oxide semiconductor film 102, and when part of the conductive film is removed by a dry etching method, the etching gas collides with the oxide semiconductor film 102). Therefore, in the case where a film having crystallinity such as a CAAC-OS film is formed as the oxide semiconductor film 102, part of the oxide semiconductor film becomes amorphous in some cases. In that case, the crystallinity of the oxide semiconductor film 102 can be recovered by performing heat treatment after the first electrode film 104 and the lower electrode film 130 are formed. As heat condition of the heat treatment, the heat treatment is performed within a temperature range of higher than or equal to 300° C. and lower than or equal to 700° C., preferably higher than or equal to 300° C. and lower than or equal to 450° C. under an oxygen atmosphere. The heat treatment may be performed under a nitrogen atmosphere, reduced pressure, or the air (ultra-dry air).

Further, in the case where the first electrode film 104 and the lower electrode film 130 are formed using gas, solution, or the like, such as by dry etching or wet etching, impurity elements (e.g., copper, aluminum, chlorine, and the like) which adversely affects electric characteristics of the transistor 150 attaches to the surface of the oxide semiconductor film 102 in some cases. Therefore, impurities on the surface of the oxide semiconductor film 102 are preferably removed by exposing the surface of the oxide semiconductor film 102 to oxalic acid, dilute hydrofluoric acid, or the like or by plasma treatment (such as $N_2O$ plasma treatment) after the first electrode film 104 and the lower electrode film 130 are formed. Specifically, the concentration of copper in the surface of the oxide semiconductor film 102 is lower than or equal to $1\times10^{18}$ atoms/$cm^3$, preferably lower than or equal to $1\times10^{17}$ atoms/$cm^3$. The concentration of aluminum in the surface of oxide semiconductor film is preferably less than or equal to $1\times10^{18}$ atoms/$cm^3$. The concentration of chlorine in the surface of the oxide semiconductor film is preferably less than or equal to $2\times10^{18}$ atoms/$cm^3$.

Figures 1, 2C:
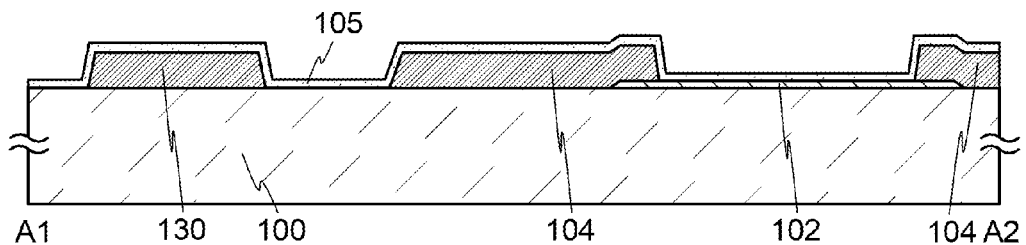

Next, an insulating film 105 is formed over the substrate 100 having an insulating surface, the oxide semiconductor film 102, the first electrode film 104, and the lower electrode film 130 (see FIG. 2C-1). The insulating film is processed in a later step to function as the gate insulating film 106 in the transistor 150 and functions as the inter-electrode insulating film 132 in the capacitor 160.

For the insulating film 105, an oxide semiconductor film having a sufficient withstand voltage and a sufficient insulating property is preferably used. The insulating film 105 can be formed by a vacuum deposition method, a physical vapor deposition (PVD) method such as a sputtering method, or a chemical vapor deposition (CVD) method such as a plasma CVD method to have a single-layer structure or a stacked-layer structure of a silicon oxide film, a silicon oxynitride film, a silicon nitride film, a silicon nitride oxide film, an aluminum oxide film, an aluminum nitride film, an aluminum oxynitride film, an aluminum nitride oxide film, a gallium oxide film, a yttrium oxide film, a lanthanum oxide film, or the like. A high-k material film such as a hafnium oxide film, a hafnium silicate film ($HfSi_xO_y$ (x>0, y>0)), a hafnium silicate film to which nitrogen is added ($HfSiO_xN_y$ (x>0, y>0)), or a hafnium aluminate film ($HfAl_xO_y$ (x>0, y>0)), may be used as at least part of the insulating film 105. Thus, gate leakage current can be reduced.

With the use of the oxide insulating film as the insulating film 105, part of oxygen in the oxide insulating film can be released by heat treatment and supplied to the oxide semiconductor film 102 in a manner similar to the above-described description of the substrate 100 having an insulating surface. Thus, an oxygen vacancy in the oxide semiconductor film 102 can be filled. Note that there is no particular limitation on the timing when the heat treatment is performed on the insulating film 105 as long as it is after the insulating film 105 is formed.

In particular, the insulating film 105 preferably contains a large amount of oxygen which exceeds at least the stoichiometry in (a bulk of) the insulating film 105. For example, a film of silicon oxide represented by the formula $SiO_{2+\alpha}$ ($\alpha$>0) is preferably used as the insulating film 105. When such an oxide silicon film is used as the insulating film 105, oxygen can be supplied to the oxide semiconductor film 102, so that the transistor 150 using the oxide semiconductor film 102 can have favorable transistor characteristics.

Figures 2, 2C:
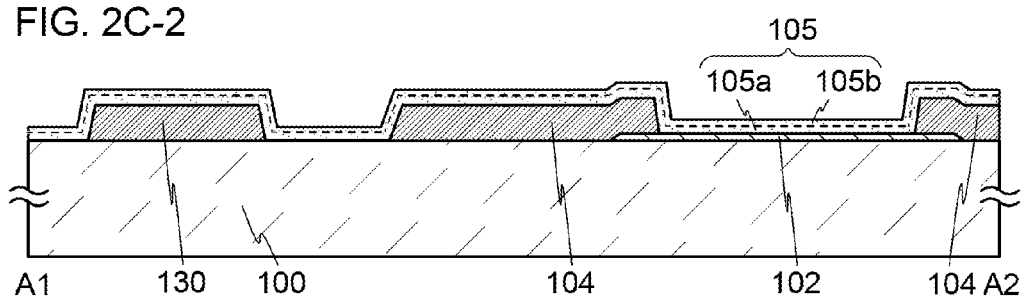

As illustrated in FIG. 2C-2, in the case where the insulating film 105 has a layered structure, a barrier film 105b having a low oxygen or water vapor permeability (also referred to as a low moisture permeability) is preferably stacked over the oxygen supply film 105a (that is, to a surface of the silicon oxide film that is the insulating film 105 on a side opposite to the surface of the same in contact with the oxide semiconductor film 102). Accordingly, release of oxygen from the oxide semiconductor film 102 can be suppressed, so that oxygen in the oxygen supply film can be efficiently supplied to the oxide semiconductor film 102. Further, entry and diffusion of hydrogen or moisture into the oxide semiconductor film 102 can be suppressed. As the film having a low oxygen or water vapor permeability, for example, an aluminum oxide film, an aluminum oxynitride film, an aluminum nitride oxide film, or the like can be used. When the aluminum oxide film is used, by employing a high-density film (the film density is higher than or equal to 3.2 g/$cm^3$, preferably higher than or equal to 3.6 g/cm$^3$), the transistor 150 can have stable electric characteristics. Note that in FIG. 2C-2, the insulating film 105 has a two-layer structure; however, the insulating film 105 may have a stacked-layer structure of three or more layers using the above-described oxygen supply film 105a and the barrier film 105b. The description of the oxygen supply film in the description of the substrate 100 having an insulating surface here can be referred to for the oxygen supply film 105a.

To make the oxygen supply film 105a a film from which oxygen can be released by heat treatment, for example, oxygen is added into the film by an ion implantation method, an ion doping method, a plasma immersion ion implantation method, plasma treatment, or the like. Preferably, oxygen is added by an inductively coupled plasma (ICP) method, using oxygen plasma excited by microwaves (with a frequency of 2.45 GHz, for example). Also in the oxygen plasma treatment, as described in the description of the substrate 100 having an insulating surface, the plasma treatment is preferably performed in a state where a direct current bias is applied to the substrate side (a bias application apparatus provided on the substrate side or the substrate itself).

Note that the oxygen supply film described in the description of the substrate 100 having an insulating surface can also be formed by the above-described oxygen adding treatment.

Further, the barrier film 105b can also be provided with a low oxygen or water vapor permeability, for example, by forming a metal film (a metal film which can exhibit a low oxygen or water vapor permeability by performing oxygen adding treatment, e.g., an aluminum film) and performing oxygen adding treatment to the metal film, instead of direct formation of an aluminum oxide film, an aluminum oxynitride film, an aluminum nitride oxide film, or the like as described above. The film formed by that method, particles are less generated than the case where an aluminum oxide film, an aluminum oxynitride film, an aluminum nitride oxide film, or the like is directly formed, so that decrease in yield of the semiconductor device can be suppressed.

The barrier film described in the description of the substrate 100 having an insulating surface can also be formed by the above-described method.

Figure 3A:
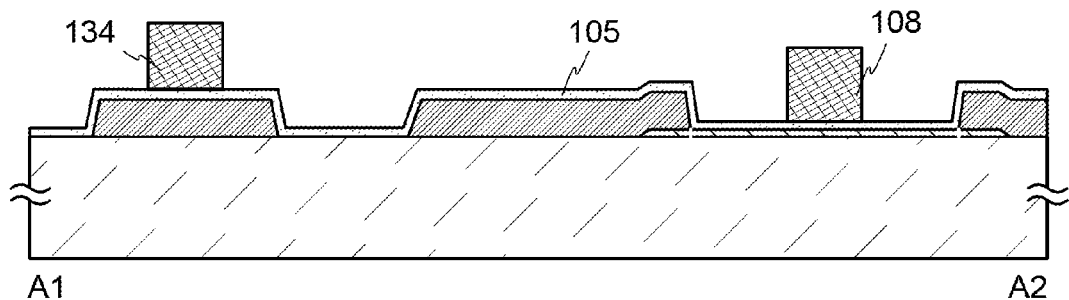
FIGS. 3A to 3D illustrate a method for manufacturing the semiconductor device described in Embodiment 1.

Next, a conductive film is formed over the insulating film 105, a resist mask is formed over the conductive film by a photolithography process, and is selectively etched with the resist mask, whereby the gate electrode 108 of the transistor 150 and the upper electrode film 134 of the capacitor 160 (and a wiring formed using the same layer) are formed; then the resist mask is removed (see FIG. 3A).

The conductive film for forming the gate electrode 108 and the upper electrode film 134 can be formed, for example, by using a metal material such as molybdenum, titanium, tantalum, tungsten, aluminum, copper, neodymium, or scandium; or an alloy material mainly containing any of these materials by a physical vapor deposition (PVD) method such as a vacuum evaporation method or a sputtering method or a chemical vapor deposition (CVD) method such as a plasma CVD method. Alternatively, the conductive film used for the gate electrode may be formed using a conductive metal oxide. As the conductive metal oxide, an indium oxide ($In_2O_3$), a tin oxide ($SnO_2$), a zinc oxide (ZnO), an indium tin oxide ($In_2O_3$—$SnO_2$, which is abbreviated to ITO in some cases), an indium zinc oxide ($In_2O_3$—ZnO), or any of these metal oxide materials in which silicon or a silicon oxide is included can be used. The gate electrode 108 can be formed to have a single-layer structure or a stacked-layer structure using any of the above materials. There is no particular limitation on the method for forming the conductive film, and a variety of film formation methods such as an evaporation method, a CVD method, a sputtering method, or a spin coating method can be employed.

As one layer of the conductive film at the side in contact with the insulating film 105, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to take a positive value when used as the gate electrode, so that a "normally-off switching element" can be obtained.

Note that the resist mask which is used for the formation of the gate electrode 108 and the upper electrode film 134 may be formed by an ink-jet method. Formation of the resist mask by an ink-jet method needs no photomask; thus, manufacturing cost can be reduced. Further, the conductive film may be etched by either dry etching or wet etching, or by both dry etching and wet etching.

Next, by an ion doping method or an ion implantation method, an impurity ion 180 by which the conductivity of the oxide semiconductor film 102 is changed is added to the oxide semiconductor film 102, so that the second region 102b is formed in the oxide semiconductor film 102. At this time, the gate electrode 108 functions as a mask, whereby the impurity ion 180 is not added into a region of the oxide semiconductor film 102 which overlaps with the gate electrode 108, so that the first region 102a which functions as a channel formation region is formed in a self-aligned manner. The impurity ion 180 is not added to a region of the oxide semiconductor film 102 which overlaps with the first electrode film 104 either; therefore, it can be said that that region has the same film quality as the first region. However, in this specification, an oxide semiconductor film is described by dividing into a "region in which a channel is formed by adding voltage to the gate electrode 108" and a "region in which a channel is not formed even when voltage is added to the gate electrode 108". The region of the oxide semiconductor film 102 which overlaps with the first electrode film 104 comes under the latter in the broad sense; therefore, in this specification, the region of the oxide semiconductor film 102 overlapping with the first electrode film 104 is referred to as the second region 102b. In other words, the second region 102b is a region other than the first region 102a in the oxide semiconductor film 102.

Note that in the oxide semiconductor film 102, in a region where the impurity ion 180 is added, the crystal structure is disordered, so that the region is likely to be in an amorphous state. Therefore, in the case where a film having crystallinity such as a CAAC-OS film is used as the oxide semiconductor film 102 and the impurity ion 180 is added to the film, the first region 102a functioning as a channel formation region keeps the state of the oxide semiconductor film having crystallinity, because impurities are not added thereto, and the second region 102b which does not overlap with the first electrode film 104 is likely to be an oxide semiconductor film in an amorphous state (or an oxide semiconductor film which is almost in an amorphous state), because impurities are added thereto.

An oxide semiconductor film in an amorphous state (or an oxide semiconductor film which is almost in an amorphous state) easily absorbs impurities such as hydrogen which serves as a donor from an oxide semiconductor film having crystallinity such as a CAAC-OS film; therefore, the impurities are absorbed (also referred to as gettered) from the first region 102a to the second region 102b, so that electric characteristics of the transistor 150 can be improved.

One or more selected from the following can be used as the impurity ion 180: Group 15 elements (typified by nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn). Note that because an ion implantation method uses a mass separator with which only necessary ion is extracted, only the impurity ion 180 can be selectively added to an object by an ion implantation method. An ion implantation method is thus preferably employed, in which case entry of impurities (e.g., hydrogen) into the oxide semiconductor film 102 is reduced as compared to the case where the ion is added by an ion doping method. Note that the use of an ion doping method is not excluded.

Figure 3B:
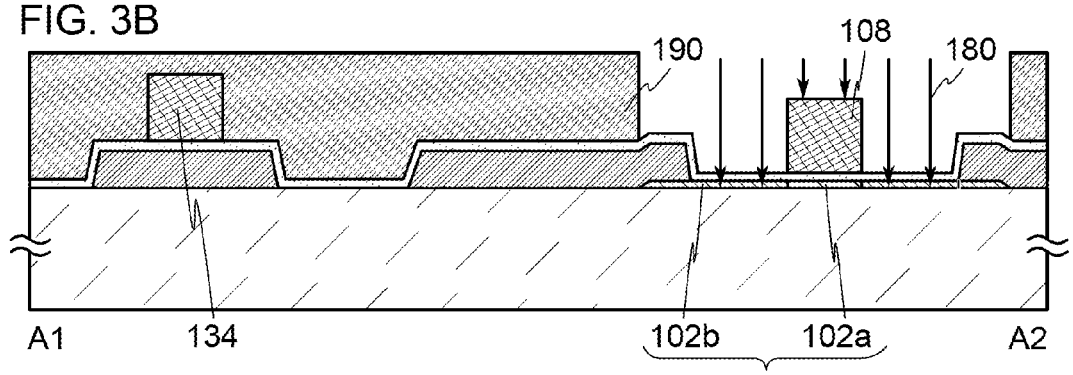

Note that, as illustrated in FIG. 3B, the impurity ion 180 may be added in a state where a resist mask 190 covers a portion in which the impurity ion 180 needs not be added. As a result, damage to the film by implantation of the impurity ion 180 can be reduced.

Figure 3C:
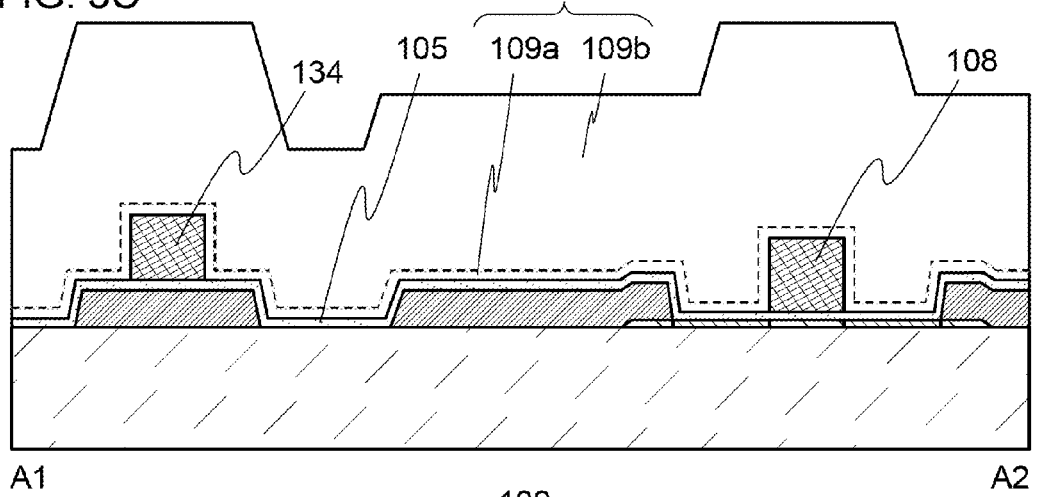

Next, an insulating film 109 is formed over the insulating film 105, the gate electrode 108, and the upper electrode film 134 (see FIG. 3C).

The insulating film 109 (including a region 109a and a region 109b in the insulating film 109) can be formed using a method and a material similar to those of the insulating film 105, preferably formed using a method and a material similar to those of the oxygen supply film 105a. Accordingly, oxygen in the insulating film 109 can be supplied to the first region 102a which serves as a channel formation region by heat treatment.

The insulating film 109 may have a single-layer structure, but preferably has a structure including a plurality of regions such as the region 109a functioning as an oxygen supply film and the region 109b over the region 109a as in this embodiment. The reason is described below.

In some cases, removal treatment (also referred to as planarization treatment) is performed on the insulating film 109 in a later step, so that the insulating film 109 functions as a planarization film. From this reason, the insulating film 109 is needed to have a larger thickness to some extent than the gate insulating film 106 and the like; therefore, in order to add oxygen to a deep portion (that is, a portion near to the oxide semiconductor film 102) in the film after the insulating film 109 is formed, treatment for adding an oxygen ion into the film with strong energy, such as by an ion implantation method or an ion doping method is needed. Thus, an oxygen ion is added into the oxide semiconductor film with strong energy, which adversely affects the structure of the oxide semiconductor film 102 (e.g., the crystallinity of the oxide semiconductor film 102 is degraded) in some cases.

To solve the above-described problem, first, the region 109a is formed thin (specifically, ⅕ or less, preferably ⅒ or less of the thickness of the whole insulating film 109) and the region 109a is made a film which can supply oxygen by heat treatment by using oxygen adding treatment which does not damage the oxide semiconductor film 102 as much as possible (e.g., plasma treatment performed by an ICP method, using oxygen plasma which is excited by a microwave (with a frequency of 2.45 GHz, for example)). After that, the region 109b is formed, whereby the thickness of the insulating film 109 is adjusted to a thickness at which the film can withstand the planarization treatment. Note that there is no particular limitation on the timing when heat treatment is performed on the insulating film 109 as long as it is after the insulating film 109 is formed.

In this embodiment, the region 109a and the region 109b are formed using the same material and it is difficult to identify an interface between them clearly; therefore, the region 109a and the region 109b are distinguished by a dotted line. However, the same method cannot necessarily apply to the case where the region 109a and the region 109b are formed using the different materials.

Figure 3D:
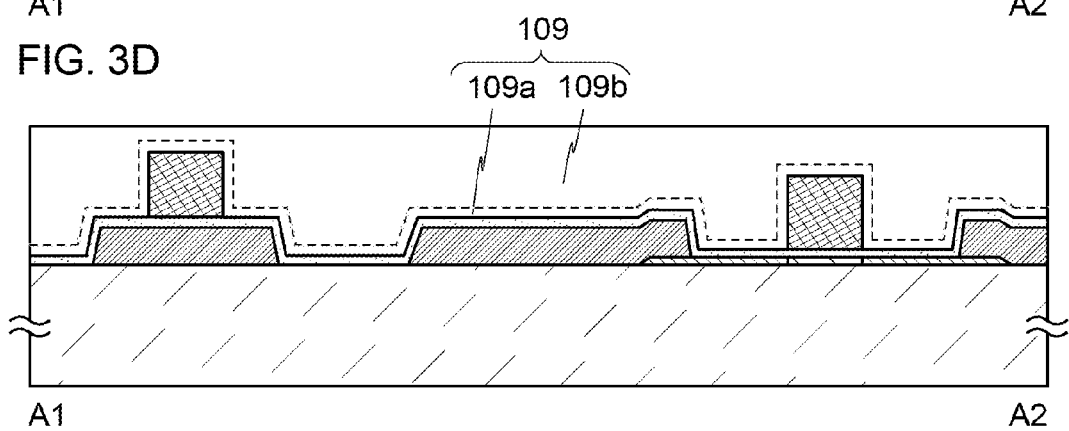

Next, removal treatment (also referred to as planarization treatment) is performed on the insulating film 109 (see FIG. 3D). As the removal treatment, chemical mechanical polishing (CMP) treatment, a dry etching method, or the like is used. Note that the CMP treatment may be performed only once or plural times.

Next, a resist mask is formed over a region where the insulating film 109 overlaps with at least the gate electrode 108 by a photolithography process and the insulating film 109 is selectively etched with the resist mask, whereby the second insulating film 110 which is provided on at least a side surface of the gate electrode 108 is formed. Then, removal treatment is performed on the insulating film 105 by a dry etching method or a wet etching method using the second insulating film 110 as a mask, so that the gate insulating film 106 and the inter-electrode insulating film 132 are formed (see FIG. 4A). Note that in this embodiment, the second insulating film 110 is also formed but is not necessarily formed on a side surface of the upper electrode film 134 of the capacitor 160.

Figure 4A:
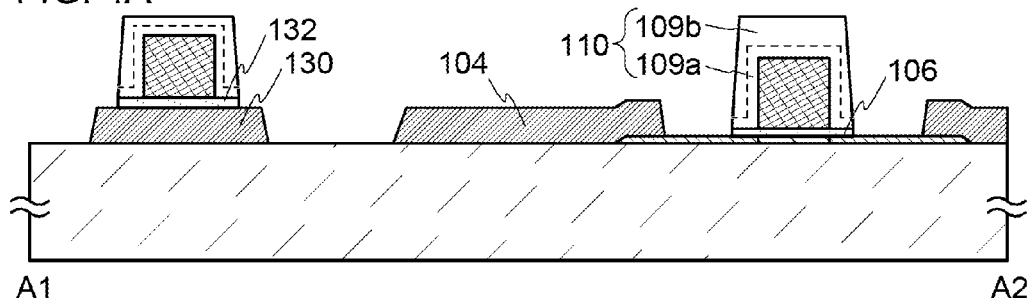
FIGS. 4A to 4D illustrate a method for manufacturing the semiconductor device described in Embodiment 1.
Figure 4B:
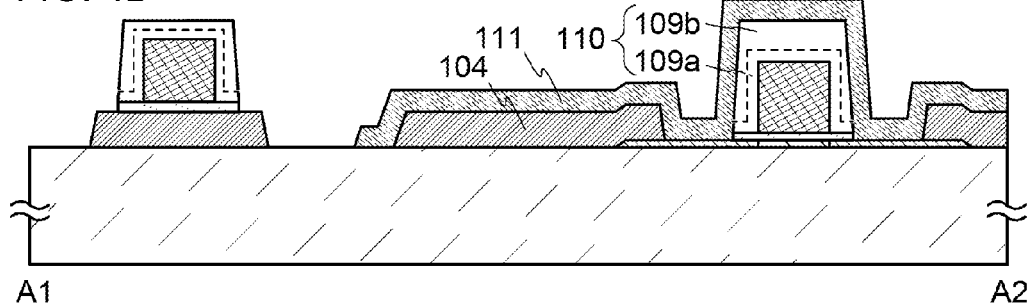

Next, a conductive film is formed over the substrate 100 having an insulating surface, the oxide semiconductor film 102, the first electrode film 104, and the second insulating film 110, a mask is formed over the conductive film by a photolithography method, a printing method, an inkjet method, or the like, and part of the conductive film is selectively removed with the mask, so that the conductive film 111 is formed (see FIG. 4B). The conductive film 111 can be formed using a method and a material similar to those of the first electrode film 104.

Figure 4C:
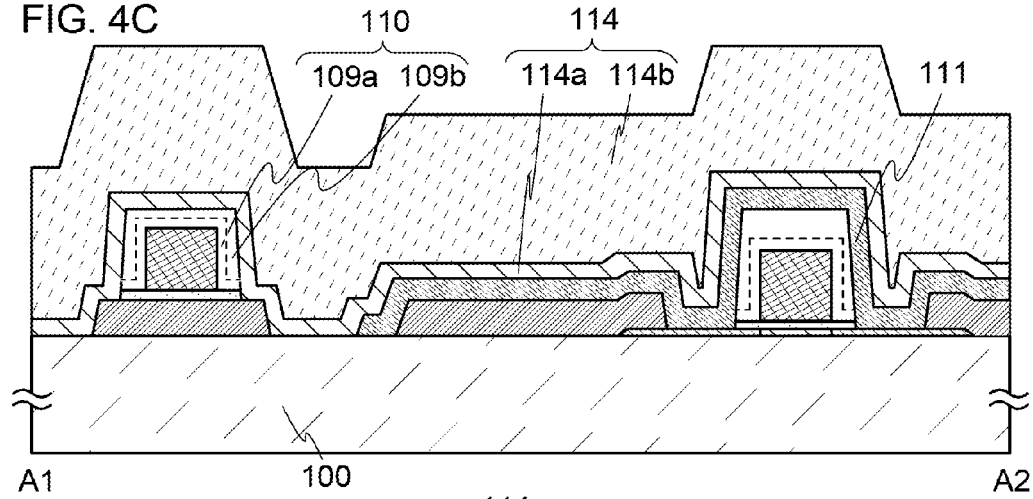

Next, the third insulating film 114 is formed over the substrate 100 having an insulating surface, the second insulating film 110, and the conductive film 111 (see FIG. 4C).

The third insulating film 114 (including the insulating films 114a and 114b in the third insulating film 114) may be formed using a method and a material similar to those of the gate insulating film 106. Note that the third insulating film 114 can have a single-layer structure, but preferably has a layered structure of the insulating films 114a and 114b as in this embodiment. The reason is described below.

Figure 6A:
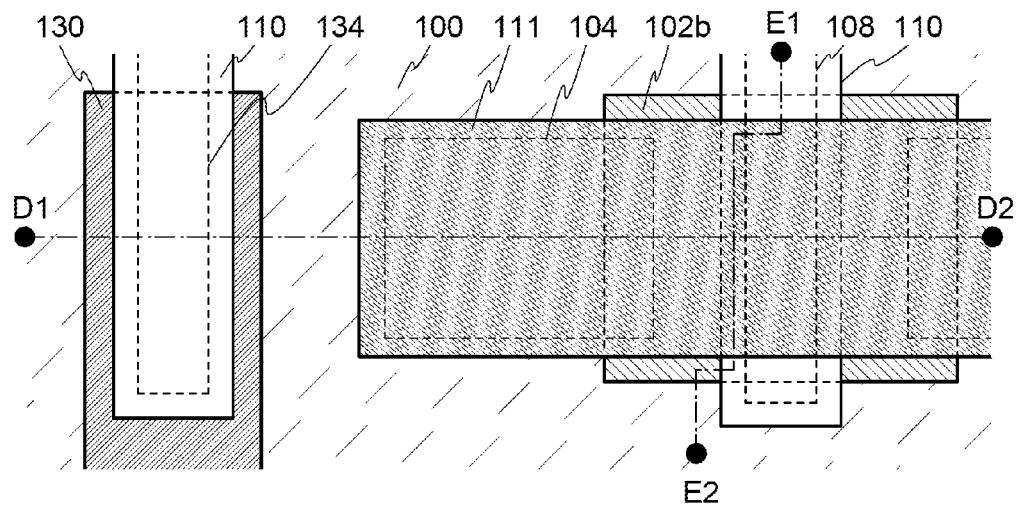
FIGS. 6A to 6D illustrate a method for manufacturing the semiconductor device described in Embodiment 1.
Figure 6B:
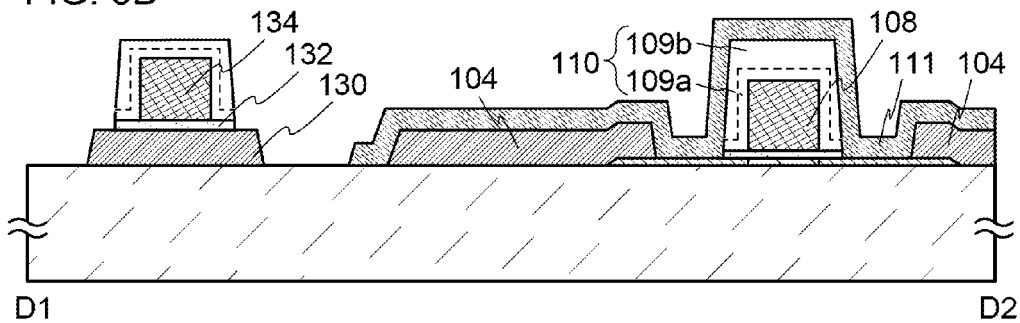
Figure 6C:
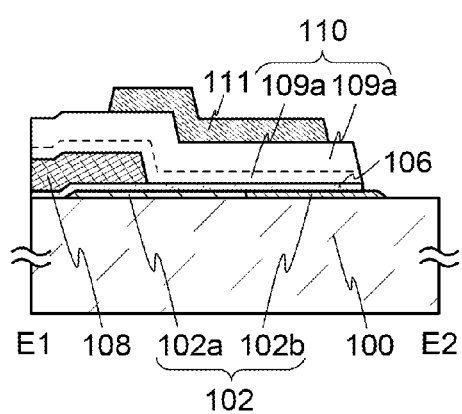
Figure 6D:
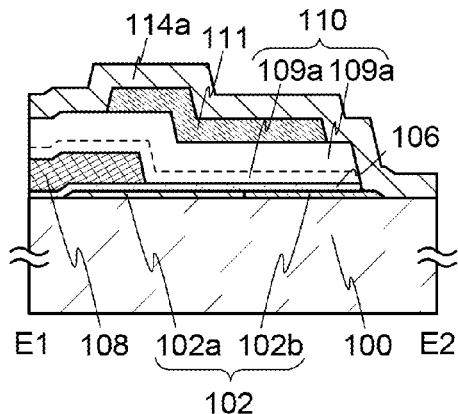

FIGS. 6A to 6D illustrate an example of a plan view and cross-sectional views of the oxide semiconductor device after the conductive film 111 is formed. FIG. 6A is a plan view, FIG. 6B is a cross-sectional view taken along a dashed-dotted line D1-D2 in FIG. 6A, and FIG. 6C is a cross-sectional view taken along a dashed-dotted line E1-E2 in FIG. 6A. FIG. 6D is a cross-sectional view in the case where the insulating film 114a is formed over a structure of FIG. 6C.

After the conductive film 111 is formed, as illustrated in FIG. 6C, the insulating film 110 in a portion where the gate electrode 108 or the conductive film 111 is not formed is exposed to outside. Thus, in the case where heat treatment is performed in that state, oxygen in the insulating film 110 might not be supplied to the oxide semiconductor film 102 but might be released to the outside. Further, hydrogen or moisture may be entered from the outside into the oxide semiconductor film 102 and may adversely affect electric characteristics.

Thus, first, the insulating film 114a is formed using a film having a low oxygen or water vapor permeability (see FIG. 6D). As a result, generation of the above-described problem can be suppressed. Note that the film can be formed using a method and a material similar to those of the barrier film 105b.

Further, the third insulating film 114 preferably functions as a planarization film for easily formation of an element formation layer thereover; thus, the insulating film 114b used for planarization treatment is formed over the insulating film 114a. Therefore, the third insulating film 114 preferably has a layered structure.

Next, removal treatment (also referred to as planarization treatment) is performed on part of the insulating film 114b and part of the conductive film 111 so as to expose the second insulating film 110, whereby part of the conductive film 111 which overlaps with the gate electrode 108 of the transistor 150 is removed. As a result, the conductive film 111 is divided with the gate electrode 108 provided therebetween and the divided portions become a pair of second electrode films 112 sandwiching the gate electrode 108 is provided, which is electrically connected to the first electrode film 104 and the second region 102b between the first electrode film 104 and the first region 102a (see FIG. 4D).

Note that in this embodiment, the levels of the top surfaces of the pair of second electrode films 112, the second insulating film 110, and the third insulating film 114 are aligned. With such a structure, coverage of a thin film formed in a later step (a manufacturing step or the like of a semiconductor device or an electronic device including the transistor) can be improved, so that disconnection of a thin film or a wiring can be prevented. For example, if there is a step among the top surfaces of the pair of second electrode films 112, the second insulating film 110, and the third insulating film 114, a film or a wiring over the step is disconnected and a defect occurs; by contrast, if the levels of the top surfaces of the pair of second electrode films 112, the second insulating film 110, and the third insulating film 114 are aligned with each other, such a defect can be prevented, thereby improving the reliability. However, as long as the above-described defect is not generated, there is no problem even if there is a step among the top surfaces of the pair of second electrode films 112, the second insulating film 110, and the third insulating film 114.

The second electrode film 112 is provided in contact with at least part of the second region 102b (an area indicated by an arrow R in FIG. 4D) between the first electrode film 104 and the first region 102a, whereby resistance between the first electrode film 104 and the first region 102a can be reduced. Therefore, characteristics of the transistor 150 can be improved (for example, increase in on-current, reduction in variation of the threshold voltage, or the like). As the removal treatment, chemical mechanical polishing (CMP) treatment, a dry etching method, or the like may be used. Note that the CMP treatment may be performed only once or plural times.

In the case where the above-described removal treatment is performed using chemical mechanical polishing, the amount of removal varies within a substrate surface in some cases. Thus, it is preferable that etching treatment (dry etching or/and wet etching) be further performed after the removal treatment in order to completely remove the part of the conductive film 111 which overlaps with the gate electrode 108 be performed.

Figure 4D:
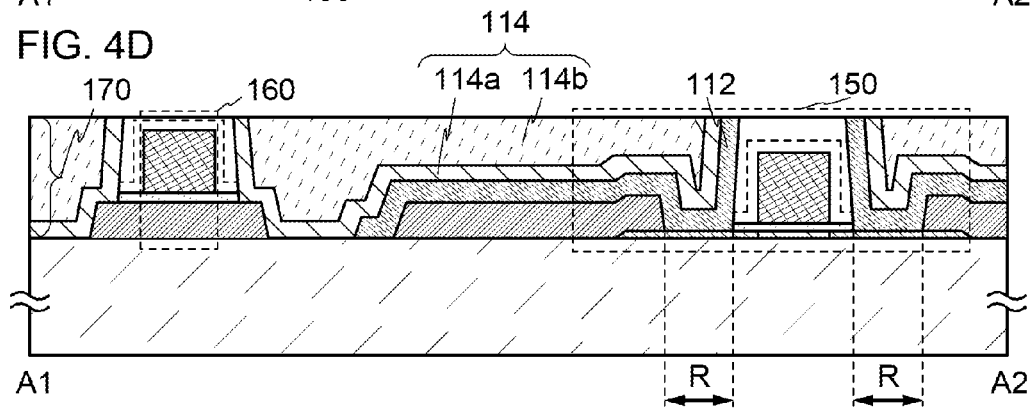
Figure 5:
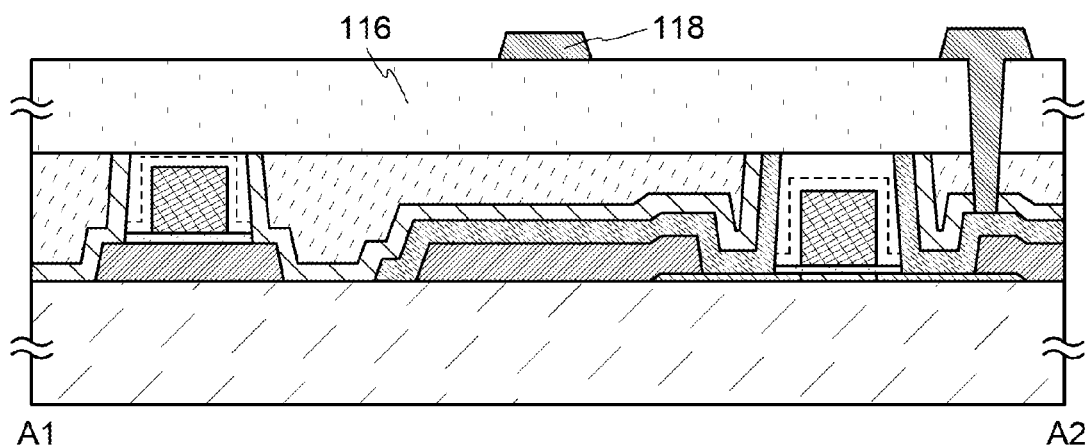
FIG. 5 illustrates a method for manufacturing the semiconductor device described in Embodiment 1.

Through the above process, the element formation layer 170 including the transistor 150 and the capacitor 160 can be formed (see FIG. 4D). Further, as illustrated in FIG. 5, after the fourth insulating film 116 having high surface flatness is formed over the element formation layer 170, an opening is formed and a wiring 118 electrically connected to the semiconductor element in the element formation layer 170 is formed in the opening, whereby a different element formation layer can be formed over the element formation layer 170.

The fourth insulating film 116 can be formed using a method and a material similar to those of the gate insulating film 106. Alternatively, the fourth insulating film 116 may be formed in such a manner that an organic material having an insulating property is applied by a spin coating method, a printing method, a dispensing method, an ink-jet method, or the like, and cure treatment (e.g., heat treatment or light irradiation treatment) is performed depending on the applied material. As an organic material having an insulating property, for example, an organic resin such as an acrylic resin, a polyimide resin, a polyamide resin, a polyamide-imide resin, or an epoxy resin can be used. In addition to such resin materials, it is also possible to use a low-dielectric constant material (low-k material), a siloxane-based resin, phosphosilicate glass (PSG), borophosphosilicate glass (BPSG), or the like. Note that the planarizing insulating film may be formed by stacking a plurality of insulating films formed of any of these materials. It is preferable that a film having a low water vapor permeability such as a barrier film 105b (e.g., a film of an aluminum oxide or a film including an aluminum oxide) be formed under the film formed using an organic material because the above-described organic material contains a relatively large amount of impurities such as moisture in many cases. Then, it is preferable that heat treatment be performed after the fourth insulating film 116 is formed, so that oxygen can be supplied (e.g., in this embodiment, oxygen is supplied from the gate insulating film 106 functioning as a gate insulating film or the second insulating film 110) to the first region 102a serving as the channel formation region of the oxide semiconductor film 102 to fill oxygen vacancies in the first region 102a. Accordingly, electric characteristics of the transistor 150 can be improved.

The wiring 118 can be formed using a method and a material similar to those of the first electrode film 104 or the lower electrode film 130.

Figure 7:
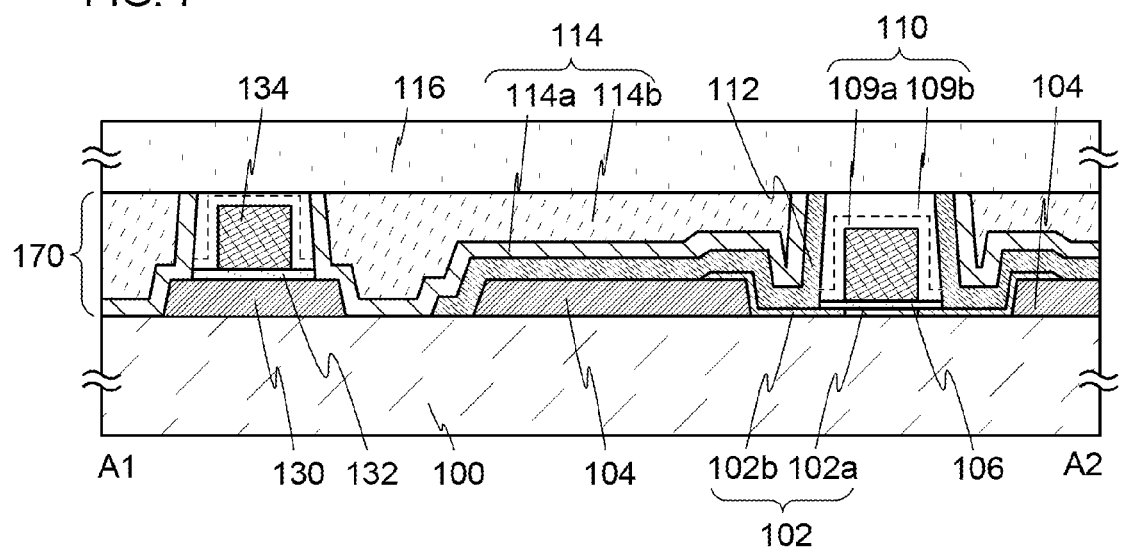
FIG. 7 illustrates another structure of the semiconductor device described in Embodiment 1.

In this embodiment, the first electrode film 104 is in contact with an upper surface of the oxide semiconductor film 102; however, the first electrode film 104 may be in contact with a lower surface of the oxide semiconductor film 102. A top view of the structure is omitted, because it is the same as FIG. 1A. Further, a cross-sectional view taken along a line B1-B2 of FIG. 1A and a cross-sectional view taken along a line C1-C2 of FIG. 1A are the same as FIG. 1C and FIG. 1D, respectively. Thus, a cross-sectional view taken along a line A1-A2 of FIG. 1A is illustrated in FIG. 7.

The above structure can be formed by reversing the order of forming the oxide semiconductor film 102 and the first electrode film 104 described in this embodiment, and performing the other steps in accordance with the manufacturing method described in this embodiment.

In the above structure, the oxide semiconductor film 102 is formed after the conductive film is processed to form the first electrode film 104; therefore the oxide semiconductor film 102 is not damaged in the formation of the first electrode film 104, so that the electric characteristics of the transistor 150 can be improved.

In this embodiment, a flexible substrate may be used as the substrate 100 having an insulating surface. As the method for forming the element formation layer 170 over a flexible substrate, the element formation layer 170 may be directly formed over the flexible substrate, or the element formation layer 170 may be formed on a manufacturing substrate, removed from the manufacturing substrate, and transferred to the flexible substrate. Note that in order to remove and transfer the element formation layer 170 from the manufacturing substrate to the flexible substrate, a separation layer is preferably provided between the manufacturing substrate and the element formation layer 170. The known document can be referred to for the method for removing and transferring with a separation layer (e.g., Japanese Published Patent Application No. 2011-211208). As the flexible substrate, a substrate formed using an organic resin such as polyimide or polyester is used.

Embodiment 2

In this embodiment, one embodiment of a structure and a manufacturing method of a semiconductor device whose structure is different from that described in Embodiment 1 will be described with reference to FIGS. 8A to 8D and FIGS. 9A to 9D.

<Example of Structure of Semiconductor Device>

Figure 8A:
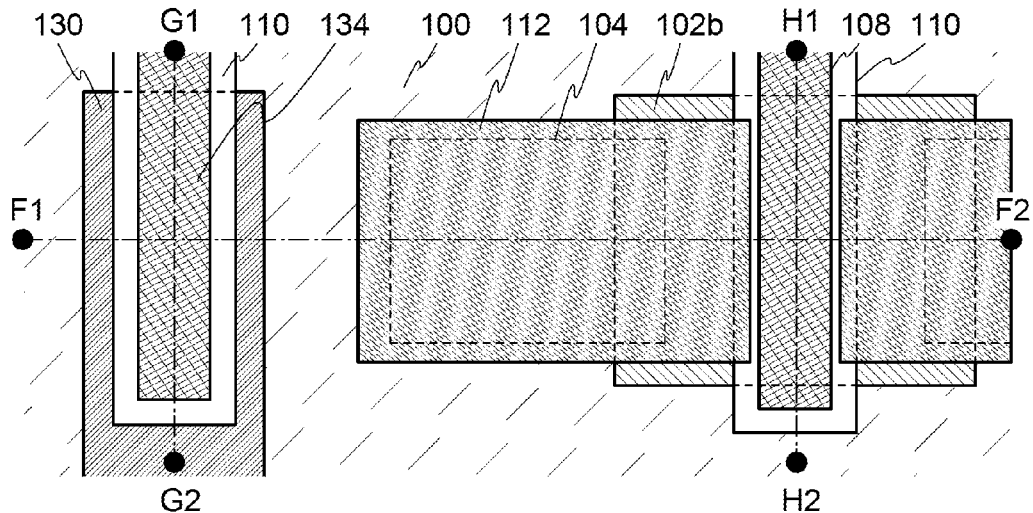
FIGS. 8A to 8D illustrate a structure of a semiconductor device described in Embodiment 2.
Figure 8B:
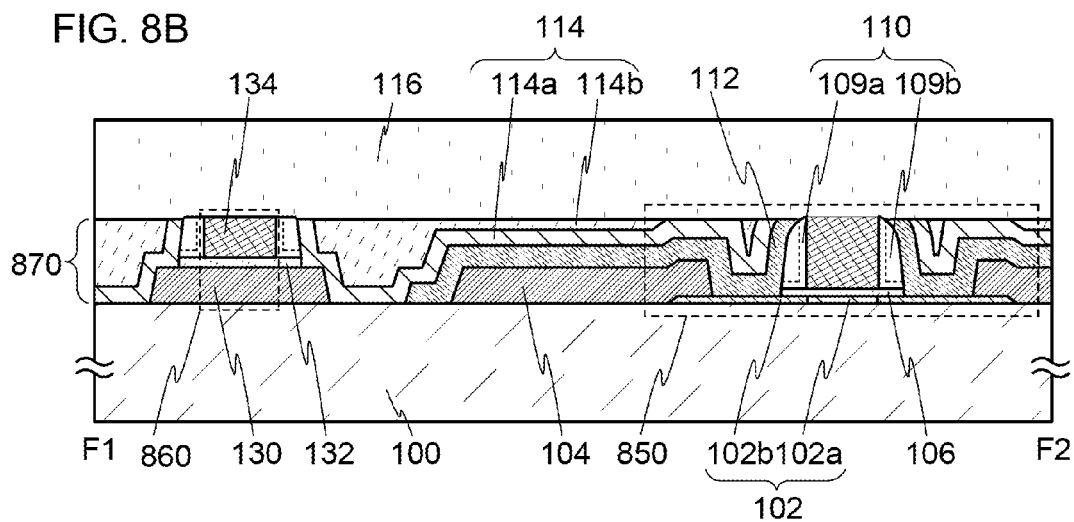
Figure 8C:
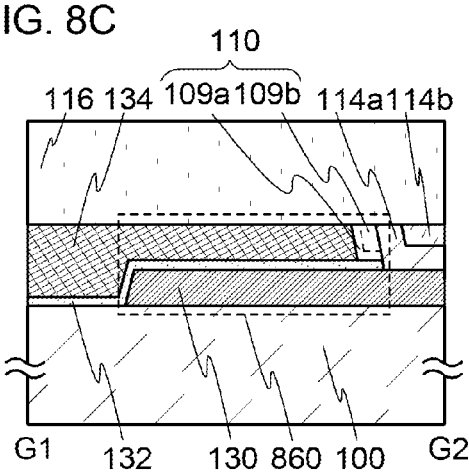
Figure 8D:
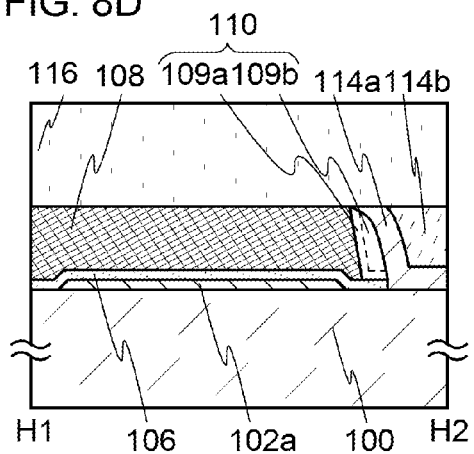

FIGS. 8A to 8D show an example of a plan view and cross-sectional views of a semiconductor device including an element formation layer 870 including a top-gate transistor 850 and a capacitor 860. FIG. 8A is a plan view, FIG. 8B is a cross-sectional view taken along a dashed-dotted line F1-F2 in FIG. 8A, FIG. 8C is a cross-sectional view taken along a dashed-dotted line G1-G2 in FIG. 8A, and FIG. 8D is a cross-sectional view taken along a dashed-dotted line H1-H2 in FIG. 8A. In FIG. 8A, part of components is omitted to avoid complexity of the drawing.

The element formation layer 870 in FIGS. 8A to 8D includes the transistor 850 and the capacitor 860. The transistor 850 has a structure which includes: an oxide semiconductor film 102 provided over a substrate 100 having an insulating surface and including a first region 102a which functions as a channel formation region and second regions 102b sandwiching the first region 102a in the channel length direction; a pair of first electrode films 104 covering an end portion of the oxide semiconductor film 102 and electrically connected to the second regions 102b; a gate insulating film 106 provided over at least the first region 102a; a gate electrode 108 provided over the first region 102a with the gate insulating film 106 provided therebetween; a second insulating film 110 provided on at least a side surface of the gate electrode 108; and a pair of second electrode films 112 sandwiching the gate electrode 108, which is electrically connected to the first electrode film 104 and the second regions 102b. Further, the capacitor 160 includes a lower electrode film 130, an upper electrode film 134, and an inter-electrode insulating film 132 which is sandwiched between the lower electrode film 130 and the upper electrode film 134.

Note that in this embodiment, the components of the transistor 850 and the capacitor 860, and the third insulating film 114 are collectively referred to as the element formation layer 870, because the third insulating film 114 is formed at the same level (in the same layer) as the transistor 850 and the capacitor 860. However, it is not necessary to include the third insulating film 114 in the element formation layer 870; a structure consisting of the components of the transistor 850 and the capacitor 860 can be referred to as the element formation layer 870.

The first electrode film 104 and the lower electrode film 130 have the same composition, the gate insulating film 106 and the inter-electrode insulating film 132 have the same composition, and the gate electrode 108 and the upper electrode film 134 have the same composition. That is, the first electrode film 104 and the lower electrode film 130 are formed through the same step, the gate insulating film 106 and the inter-electrode insulating film 132 are formed through the same step, and the gate electrode 108 and the upper electrode film 134 are formed through the same step. Accordingly, when the transistor 150 is formed, the capacitor 160 is also formed at the same time; thus, the capacitor can be formed efficiently.

Further, a third insulating film 114 is provided adjacent to the transistor 850 and the capacitor 860, so that the element formation layer 870 is formed. As illustrated in FIG. 8B, by providing a fourth insulating film 116 having high surface planarity over the element formation layer 870, it becomes easy to form a wiring (for example, formation of a leading wiring or the like electrically connected to the transistor 850 or the capacitor 860) over the element formation layer 870.

The components of a semiconductor device described in this embodiment are the same as those of the semiconductor device in Embodiment 1; however, a method for forming the second electrode film 112 in this embodiment is different from that in Embodiment 1. In the manufacturing method in Embodiment 1, the second insulating film 110 is formed by etching the insulating film 109 with a mask which is formed by a photolithography process (see FIG. 4A and the description of the drawing). Therefore, the width of the second insulating film 110 in the cannel length direction can be easily controlled. However, removal treatment is performed twice between the formation of the gate electrode 108 and the formation of the second electrode film 112; thus, the time is needed for manufacturing the semiconductor device.

On the other hand, in the structure of the semiconductor device described in this embodiment, the number of removal treatments performed between the formation of the gate electrode 108 and the formation of the second electrode film 112 can be reduced. Therefore, the manufacturing time of the semiconductor device can be shortened.

<Method for Manufacturing Semiconductor Device>

An example of a manufacturing process of the semiconductor device in FIG. 8A to 8D is described with reference to FIGS. 9A to 9D.

First, in the manner indicated by FIGS. 2A to 2C-1 (may be FIGS. 2A to 2C-2) and the description corresponding to the drawings and in the manner indicated by FIGS. 3A to 3C and the description corresponding to the drawings, an oxide semiconductor film 102 including a first region 102a which functions as a channel formation region and second regions 102b sandwiching the first region 102a in the channel length direction; a lower electrode film 130 and a first electrode film 104 covering an end portion of the oxide semiconductor film 102 and electrically connected to the second region 102b which are formed by the same step; an inter-electrode insulating film 132 and a gate insulating film 106 provided over at least the first region 102a which are formed by the same step; an upper electrode film 134 and a gate electrode 108 provided over the first region 102a with the gate insulating film 106 provided therebetween which are formed by the same step; and an insulating film 109 covering the gate insulating film 106 and the gate electrode 108 are formed over a substrate 100 having an insulating surface. In this embodiment, the case where the insulating film 109 has a layered structure of a region 109a and a region 109b is described; however, the insulating film 109 may have a single structure or a layered structure of three or more layers.

Figure 9A:
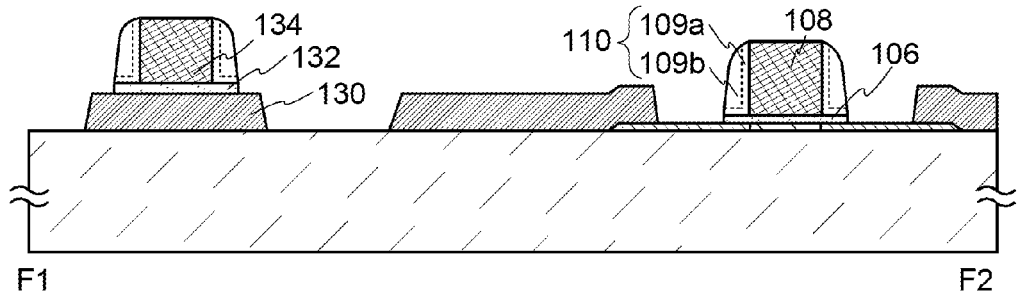
FIGS. 9A to 9D illustrate a method for manufacturing the semiconductor device described in Embodiment 2.

Next, etching treatment is performed on the insulating film 109, so that a second insulating film 110 provided on side surfaces of the gate electrode 108 and the upper electrode film 134 is formed (see FIG. 9A). The second insulating film 110 can be formed in a self-aligned manner by performing a highly anisotropic etching step on the insulating film 109. For example, dry etching is preferably employed. As an etching gas used for dry etching, for example, a gas including fluorine such as trifluoromethane, octafluorocyclobutane, or tetrafluoromethane can be used. A rare gas or hydrogen may be added to the etching gas. As the dry etching, a reactive ion etching (RIE) method in which high-frequency voltage is applied to a substrate is preferably used.

Figure 9B:
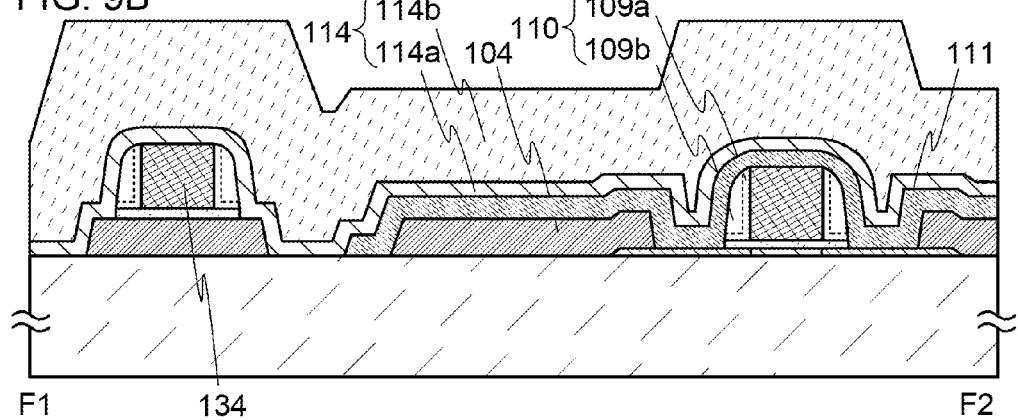

Next, a conductive film 111 covering the substrate 100 having an insulating surface, the oxide semiconductor film 102, the first electrode film 104, the gate electrode 108, the second insulating film 110, and the lower electrode film 130 is formed and processed as in Embodiment 1; then, a third insulating film 114 covering the conductive film 111 is formed (see FIG. 9B).

Next, removal treatment (can also be referred to as planarization treatment) is performed on the third insulating film 114 and the conductive film 111 until at least the gate electrode 108 of the transistor 850 is exposed. As a result, the conductive film 111 is divided with the gate electrode 108 provided therebetween and each of the divided portions becomes a second electrode film 112, which is electrically connected to the first electrode film 104 and the second region 102b between the first electrode film 104 and the first region 102a (see FIG. 9C). The second electrode film 112 is provided in contact with at least part of the second region 102b (an area indicated by an arrow R in FIG. 4D) between the first electrode film 104 and the first region 102a, whereby resistance between the first electrode film 104 and the first region 102a can be reduced. Therefore, characteristics of the transistor 850 can be improved (for example, an increase in on-state current, a reduction in variation of the threshold voltage, or the like). Note that the removal treatment is similar to the removal treatment described in Embodiment 1.

In the case where the above-described removal treatment is performed using chemical mechanical polishing, the amount of removal varies within a substrate surface in some cases. Thus, it is preferable that etching treatment (dry etching or/and wet etching) be further performed after the removal treatment in order to completely remove the part of the conductive film 111 which overlaps with the gate electrode 108 be performed.

As described above, in the case where the method described in this embodiment is applied, the number of removal treatments performed between the formation of the gate electrode 108 and the formation of the second electrode film 112 can be reduced (the number of the removal treatments can be one) as compared to Embodiment 1. Therefore, the manufacturing time of the semiconductor device can be shortened.

Figure 9C:
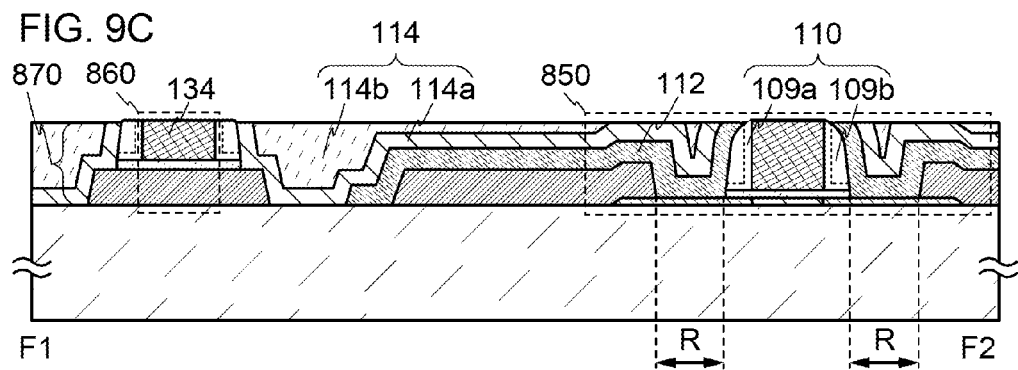
Figure 9D:
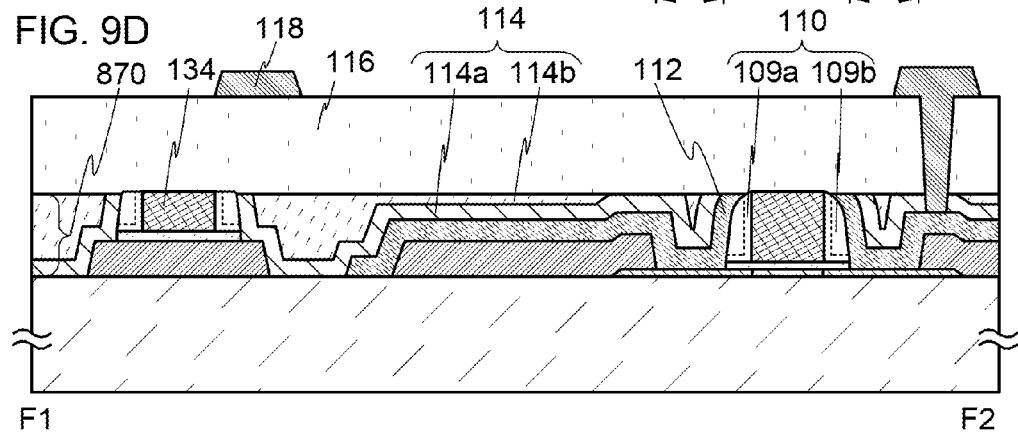

Through the above process, the element formation layer 870 including the transistor 850 and the capacitor 860 can be formed (see FIG. 9C). Further, as in Embodiment 1, the fourth insulating film 116 having high surface flatness may be formed over the element formation layer 870, and the wiring 118 electrically connected to a semiconductor element in the element formation layer 870 may be formed over the fourth insulating film 116 (see FIG. 9D).

Embodiment 3

In this embodiment, one embodiment of a structure and a manufacturing method of a semiconductor device whose structure is different from that described in the above-described embodiments will be described with reference to FIGS. 10A to 10D and FIGS. 11A to 11D.

<Example of Structure of Semiconductor Device>

Figure 10A:
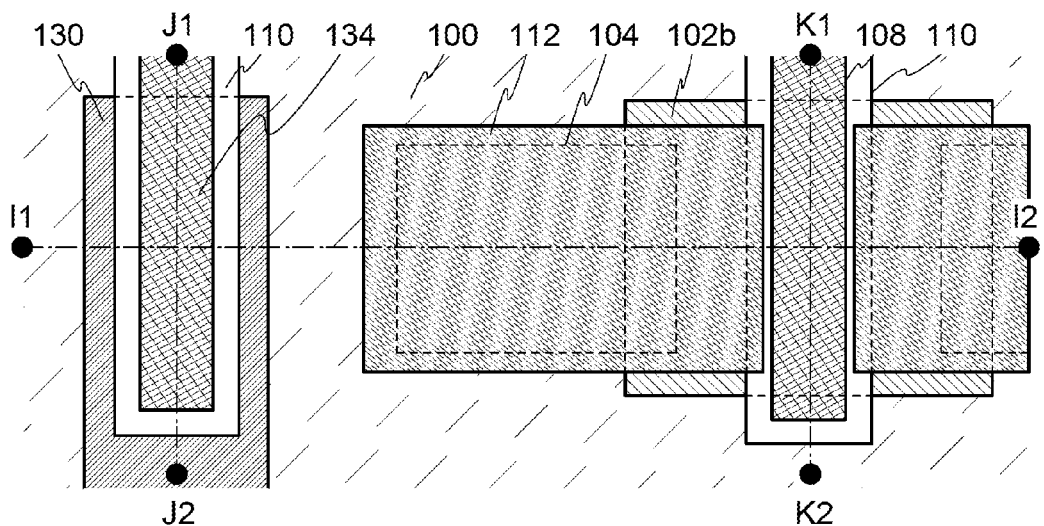
FIGS. 10A to 10D illustrate a structure of a semiconductor device described in Embodiment 3.
Figure 10B:
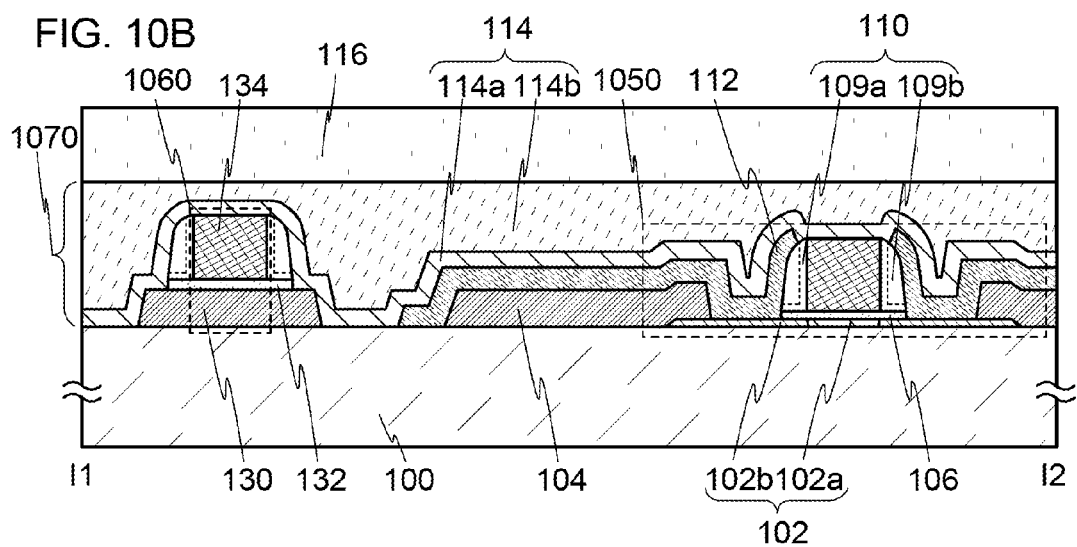
Figure 10C:
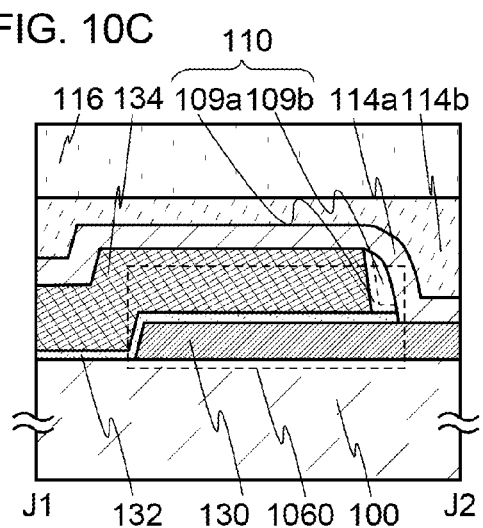
Figure 10D:
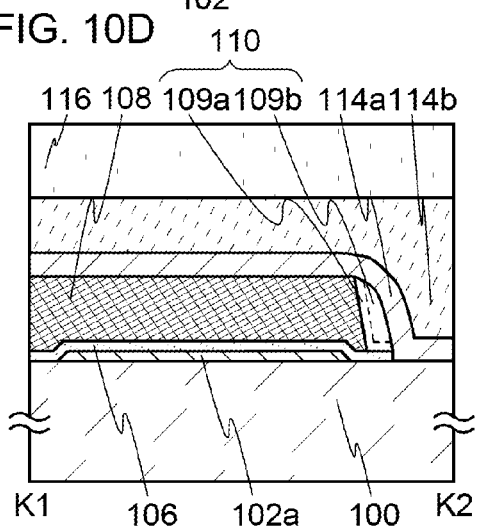

FIGS. 10A to 10D show an example of a plan view and cross-sectional views of a semiconductor device including an element formation layer 1070 including a top-gate transistor 1050 and a capacitor 1060. FIG. 10A is a plan view, FIG. 10B is a cross-sectional view taken along a dashed-dotted line I1-I2 in FIG. 10A, FIG. 10C is a cross-sectional view taken along a dashed-dotted line J1-J2 in FIG. 10A, and FIG. 10D is a cross-sectional view taken along a dashed-dotted line K1-K2 in FIG. 10A. In FIG. 10A, part of components is omitted to avoid complexity of the drawing.

The element formation layer 1070 in FIGS. 10A to 10D includes the transistor 1050 and the capacitor 1060. The transistor 1050 has a structure which includes: an oxide semiconductor film 102 provided over a substrate 100 having an insulating surface and including a first region 102a which functions as a channel formation region and second regions 102b sandwiching the first region 102a in the channel length direction; a pair of first electrode films 104 covering an end portion of the oxide semiconductor film 102 and electrically connected to the second regions 102b; a gate insulating film 106 provided over at least the first region 102a; a gate electrode 108 provided over the first region 102a with the gate insulating film 106 provided therebetween; a second insulating film 110 provided on at least a side surface of the gate electrode 108; and a pair of second electrode films 112 sandwiching the gate electrode 108, which is electrically connected to the first electrode film 104 and the second regions 102b. Further, the capacitor 160 includes a lower electrode film 130, an upper electrode film 134, and an inter-electrode insulating film 132 which is sandwiched between the lower electrode film 130 and the upper electrode film 134. Further, a third insulating film 114 is provided over the transistor 1050 and the capacitor 1060, so that the element formation layer 1070 is formed. As illustrated in FIG. 10B, by providing a fourth insulating film 116 having high surface planarity over the element formation layer 1070, it becomes easy to form a wiring (for example, formation of a leading wiring or the like electrically connected to the transistor 1050 or the capacitor 1060) over the element formation layer 1070.

Note that in this embodiment, the components of the transistor 1050 and the capacitor 1060, and the third insulating film 114 are collectively referred to as the element formation layer 1070, because the third insulating film 114 is formed at the same level (in the same layer) as the transistor 1050 and the capacitor 1060. However, it is not necessary to include the third insulating film 114 in the element formation layer 1070; a structure consisting of the components of the transistor 1050 and the capacitor 1060 can be referred to as the element formation layer 1070.

The components of a semiconductor device described in this embodiment are the same as those in the above-described embodiments; however, a method for forming the second electrode film 112 in this embodiment is different from that in the above-described embodiments.

<Method for Manufacturing Semiconductor Device>

An example of a manufacturing process of the semiconductor device in FIG. 10A to 10D is described with reference to FIGS. 11A to 11D.

Figure 11A:
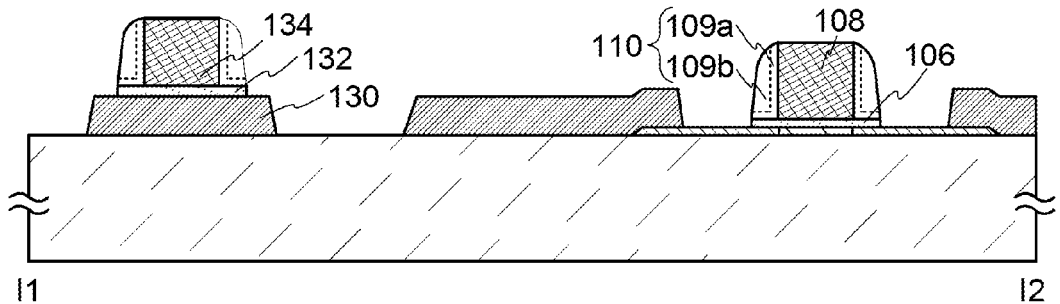
FIGS. 11A to 11D illustrate a method for manufacturing the semiconductor device described in Embodiment 3.

First, as in Embodiment 2, in the manner indicated by FIGS. 2A to 2C-1 (may be FIGS. 2A to 2C-2) and the description corresponding to the drawings, in the manner indicated by FIGS. 3A to 3C and the description corresponding to the drawings, and in the manner indicated by FIGS. 9A to 9D and the description corresponding to the drawing, the oxide semiconductor film 102 including the first region 102a which functions as a channel formation region and the second regions 102b sandwiching the first region 102a in the channel length direction, the lower electrode film 130 and the first electrode film 104 covering an end portion of the oxide semiconductor film 102 and electrically connected to the second region 102b which are formed by the same step; the inter-electrode insulating film 132 and the gate insulating film 106 provided over at least the first region 102a which are formed by the same step; the upper electrode film 134 and the gate electrode 108 provided over the first region 102a with the gate insulating film 106 provided therebetween which are formed by the same step; and the second insulating film 110 provided on the side surfaces of the gate electrode 108 and the upper electrode film 134 are formed over the substrate 100 having an insulating surface (see FIG. 11A).

Figure 11B:
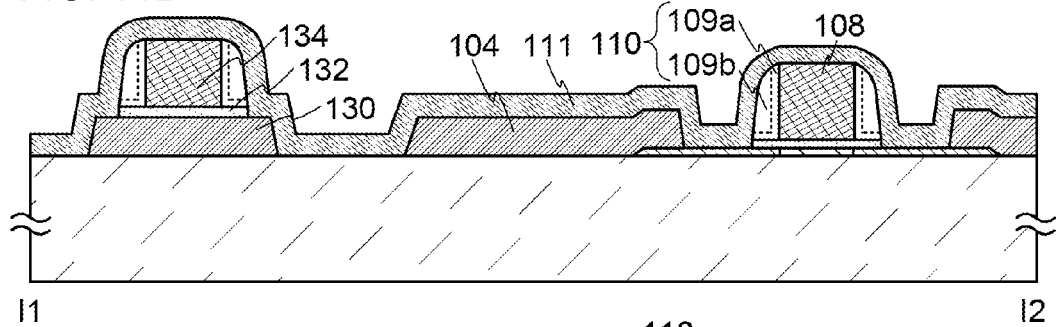
Figure 11C:
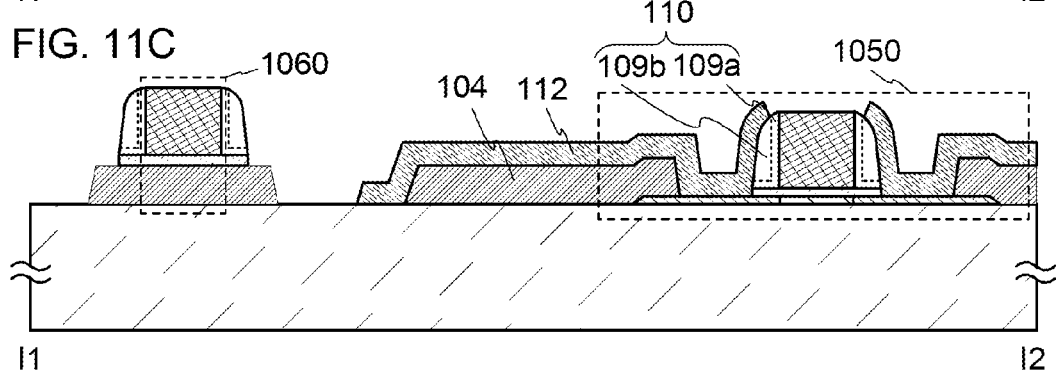

Next, the conductive film 111 covering the substrate 100 having an insulating surface, the oxide semiconductor film 102, the first electrode film 104, the lower electrode film 130, the gate electrode 108, the upper electrode film 134, and the second insulating film 110 is formed (see FIG. 11B).

Next, after a resist mask is formed over the conductive film, an opening is formed in part of the resist mask with electron beam drawing equipment and part of the conductive film 111 is selectively etched, so that the conductive film 111 overlapping with at least the gate electrode 108 is removed. As a result, the conductive film 111 is divided with the gate electrode 108 provided therebetween and each of the divided portions becomes the second electrode film 112, which is electrically connected to the first electrode film 104 and the second region 102b between the first electrode film 104 and the first region 102a (see FIG. 11C). Note that in this embodiment, the second electrode film 112 is not connected to the lower electrode film 130 of the capacitor 1060; however, when the transistor 1050 needs to be electrically connected to the capacitor 1060, the second electrode film 112 may be connected to the lower electrode film 130. At this time, it is necessary to avoid the connection of the lower electrode film 130 and the upper electrode film 134 through the second electrode film 112.

For the light source of the electron beam drawing equipment, ultraviolet light, KrF laser light, or ArF laser light is preferably used. Thus, the channel length of the transistor 1050 can be reduced (specifically, to less than or equal to 100 nm, preferably less than or equal to 60 nm, more preferably less than or equal to 30 nm); therefore, the operation speed of the transistor 1050 can be increased. When light exposure is performed for a channel length smaller than 25 nm, the light exposure for forming the resist mask in the photolithography process is preferably performed using extreme ultraviolet light having an extremely short wavelength of several nanometers to several tens of nanometers, for example. In the light exposure by extreme ultraviolet light, the resolution is high and the focus depth is large.

Next, the third insulating film 114 is formed over the substrate 100 having an insulating surface, the first electrode film 104, the lower electrode film 130, the gate electrode 108, the upper electrode film 134, the second insulating film 110, and the second electrode film 112. The above-described embodiments can be referred to for a forming method and a material of the third insulating film 114. Note that after the third insulating film 114 is formed, removal treatment may be performed on the third insulating film 114.

Figure 11D:
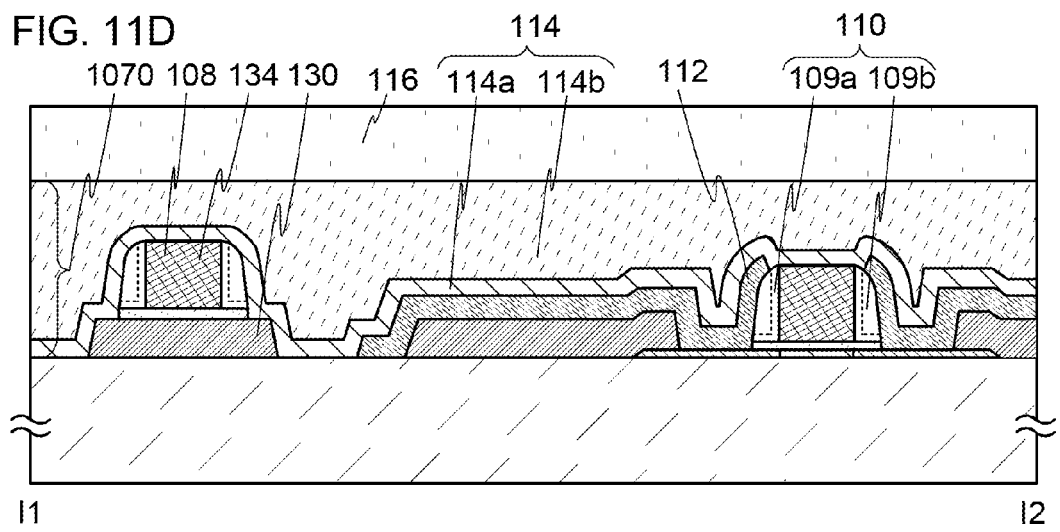

Through the above process, the element formation layer 1070 including the transistor 1050 and the capacitor 1060 can be formed (see FIG. 11D). Further, as in Embodiment 1, the fourth insulating film 116 having high surface flatness and the wiring 118 electrically connected to semiconductor elements in the element formation layer 1070 (in this embodiment, the transistor 1050 and the capacitor 1060) may be formed over the element formation layer 1070.

Embodiment 4

In this embodiment, one embodiment of a structure and a manufacturing method of a semiconductor device whose structure is different from that described in the above-described embodiments will be described with reference to FIGS. 12A to 12D and FIGS. 13A to 13D.

<Example of Structure of Semiconductor Device>

Figure 12A:
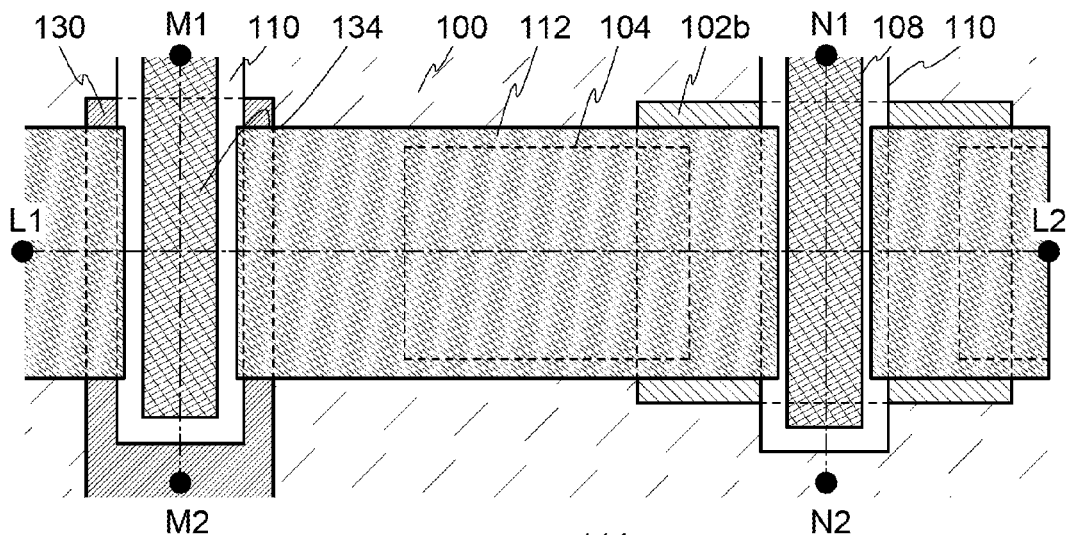
FIGS. 12A to 12D illustrate a structure of a semiconductor device described in Embodiment 4.
Figure 12B:
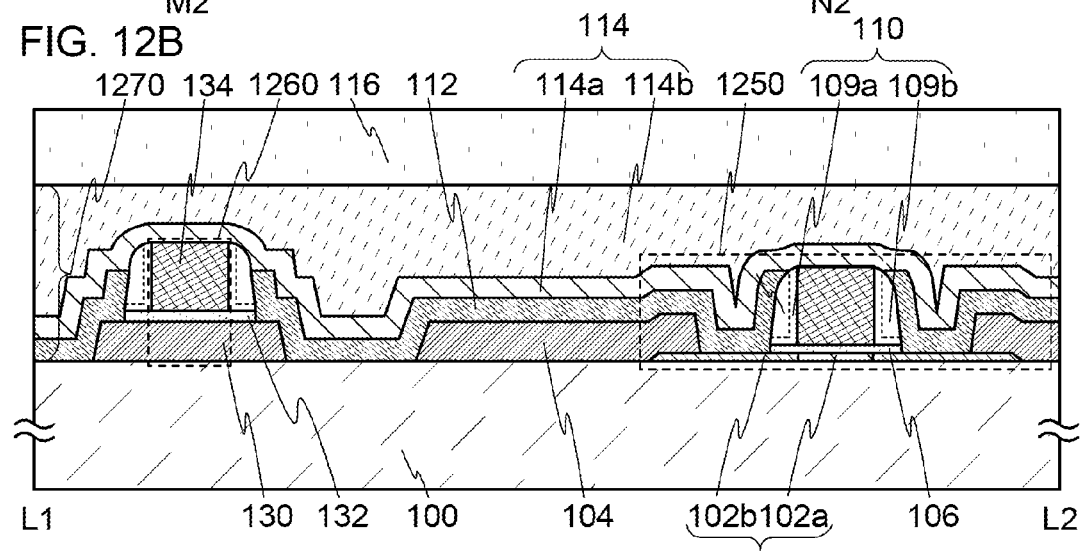
Figure 12C:
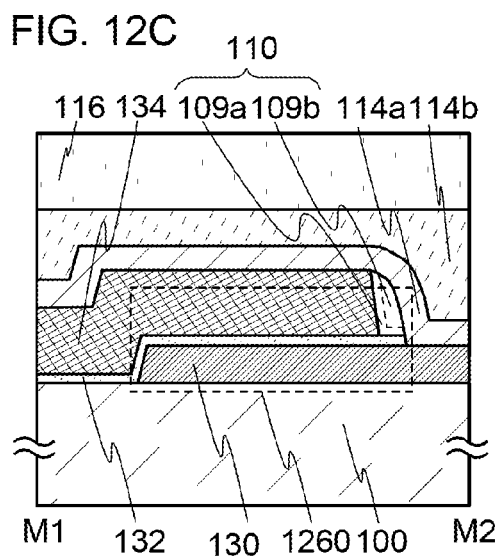
Figure 12D:
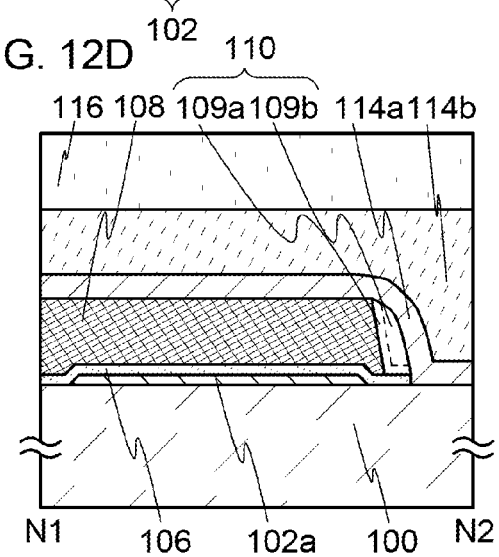

FIGS. 12A to 12D show an example of a plan view and cross-sectional views of a semiconductor device including an element formation layer 1270 including a top-gate transistor 1250 and a capacitor 1260. FIG. 12A is a plan view, FIG. 12B is a cross-sectional view taken along a dashed-dotted line L1-L2 in FIG. 12A, FIG. 12C is a cross-sectional view taken along a dashed-dotted line M1-M2 in FIG. 12A, and FIG. 12D is a cross-sectional view taken along a dashed-dotted line N1-N2 in FIG. 12A. In FIG. 12A, part of components is omitted to avoid complexity of the drawing.

The element formation layer 1270 in FIGS. 12A to 12D includes the transistor 1250 and the capacitor 1260. The transistor 1250 has a structure which includes: an oxide semiconductor film 102 provided over a substrate 100 having an insulating surface and including a first region 102a which functions as a channel formation region and second regions 102b sandwiching the first region 102a in the channel length direction; a pair of first electrode films 104 covering an end portion of the oxide semiconductor film 102 and electrically connected to the second regions 102b; a gate insulating film 106 provided over at least the first region 102a; a gate electrode 108 provided over the first region 102a with the gate insulating film 106 provided therebetween; a second insulating film 110 provided on at least a side surface of the gate electrode 108; and a pair of second electrode films 112 sandwiching the gate electrode 108, which is electrically connected to the first electrode film 104 and the second regions 102b. Further, the capacitor 1260 includes a lower electrode film 130, an upper electrode film 134, and an inter-electrode insulating film 132 which is sandwiched between the lower electrode film 130 and the upper electrode film 134. Further, a third insulating film 114 is provided over the transistor 1250 and the capacitor 1260, so that the element formation layer 1270 is formed. As illustrated in FIG. 12B, by providing a fourth insulating film 116 having high surface planarity over the element formation layer 1270, it becomes easy to form a wiring (for example, formation of a leading wiring or the like electrically connected to the transistor 1250 or the capacitor 1260) over the element formation layer 1270.

Note that in this embodiment, the components of the transistor 1250 and the capacitor 1260, and the third insulating film 114 are collectively referred to as the element formation layer 1270, because the third insulating film 114 is formed at the same level (in the same layer) as the transistor 1250 and the capacitor 1260. However, it is not necessary to include the third insulating film 114 in the element formation layer 1270; a structure consisting of the components of the transistor 1250 and the capacitor 1260 can be referred to as the element formation layer 1270.

The components of a semiconductor device described in this embodiment are the same as those of the semiconductor device in the above-described embodiments; however, a method for forming the second electrode film 112 is different from that in the above-described embodiments. In the manufacturing methods described in Embodiment 1 and Embodiment 2, removal treatment is performed at least once between the formation of the gate electrode 108 and the formation of the second electrode film 112; therefore, the cost and time spent on the removal treatment are reflected in the manufacturing cost of the semiconductor device. Further, in the manufacturing method in Embodiment 3, the second electrode film 112 is formed by forming the opening of the resist mask with the electron beam drawing equipment and removing part of the conductive film 111 with the mask; therefore, the following problem may be caused. When the mask is misaligned due to the accuracy of a light-exposure machine and misalignment of a photomask, the conductive films 111 are not divided in some transistors and the source electrodes and the drain electrodes conduct each other, so that these transistors do not operate.

In contrast, in the structure of the semiconductor device described in this embodiment, a resist mask is formed over the entire conductive film 111 after the conductive film 111 is formed, and the entire surface of the resist mask is processed (removed) to be thin so as to expose the conductive film 111 overlapping with the gate electrode 108 of the transistor 1250. Then, after removal treatment is performed on the conductive film 111, the rest of the resist mask is removed.

By using the method, it is not necessary to irradiate only a certain portion with light of a light-exposure machine; thus, the high accuracy of the light-exposure machine is not needed. Further, a photomask is not needed; thus, misalignment does not occur in principle. Therefore, the cost and manufacturing time of the semiconductor device can be reduced, and a decrease in manufacturing yield of the semiconductor device can be suppressed.

<Method for Manufacturing Semiconductor Device>

An example of a manufacturing process of the semiconductor device illustrated in FIGS. 12A to 12D is explained with reference to FIGS. 13A to 13D.

Figure 13A:
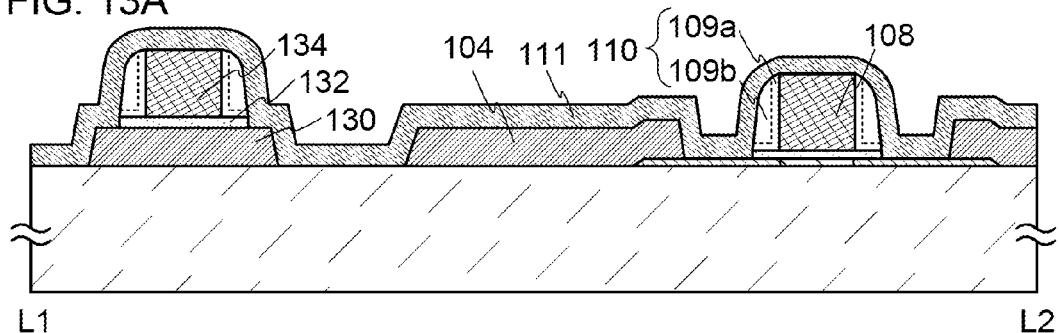
FIGS. 13A to 13D illustrate a method for manufacturing the semiconductor device described in Embodiment 4.

First, in the manner indicated by FIGS. 2A to 2C-1 (may be FIGS. 2A to 2C-2) and the description corresponding to the drawings, in the manner indicated by FIGS. 3A to 3C and the description corresponding to the drawings, and in the manner indicated by FIGS. 11A and 11B and the description corresponding to the drawings, the oxide semiconductor film 102 including the first region 102*a* which functions as a channel formation region and the second regions 102*b* sandwiching the first region 102*a* in the channel length direction; the lower electrode film 130 and the first electrode film 104 covering an end portion of the oxide semiconductor film 102 and electrically connected to the second region 102*b* which are formed by the same step; the inter-electrode insulating film 132 and the gate insulating film 106 provided over at least the first region 102*a* which are formed by the same step; the gate electrode 108 provided over the first region 102*a* with the gate insulating film 106 provided therebetween and the upper electrode film 134 which are formed by the same step; the second insulating film 110 provided on the side surfaces of the gate electrode 108 and the upper electrode film 134; and the conductive film 111 covering the substrate 100 having an insulating surface, the oxide semiconductor film 102, the first electrode film 104, the lower electrode film 130, the gate electrode 108, the upper electrode film 134, and the second insulating film 110 are formed over the substrate 100 having an insulating surface (see FIG. 13A).

Figure 13B:
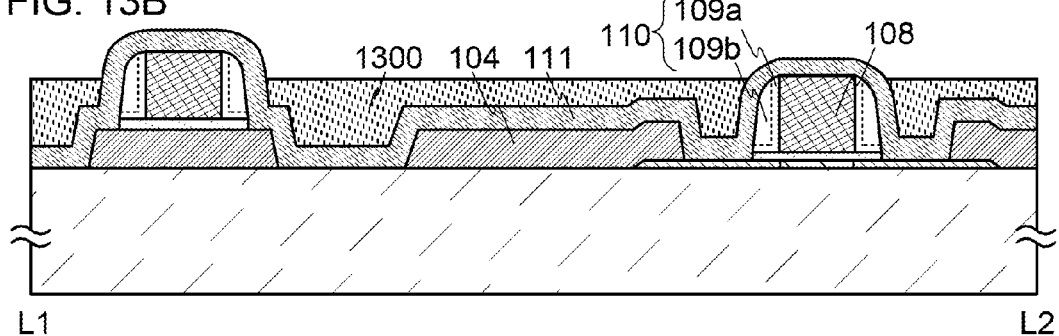

Next, after a photoresist 1300 is formed over the conductive film 111, the photoresist 1300 is removed so as to expose at least the conductive film 111 overlapping with the gate electrode 108 of the transistor 1250 (see FIG. 13B).

Figure 14:
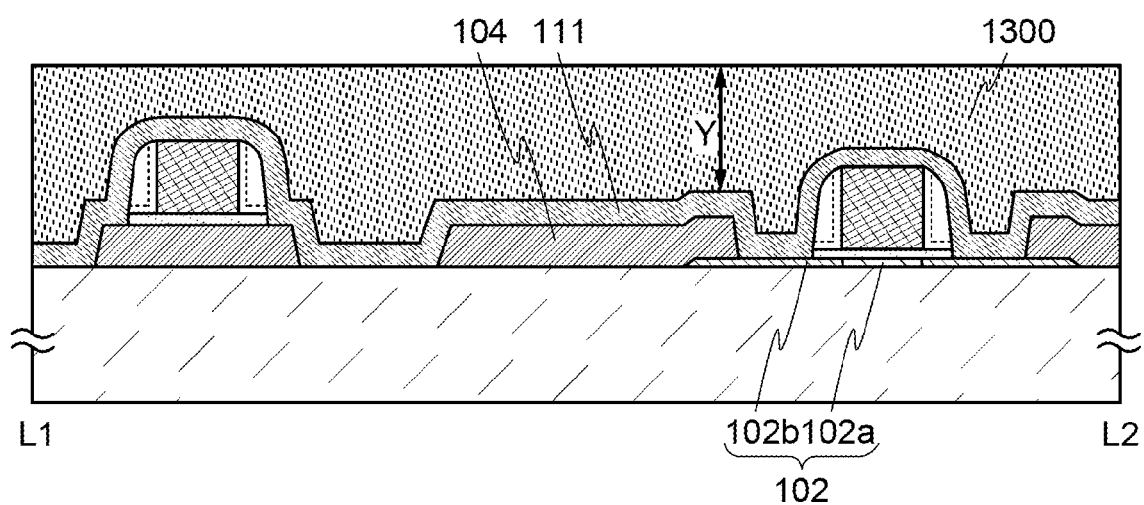
FIG. 14 illustrates a method for manufacturing the semiconductor device described in Embodiment 4.

Note that as a method for removing the photoresist, for example, a dry etching method can be used. Further, the photoresist is irradiated with light so that only a region at a predetermined depth (specifically, a region shallower than the surface of the conductive film 111 (near the surface of the photoresist) in a region where the oxide semiconductor film 102, the first electrode film 104, and the conductive film 111 are overlapped, which corresponds to a portion indicated by an arrow Y in FIG. 14, is preferable) from the surface of the photoresist is modified, and after that, the modified photoresist is selectively removed by a dry etching method or a wet etching method.

Figure 13C:
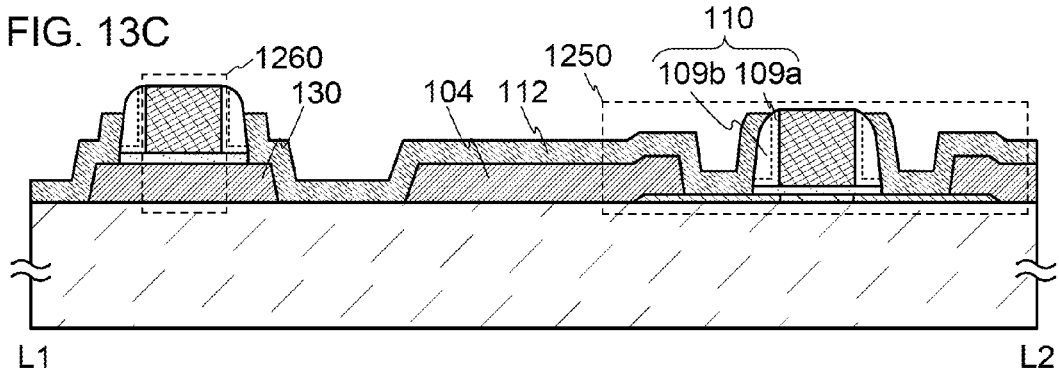
Figure 13D:
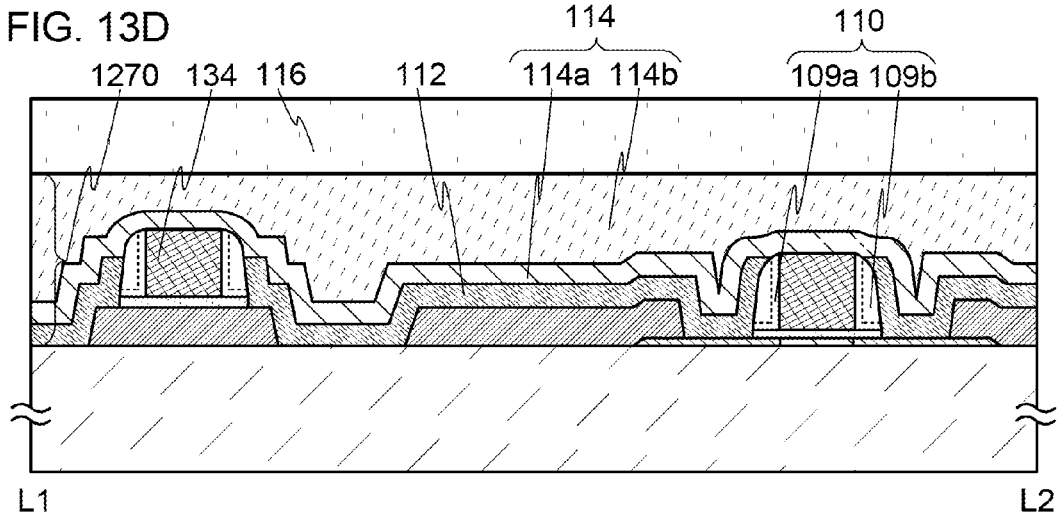

Next, the conductive film 111 exposed from the photoresist 1300 is removed by a dry etching method or a wet etching method, and a pair of second electrode films 112 sandwiching the gate electrode 108, which is electrically connected to the first electrode film 104 and the second region 102*b* between the first electrode film 104 and the first region 102*a* is formed (see FIG. 13C). Note that in this embodiment, the second electrode film 112 is electrically connected to the lower electrode film 130 of the capacitor 1260; however, in the case where both of them do not need to be connected, the second electrode film 112 and the lower electrode film 130 of the capacitor 1260 are separated in the removal of the conductive film 111.

Next, the third insulating film 114 is formed over the gate electrode 108, the upper electrode film 134, the second insulating film 110, and the second electrode film 112. The above-described embodiments can be referred to for a forming method and a material of the third insulating film 114. Note that after the third insulating film 114 is formed, removal treatment may be performed on the third insulating film 114.

Through the above process, the element formation layer 1270 including the transistor 1250 and the capacitor 1260 can be formed. Further, as in Embodiment 1, the fourth insulating film 116 having high surface flatness may be formed over the element formation layer 1270 (see FIG. 13D). Furthermore, the wiring 118 electrically connected to semiconductor elements in the element formation layer 1270 (in this embodiment, the transistor 1250 and the capacitor 1260) may be formed.

Embodiment 5

In this embodiment, an example of a semiconductor device which includes the semiconductor device described in any of Embodiments 1 to 4, which can hold stored data even during a period in which power is not supplied, and which does not have a limitation on the number of writing cycles, is described with reference to drawings.

Figure 15A:
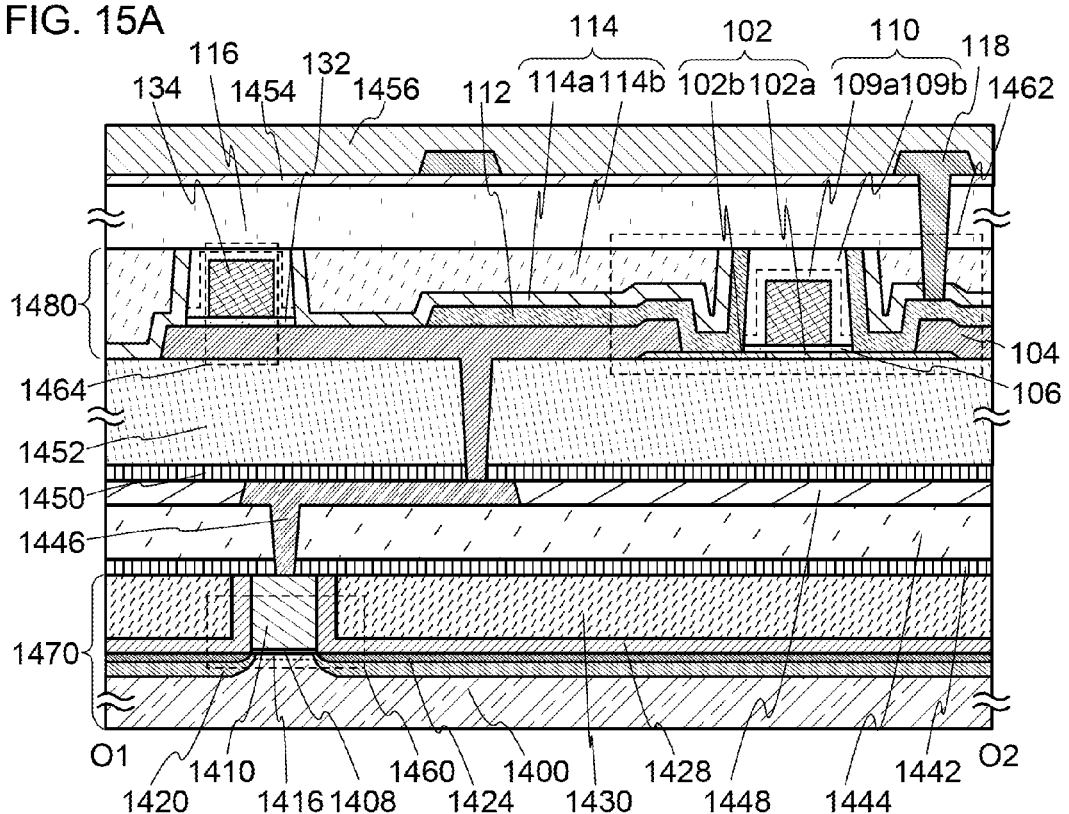
FIGS. 15A to 15C illustrate an example of a structure of a semiconductor device.
Figure 15B:
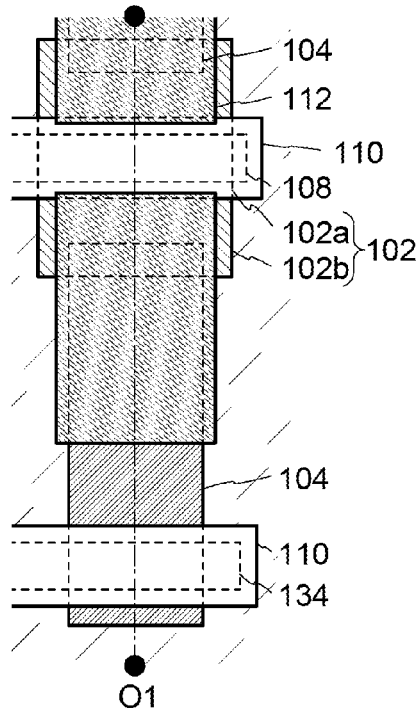
Figure 15C:
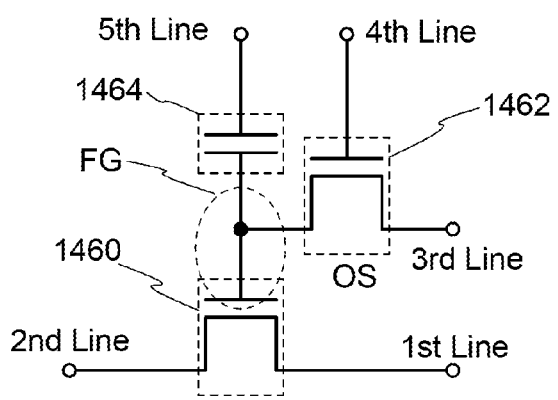

FIGS. 15A to 15C illustrate an example of a structure of a semiconductor device. FIGS. 15A to 15C illustrate a cross-sectional view, a plan view, and a circuit diagram, respectively, of the semiconductor device. Here, FIG. 15A corresponds to a cross section taken along line O1-O2 in FIG. 15B.

A semiconductor device illustrated in FIGS. 15A and 15B includes a second element formation layer 1470 including a transistor 1460 having a second semiconductor material in a lower layer and a first element formation layer 1480 including a transistor 1462 having a first semiconductor material and a capacitor 1464 manufactured through the same process as the transistor 1462 in an upper layer. In this embodiment, the transistor 150 and the capacitor 160 in Embodiment 1 are used as the transistor 1462 and the capacitor 1464 included in the first element formation layer 1480, respectively; however, the structures of the transistor and the capacitor described in any of the other embodiments may be used.

Here, the first semiconductor material and the second semiconductor material are preferably materials having different band gaps. For example, the second semiconductor material is a semiconductor material other than an oxide semiconductor (for example, a silicon-based semiconductor material and a compound-based semiconductor material), and the first semiconductor material is an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can also be used. The specific constituent of the semiconductor device is not necessarily limited to those described here such as the material used for the semiconductor device and the structure of the semiconductor device.

The transistor 1460 included in the second element formation layer 1470 includes, as illustrated in FIG. 15A, a channel formation region 1416 provided in a substrate 1400 containing a semiconductor material other than an oxide semiconductor (for example, silicon, germanium, or a compound semiconductor material such as GaAs, InP, SiC, ZnSe, GaN, and SiGe, can be used), impurity regions 1420 sandwiching the channel formation region 1416 is provided, intermetallic compound regions 1424 in contact with the impurity regions 1420, a gate insulating film 1408 provided over the channel formation region 1416, and a gate electrode 1410 provided over the gate insulating film 1408. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the "source electrode" may include a source region.

An insulating layer 1428 and an insulating layer 1430 are provided to cover the transistor 1460 over the substrate 1400. Note that in the transistor 1460, sidewall insulating layers may be formed on a side surface of the gate electrode 1410, and the impurity regions 1420 may include regions having different impurity concentrations.

The transistor 1460 including a single crystal semiconductor substrate can operate at high speed. Thus, when the transistor is used as a reading transistor, data can be read at a high speed. Two insulating films are formed so as to cover the transistor 1460. As pretreatment for forming the transistor 1462 and a capacitor 1464 over the insulating layer 1428 and the insulating layer 1430, the insulating layer 1428 and the insulating layer 1430 are subjected to removal treatment, so that the insulating layer 1428 and the insulating layer 1430 are planarized and the top surface of the gate electrode 1410 is exposed. Note that the removal treatment described here is similar to the removal treatment described in the above-described embodiments.

As the insulating layer 1428 and the insulating layer 1430, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be typically used. The insulating layer 1428 and the insulating layer 1430 can be formed by a plasma CVD method, a sputtering method, or the like.

Alternatively, an organic material such as a polyimide resin, an acrylic resin, or a benzocyclobutene resin can be used. Besides such organic materials, a low-dielectric constant material (a low-k material) or the like can be used. In the case of using an organic material, the insulating layer 1428 and the insulating layer 1430 may be formed by a wet method such as a spin coating method or a printing method.

Note that in this embodiment, a silicon nitride film is used as the insulating layer 1428, and a silicon oxide film is used as the insulating layer 1430.

In this embodiment, a first interlayer film 1442 and a second interlayer film 1444 are formed over the insulating layer 1428 and the insulating layer 1430 (also referred to as over the second element formation layer 1470) which are sufficiently planarized (it is preferable that the average surface roughness of each of the insulating layer 1428 and the insulating layer 1430 is less than or equal to 0.15 nm) by polishing treatment (e.g., CMP treatment). The first interlayer film 1442 and the second interlayer film 1444 can be formed using a method and a material similar to those of the insulating film 105.

Further, a wiring 1446 electrically connected to the gate electrode 1410 through an opening formed in the first interlayer film 1442 and the second interlayer film 1444 is provided over the second interlayer film 1444, and a third interlayer film 1448 functioning as a planarization film which planarizes a step caused by the formation of the wiring 1446 is provided. The wiring 1446 can be formed using a method and a material similar to those of the first electrode film 104. Further, the third interlayer film 1448 can be formed using a method and a material similar to those of the fourth insulating film 116.

Further, a fourth interlayer film 1450 having a function of suppressing a transfer of impurities which are likely to affect the characteristics of the transistor between the second element formation layer 1470 in the lower layer and the first element formation layer 1480 in the upper layer is formed over the third interlayer film 1448, and a base film 1452 having a function of supplying oxygen to a semiconductor film (specifically, the first region 102a functioning as a channel formation region) of the transistor 1462 included in the second element formation layer 1470 is formed over the fourth interlayer film 1450. The fourth interlayer film 1450 can be formed using a method and a material similar to those of the barrier film 105b. Further, the base film 1452 can be formed using a method and a material similar to those of the oxygen supply film 105a.

The first element formation layer 1480 is provided over the base film 1452, and the first electrode film 104 functioning as a source electrode (or a drain electrode) of the transistor 1462 and a lower electrode which sandwiches the insulating film of the capacitor 1464 is electrically connected to the wiring 1446 through an opening provided in the fourth interlayer film 1450 and the base film 1452. Further, the transistor 1462 in the first element formation layer 1480 is electrically connected to the wiring 118 provided over a fifth interlayer film 1454 through an opening formed in the fourth insulating film 116 and the fifth interlayer film 1454, and a protective film 1456 is provided over the wiring 118. The fifth interlayer film 1454 and the protective film 1456 may be formed using a method and a material similar to those of the fourth insulating film 116. Note that the structure and components of the first element formation layer 1480 are similar to those of the element formation layer 170 described in Embodiment 1 except for the structure in which the first electrode film 104 is connected to the lower electrode film 130; therefore, the detailed description thereof is omitted.

The transistor 1462 illustrated in FIG. 15A includes an oxide semiconductor material in the channel formation region. Here, the oxide semiconductor film 102 included in the transistor 1462 is preferably highly purified by removing impurities such as moisture and hydrogen as much as possible, as described in the above embodiment. Further, the oxide semiconductor layer in which oxygen vacancies are sufficiently compensated is preferable. The use of such an oxide semiconductor film makes it possible to obtain the transistor 1462 with extremely low off-state current.

Since the off-state current of the transistor 1462 is extremely small, stored data can be held for a long time owing to such a transistor. In other words, power consumption can be sufficiently reduced because a semiconductor memory device in which refresh operation is unnecessary or the frequency of refresh operation is extremely low can be provided.

Further, the fourth insulating film 116 and the fifth interlayer film 1454 each having a single-layer structure or a stacked-layer structure are provided over the first element formation layer 1480. The fifth interlayer film 1454 is preferably formed using a method and a material similar to those of the barrier film 105b. Accordingly, diffusion of impurities from portions over the fifth interlayer film 1454 into the first element formation layer 1480 can be suppressed.

In FIGS. 15A and 15B, the transistor 1460 is provided so as to overlap with at least part of the transistor 1462. The source region or the drain region of the transistor 1460 and the oxide semiconductor film 102 are preferably provided so as to overlap with each other at least partly. Further, the transistor 1462 and the capacitor 1464 are preferably provided to overlap with at least part of the transistor 1460. For example, the first electrode film 104 functioning as a lower electrode film of the capacitor 1464 and the upper electrode film 134 partly overlap with the transistor 1460. With such a planar layout, the area occupied by the semiconductor device can be reduced; thus, higher integration can be achieved.

Note that in this embodiment, the gate electrode 1410 of the transistor 1460 is electrically connected to the first electrode film 104 functioning as the source electrode (or the drain electrode) of the transistor 1462 and the lower electrode film of the capacitor 1464 through the wiring 1446; however, they may be directly connected to each other. Further, in this embodiment, the first to fourth interlayer films 1442 to 1450 and the base film 1452 are provided between the second element formation layer 1470 and the first element formation layer 1480; however, not all films are needed, and a practitioner may select which of the films to form in terms of characteristics, reliability and cost necessary for the semiconductor device.

Next, an example of a circuit configuration corresponding to FIGS. 15A and 15B is illustrated in FIG. 15C.

In FIG. 15C, a first wiring (a 1st line) is electrically connected to the source electrode of the transistor 1460, and a second wiring (a 2nd line) is electrically connected to the drain electrode of the transistor 1460. A third wiring (a 3rd line) is electrically connected to the source electrode (or the drain electrode) of the transistor 1462, and a fourth wiring (a 4th line) is electrically connected to the gate electrode of the transistor 1462. The gate electrode of the transistor 1460 and the drain electrode (or the source electrode) of the transistor 1462 are electrically connected to the other electrode of the capacitor 1464, and a fifth wiring (a 5th line) is electrically connected to the one electrode of the capacitor 1464.

The semiconductor device in FIG. 15C can write, hold, and read data as described below, utilizing a characteristic in which the potential of the gate electrode of the transistor 1460 can be held. Since the transistor 1460 is formed using an oxide semiconductor (OS) as its active layer (also referred to as a channel formation region), which is indicated by "OS" beside the circuit symbol of this transistor. A transistor indicated by "OS" in another drawing of this specification has a meaning which is similar to the transistor described above.

Writing and holding of data are described. First, the potential of the fourth wiring is set to a potential at which the transistor 1462 is turned on, so that the transistor 1462 is turned on. Accordingly, the potential of the third wiring is supplied to the gate electrode of the transistor 1460 and the capacitor 1464. In other words, a predetermined charge is supplied to the gate electrode of the transistor 1460 (writing). Here, charge for supply of a potential level or charge for supply of a different potential level (hereinafter referred to as Low-level charge and High-level charge) is given. After that, the potential of the fourth wiring is set to a potential at which the transistor 1462 is off, so that the transistor 1462 is turned off. Thus, the charge supplied to the gate electrode of the transistor 1460 is held (holding).

Since the off-state current of the transistor 1462 is extremely low, the charge of the gate electrode of the transistor 1460 is held for a long time.

Next, reading of data is described. When an appropriate potential (reading potential) is supplied to the fifth wiring with a predetermined potential (constant potential) supplied to the first wiring, the potential of the second wiring varies depending on the amount of charge held in the gate electrode of the transistor 1460. This is because in general, when the transistor 1460 is an n-channel transistor, an apparent threshold voltage $V_{th\_H}$ in the case where High-level charge is supplied to the gate electrode of the transistor 1460 is lower than an apparent threshold voltage $V_{th\_L}$ in the case where Low-level charge is supplied to the gate electrode of the transistor 1460. Here, the apparent threshold voltage refers to the potential of the fifth wiring which is needed to turn on the transistor 1460. Thus, the potential of the fifth wiring is set to a potential $V_0$ that is between $V_{th\_H}$ and $V_{th\_L}$, whereby charge applied to the gate electrode of the transistor 1460 can be determined. For example, in the case where High-level charge is supplied at the time of writing, when the potential of the fifth wiring is $V_0$ ($>V_{th\_H}$), the transistor 1460 is turned on. In the case where Low-level electric charge is supplied at the time of writing, even when the potential of the fifth wiring is $V_0$ ($<V_{th\_L}$), the transistor 1460 remains in an off state. Therefore, the stored data can be read by measuring the potential of the second wiring.

Note that in the case where memory cells are arrayed to be used, only data of desired memory cells needs to be read. In the case where such reading is not performed, a potential at which the transistor 1460 is turned off regardless of the state of the gate electrode of the transistor 1460, that is, a potential smaller than $V_{th\_H}$ may be supplied to the fifth wiring. Alternatively, a potential at which the transistor 1460 is turned on, that is, a potential higher than $V_{th\_L}$ may be supplied to the fifth wiring regardless of the state of the gate electrode of the transistor 1460.

When a transistor having a channel formation region formed using an oxide semiconductor and having extremely small off-state current is applied to the semiconductor device in this embodiment, the semiconductor device can store data for an extremely long time. In other words, power consumption can be adequately reduced because refresh operation becomes unnecessary or the frequency of refresh operation can be extremely low. Moreover, stored data can be held for a long time even when power is not supplied (note that a potential is preferably fixed).

Further, in the semiconductor device described in this embodiment, a high voltage is not needed for writing data and there is no problem of deterioration of elements. For example, unlike in the case of a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of writing cycles which is a problem in a conventional nonvolatile memory, and reliability thereof is drastically improved. Furthermore, data is written depending on the on state and the off state of the transistor, whereby high-speed operation can be easily achieved.

As described above, a miniaturized and highly-integrated semiconductor device having high electric characteristics and a method for manufacturing the semiconductor device can be provided.

Note that in this embodiment, the transistor 1460 in the second element formation layer 1470 is formed using a substrate including a semiconductor material (e.g., a silicon substrate, a germanium substrate, or a substrate including a compound semiconductor material); however, the transistor 1460 may be formed using a thin film obtained by separation of part of a single crystal semiconductor substrate or a compound semiconductor substrate. A known method for manufacturing an SOI substrate can be referred to for a method for forming a single crystal semiconductor thin film or a compound semiconductor thin film by separation of part of a single crystal semiconductor substrate or a compound semiconductor substrate (e.g., Japanese Published Patent Application No. 2010-109345).

The thickness of the thin film obtained by separation of part of a single crystal semiconductor substrate is preferably less than or equal to 100 nm, more preferably less than or equal to 50 nm. By forming the transistor 1460 using the thin film as an active layer, the transistor 1460 can be a partial depleted or fully depleted transistor; therefore, the transistor 1460 with high speed operation and low power consumption can be achieved.

Figure 16:
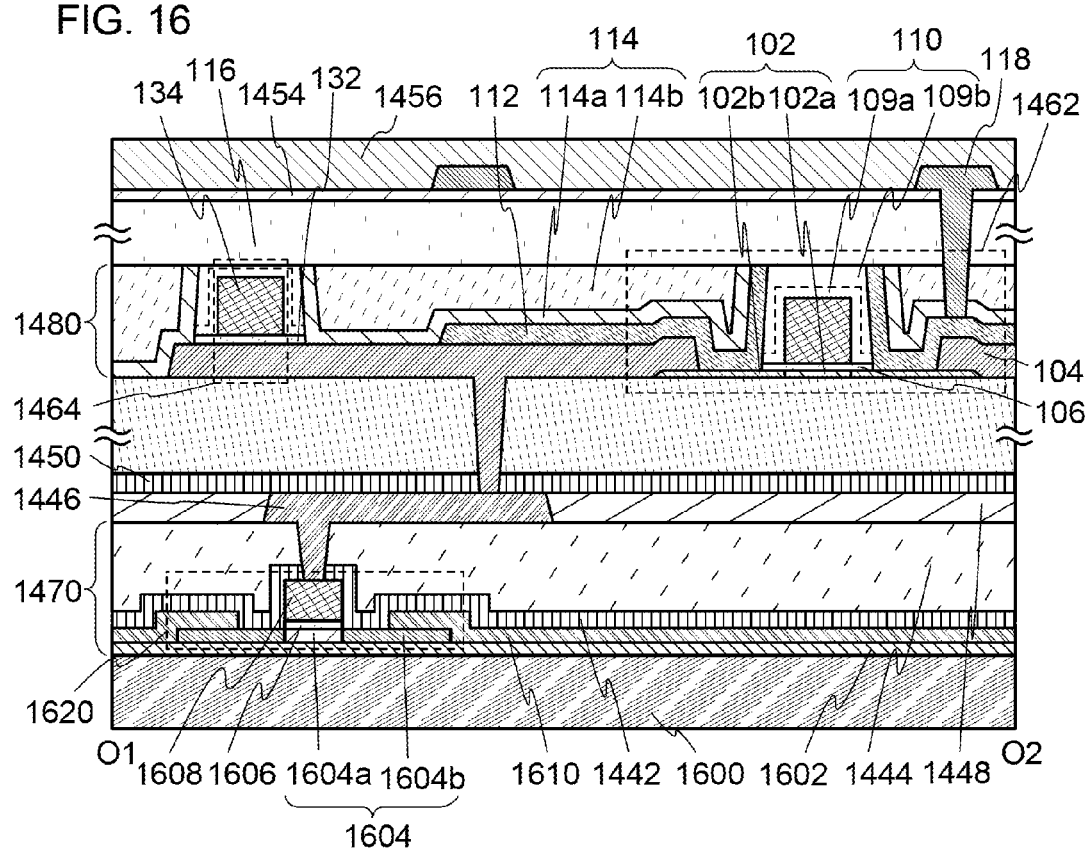
FIG. 16 illustrates an example of a structure of a semiconductor device.

FIG. 16 illustrates an example of the semiconductor device in which the second element formation layer 1470 including the transistor 1620 formed using a single crystal semiconductor thin film is included. A top view and a circuit diagram of the semiconductor device are similar to those in FIGS. 15B and 15C; therefore, FIG. 16 illustrates only a cross-sectional view of the semiconductor device.

The transistor 1620 formed over a substrate 1600 with a base film 1602 provided therebetween includes a single crystal semiconductor film 1604 including a channel formation region 1604*a* and low-resistance regions 1604*b* sandwiching the channel formation region 1604*a* in the channel length direction and functioning as a source region and a drain region; a gate insulating film 1606 provided over at least the channel formation region 1604*a*; a gate electrode 1608 which overlaps with the channel formation region 1604*a* and is provided over the gate insulating film 1606; and a conductive film 1610 which functions as a source electrode and a drain electrode and is electrically connected to the low-resistance regions 1604*b*. Then, the first interlayer film 1442 and the second interlayer film 1444 are provided over the transistor 1620. Further, the transistor 1620 is electrically connected to the transistor 1462 and the capacitor 1464 of the first element formation layer 1480 through the wiring 1446.

The substrate 1600 can be formed using a variety of glass substrates for electronic industry such as aluminosilicate glass, aluminoborosilicate glass, and barium borosilicate glass; a natural quartz substrate; a synthetic quartz substrate; or the like is used. Further, the substrate 1600 can be formed using a substrate made of a Group 14 element, such as a single crystal silicon substrate, a single crystal germanium substrate, and a single crystal silicon germanium substrate. Further, a compound semiconductor substrate made of gallium nitride, gallium arsenide, or indium phosphide can be used. Note that in the case where a miniaturized semiconductor element (e.g., a transistor) is used in the second element formation layer 1470 and the first element formation layer 1480, a single crystal semiconductor substrate with high surface flatness and little deformation by external stress (e.g., heat treatment or application of physical force) is preferably used. Specifically, in the case where either the channel length or channel width of the transistor is less than or equal to 100 nm, the substrate is preferably used. Further, in the case where the number of semiconductor devices manufactured with one substrate is required to be increased, various kinds of glass substrates are preferably used.

The base film 1602 can be formed using a method and a material similar to those of the base film 1452.

The single crystal semiconductor film 1604 can be formed by processing a single crystal semiconductor thin film formed on a surface of an SOI substrate into an island shape. Further, impurities which can reduce the resistance of the single crystal semiconductor film 1604 (e.g., impurities such as phosphorus (P) and arsenic (As) are added for forming an n-type transistor, and impurities such as boron (B), aluminum (Al), and gallium (Ga) are added for forming a p-type transistor) are introduced into the single crystal semiconductor film 1604 using the gate insulating film 1606 and the gate electrode 1608 as a mask, whereby the channel formation region 1604*a* and the low-resistance regions 1604*b* are formed in the single crystal semiconductor film 1604 in a self-aligned manner. Note that the gate insulating film 1606 can be formed using a method and a material similar to those of the insulating film 105, the gate electrode 1608 can be formed using a method and a material similar to those of the gate electrode 108, and the conductive film 1610 can be formed using a method and a material similar to those of the conductive film 111.

The methods and structures described in this embodiment can be combined as appropriate with any of the methods and structures described in the other embodiments.

Embodiment 6

In this embodiment, a semiconductor device which includes the transistor described in any of Embodiments 1 to 4, can hold stored data even when not powered, does not have a limitation on the number of write cycles, and has a structure different from the structure described in Embodiment 5 is described with reference to FIGS. 17A and 17B and FIGS. 18A and 18B.

Figure 17A:
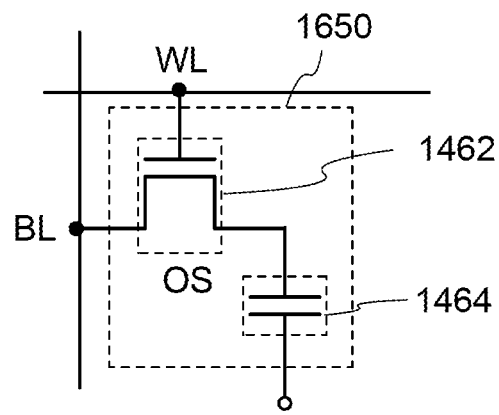
FIGS. 17A and 17B illustrate an example of a structure of a semiconductor device.
Figure 17B:
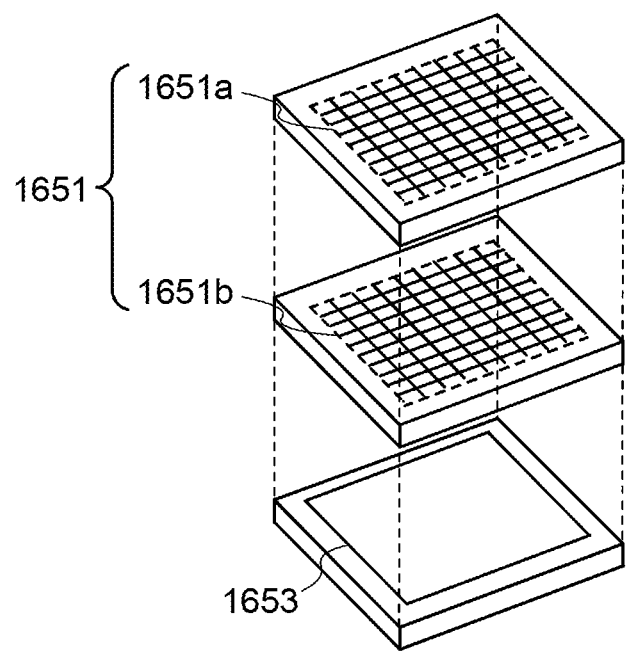

FIG. 17A illustrates an example of a circuit configuration of a semiconductor device, and FIG. 17B is a conceptual diagram illustrating an example of a semiconductor device. First, the semiconductor device illustrated in FIG. 17A is described, and then, the semiconductor device illustrated in FIG. 17B is described.

In the semiconductor device illustrated in FIG. 17A, a bit line BL is electrically connected to a source electrode or a drain electrode of the transistor 1462, a word line WL is electrically connected to a gate electrode of the transistor 1462, and the source electrode or the drain electrode of the transistor 1462 is electrically connected to a first terminal of the capacitor 1464.

Next, writing and holding of data in the semiconductor device (a memory cell 1650) illustrated in FIG. 17A are described.

First, the potential of the word line WL is set to a potential at which the transistor 1462 is turned on, so that the transistor 1462 is turned on. Accordingly, the potential of the bit line BL is supplied to the first terminal of the capacitor 1464 (writing). After that, the potential of the word line WL is set to a potential at which the transistor 1462 is turned off, so that the transistor 1462 is turned off. Thus, the potential at the first terminal of the capacitor 1464 is held (holding).

Off-state current is extremely small in the transistor 1462 which uses an oxide semiconductor. For that reason, a potential of the first terminal of the capacitor 1464 (or a charge accumulated in the capacitor 1464) can be held for an extremely long time by turning off the transistor 1462.

Secondly, reading of data is described. When the transistor 1462 is turned on, the bit line BL which is in a floating state and the capacitor 1464 are electrically connected to each other, and the charge is redistributed between the bit line BL and the capacitor 1464. As a result, the potential of the bit line BL is changed. The amount of a change in potential of the bit line BL varies depending on the potential of the first terminal of the capacitor 1464 (or the charge accumulated in the capacitor 1464).

For example, the potential of the bit line BL after charge redistribution is $(C_B \times V_{B0} + C + V)/(C_B + C)$, where V is the potential of the first terminal of the capacitor 1464, C is the capacitance of the capacitor 1464, $C_B$ is the capacitance of the bit line BL (hereinafter also referred to as a bit line capacitance), and $V_{B0}$ is the potential of the bit line BL before the charge redistribution. Therefore, it can be found that assuming that the memory cell 1650 is in either of two states in which the potentials of the first terminal of the capacitor 1464 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of retaining the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 17A can hold charge that is accumulated in the capacitor 1464 for a long time because the off-state current of the transistor 1462 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 17B is described.

The semiconductor device illustrated in FIG. 17B includes a memory cell arrays 1651a and 1651b each including a plurality of memory cells 1650 illustrated in FIG. 17A as memory circuits in the upper portion, and a peripheral circuit 1653 in the lower portion which is necessary for operating memory cell arrays 1651 (the memory cell arrays 1651a and 1651b). Note that the peripheral circuit 1653 is electrically connected to the memory cell arrays 1651. With such a circuit structure, the semiconductor device can be reduced in size.

It is preferable that a semiconductor material of the transistor provided in the peripheral circuit 1653 is different from that of the transistor 1462 in Embodiment 4. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably obtained by the transistor.

Note that FIG. 17B illustrates, as an example, the semiconductor device in which two memory cell arrays 1651 (the memory cell arrays 1651a and 1651b) are stacked; however, the number of memory cell arrays to be stacked is not limited thereto. Three or more memory arrays may be stacked.

Next, a specific structure of the memory cell 1650 illustrated in FIG. 17A is described with reference to FIGS. 18A and 18B.

Figure 18A:
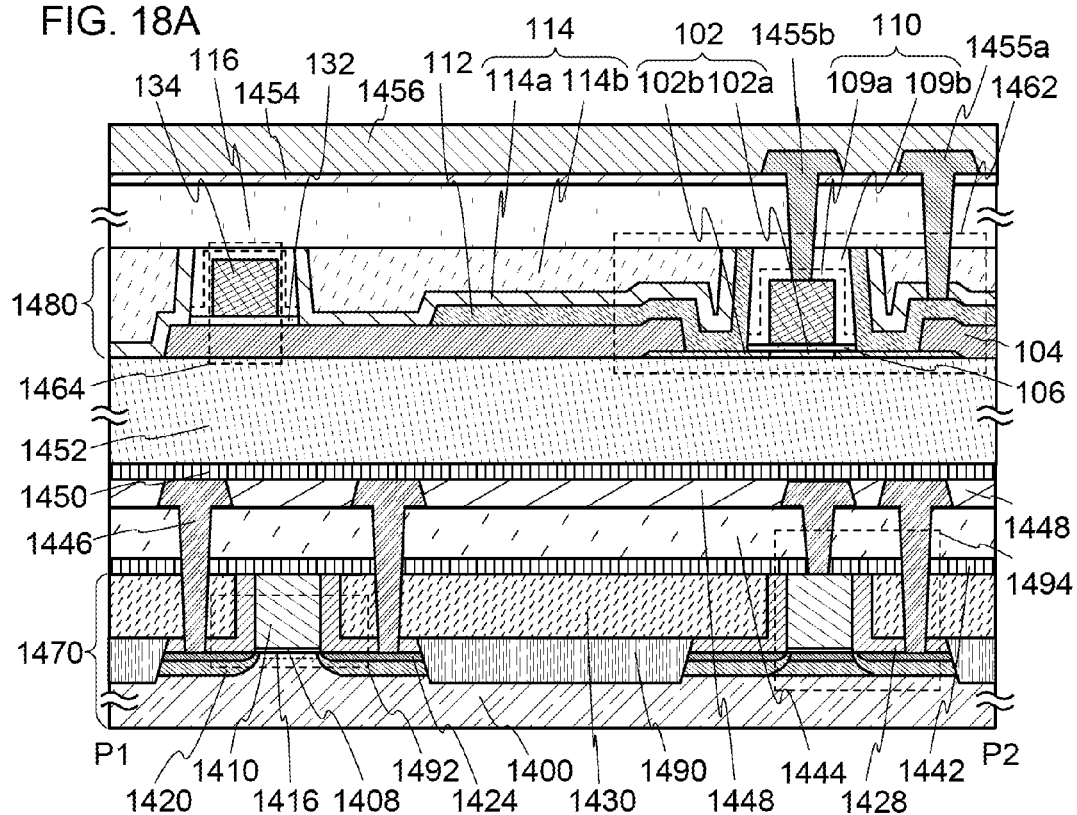
FIGS. 18A and 18B illustrate an example of a structure of a semiconductor device.
Figure 18B:
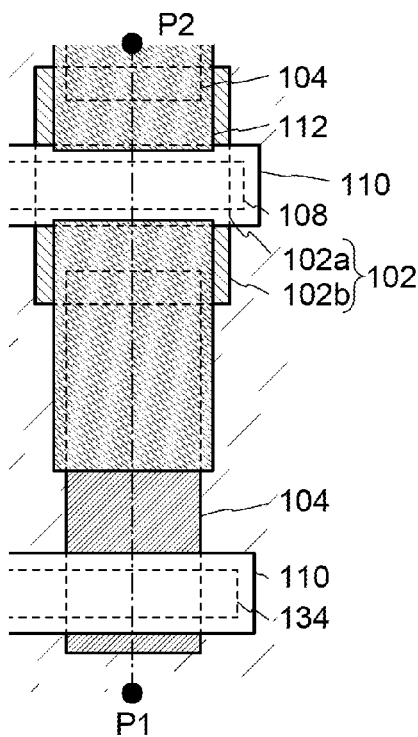

FIGS. 18A and 18B illustrate an example of a structure of the memory cell 1650. FIGS. 18A and 18B are respectively a cross-sectional view and a plan view of the memory cell 1650. Here, FIG. 18A illustrates a cross section taken along line P1-P2 in FIG. 18B.

The transistor 1462 provided over the base film 1452 can have a structure which is similar to any of the structures described in Embodiments 1 to 4.

A semiconductor device illustrated in FIGS. 18A and 18B includes a first element formation layer 1480 including a transistor 1462 having a second semiconductor material and a capacitor 1464 manufactured through the same process as the transistor 1462 in an upper layer. Further, the semiconductor device includes a second element formation layer 1470 including a transistor 1460 having a first semiconductor material in a lower layer. In this embodiment, the transistor 150 and the capacitor 160 in Embodiment 1 are used as the transistor 1462 and the capacitor 1464 included in the first element formation layer 1480, respectively; however, the structures of the transistor and the capacitor described in any of the other embodiments may be used.

The first electrode film 104 functioning as a source electrode (or a drain electrode) of the transistor 1462 functions as the lower electrode film of the capacitor 1464, and the gate electrode 108 of the transistor 1462 is formed using a material and a step which are similar to those of the upper electrode of the capacitor 1464. Further, the gate insulating film 106 of the transistor 1462 is formed using a material and a step which are similar to those of the inter-electrode insulating film 132 of the capacitor 1464. Then, the transistor 1462 and the capacitor 1464 are electrically connected through the first electrode film 104.

The third insulating film 114, the fourth insulating film 116, and the fifth interlayer film 1454 are provided over the transistor 1462 and the capacitor 1464, and a wiring 1455a for connecting the memory cell 1650 to the adjacent memory cell 1650 is provided over the fifth interlayer film 1454 and is in contact with the second electrode film 112 functioning as a source electrode (or a drain electrode) of the transistor 1462. Note that the wiring 1455a corresponds to the bit line BL in the circuit diagram of FIG. 17A. Further, the gate electrode 108 functioning as a gate electrode of the transistor 1462 is electrically connected to the wiring 1455b provided over a fifth interlayer film 1454 through an opening formed in the fourth insulating film 116 and the fifth interlayer film 1454. Note that the wiring 1455b corresponds to the word line WL in the circuit diagram in FIG. 17B.

In FIGS. 18A and 18B, the first electrode film 104 and the second electrode film 112 of the transistor 1462 also function as a source electrode (or a drain electrode) of a transistor included in the adjacent memory cell.

With such a planar layout in FIG. 18A, the area occupied by the semiconductor device can be reduced; thus, higher integration can be achieved.

As described above, a plurality of memory cells formed in the first element formation layer 1480 includes a transistor using an oxide semiconductor. Since the off-state current of the transistor including an oxide semiconductor is small, stored data can be held for a long time owing to such a transistor. In other words, the frequency of refresh operation can be extremely lowered, which leads to a sufficient reduction in power consumption.

Note that, as illustrated in FIG. 18A, a plurality of layers such as the second element formation layer 1470 and the like may be stacked under the first element formation layer 1480 as in Embodiment 5. For example, in FIG. 18A, the second element formation layer 1470 including the transistor 1492 using a single crystal semiconductor substrate as an active layer and the capacitor 1494 having a MOS structure is provided under the first element formation layer 1480. Note that semiconductor elements provided in the first element formation layer are separated by a partition 1490.

Further, as in Embodiment 5, the transistor 1492 and the capacitor 1494 in the second element formation layer 1470 may be formed using a thin film obtained by separation of part of a single crystal semiconductor substrate.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided.

This embodiment can be implemented in appropriate combination with any of the structures described in the other embodiments.

Embodiment 7

In this embodiment, examples of application of the semiconductor device described in any of the above embodiments to portable devices such as mobile phones, smartphones, or e-book readers are described with reference to FIGS. 19A and 19B, FIG. 20, FIG. 21, and FIG. 22.

In portable electronic devices such as a mobile phone, a smartphone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 19A:
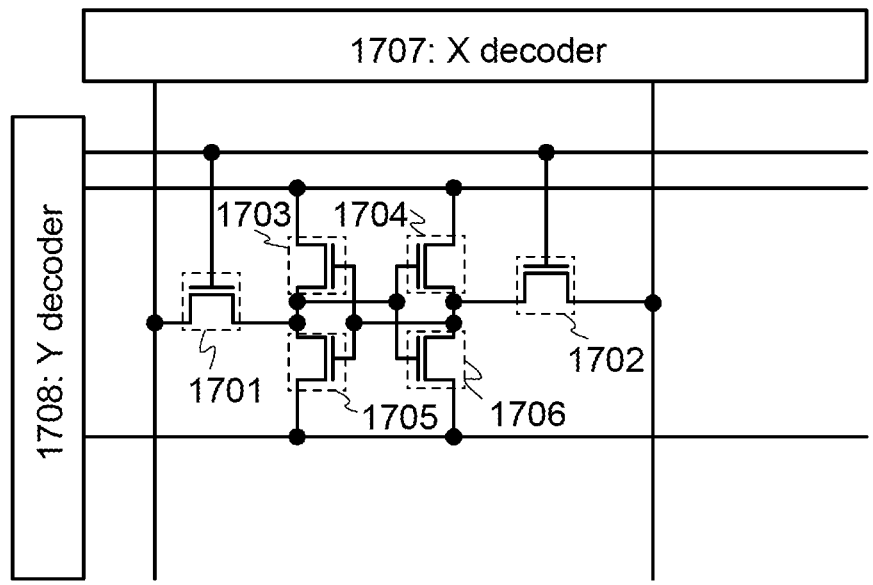
FIGS. 19A and 19B illustrate an example of a structure of a semiconductor device.

In an ordinary SRAM, as illustrated in FIG. 19A, one memory cell includes six transistors, that is, transistors 1701 to 1706, which are driven with an X decoder 1707 and a Y decoder 1708. A pair of the transistors 1703 and 1705 and a pair of the transistors 1704 and 1706 which each form an inverter allow high-speed operation. However, an SRAM has a disadvantage of large cell area because one memory cell includes six transistors. Provided that the minimum feature size of a design rule is F, the area of a memory cell in an SRAM is generally $100\,F^2$ to $150\,F^2$. Therefore, a price per bit of an SRAM is the most expensive among a variety of memory devices.

Figure 19B:
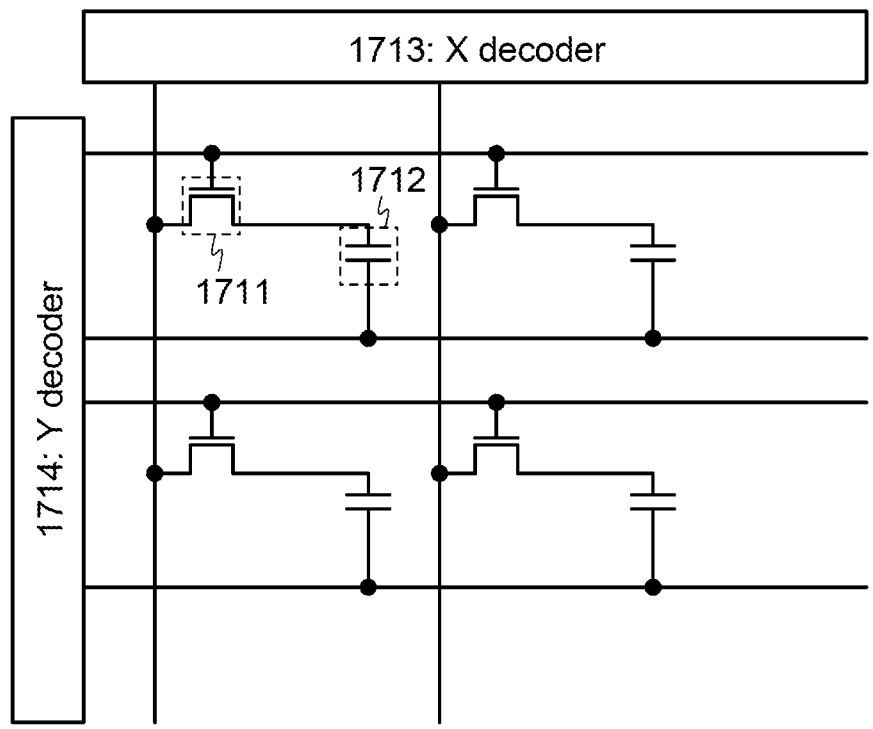

In a DRAM, as illustrated in FIG. 19B, a memory cell includes a transistor 1711 and a storage capacitor 1712, which are driven with an X decoder 1713 and a Y decoder 1714. One cell includes one transistor and one capacitor and thus the area of a memory cell is small. The area of a memory cell of a DRAM is generally less than or equal to $10\,F^2$. Note that in the case of a DRAM, a refresh operation is always necessary and power is consumed even when a rewriting operation is not performed.

However, the area of the memory cell of the semiconductor device described the above embodiments is about $10\,F^2$ and frequent refreshing is not needed. Therefore, the area of the memory cell is reduced, and the power consumption can be reduced.

Figure 20:
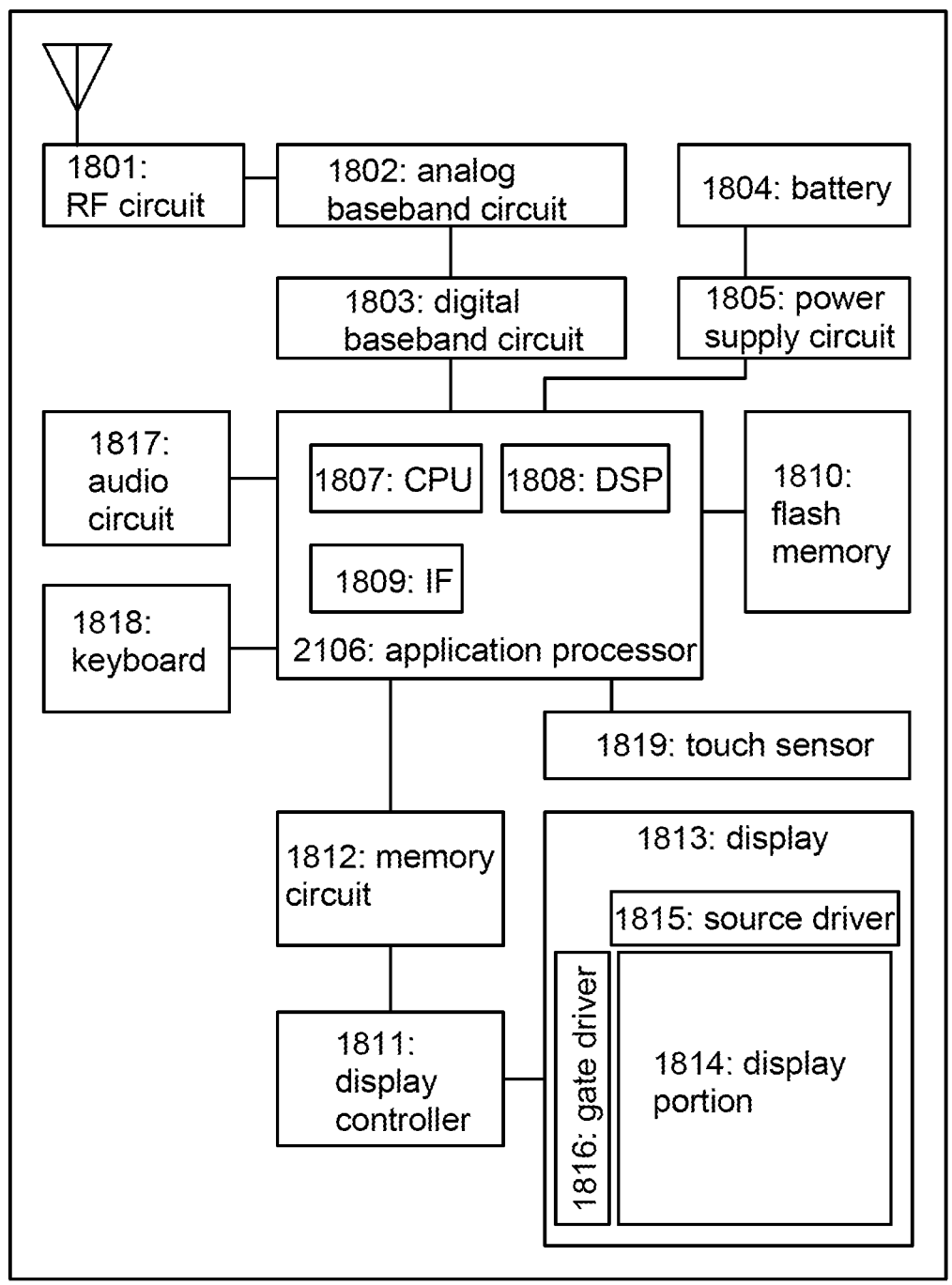
FIG. 20 illustrates an example of a structure of a semiconductor device.

FIG. 20 is a block diagram of a portable device. The portable device illustrated in FIG. 20 includes an RF circuit 1801, an analog baseband circuit 1802, a digital baseband circuit 1803, a battery 1804, a power supply circuit 1805, an application processor 1806, a flash memory 1810, a display controller 1811, a memory circuit 1812, a display 1813, a touch sensor 1819, an audio circuit 1817, a keyboard 1818, and the like. The display 1813 includes a display portion 1814, a source driver 1815, and a gate driver 1816. The application processor 1806 includes a CPU 1807, a DSP 1808, and an interface (IF) 1809. In general, the memory circuit 1812 includes an SRAM or a DRAM; by employing the semiconductor device described in any of the above embodiments for the memory circuit 1812, writing and reading of data can be performed at high speed, data can be held for a long time, and power consumption can be sufficiently reduced.

Figure 21:
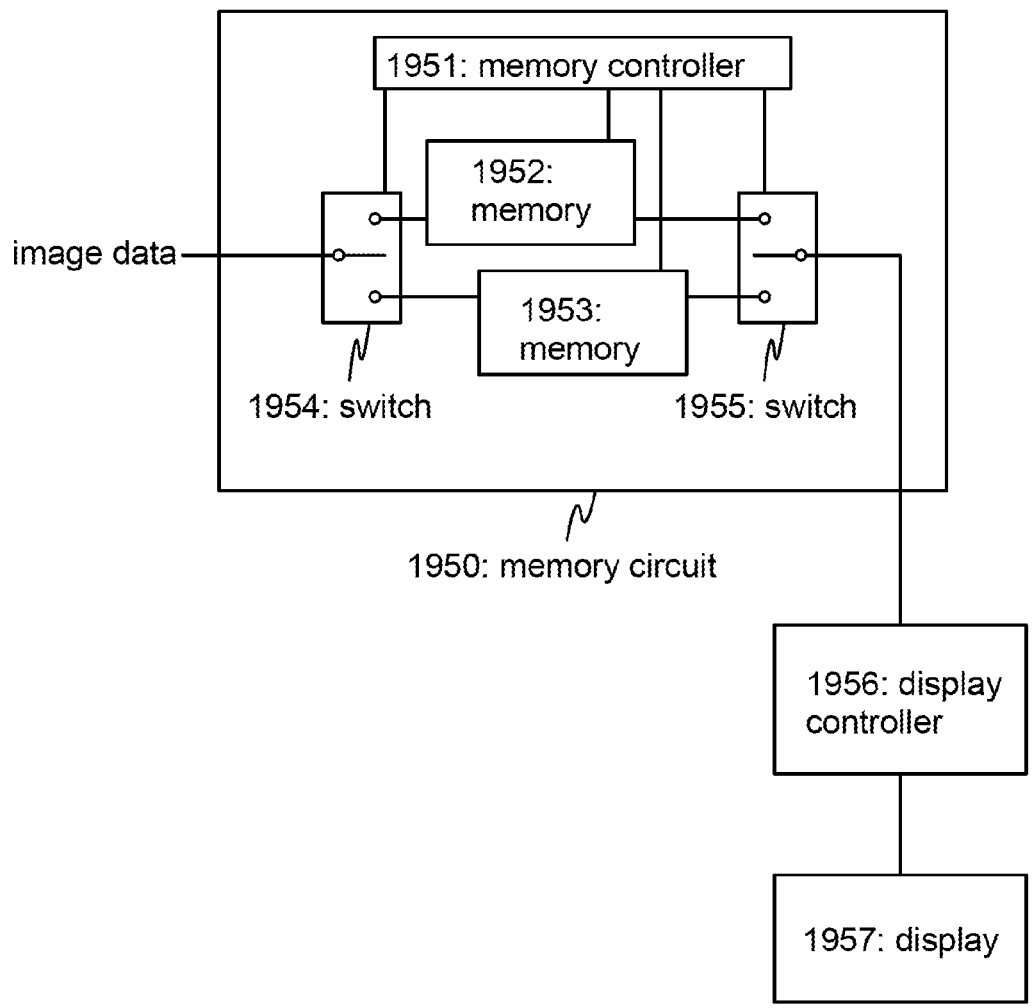
FIG. 21 illustrates an example of a structure of a semiconductor device.

FIG. 21 illustrates an example of using the semiconductor device described in any of the above embodiments in a memory circuit 1950 for a display. The memory circuit 1950 illustrated in FIG. 21 includes a memory 1952, a memory 1953, a switch 1954, a switch 1955, and a memory controller 1951. Further, the memory circuit is connected to a display controller 1956 which reads and controls image data input through a signal line (input image data) and data stored in the memories 1952 and 1953 (stored image data), and is also connected to a display 1957 which displays an image based on a signal input from the display controller 1956.

First, image data (input image data A) is formed by an application processor (not shown). The input image data A is stored in the memory 1952 through the switch 1954. Then, the image data stored in the memory 1952 (stored image data A) is transmitted to the display 1957 through the switch 1955 and the display controller 1956, and is displayed on the display 1957.

When the input image data A remains unchanged, the stored image data A is read from the memory 1952 through the switch 1955 by the display controller 1956 normally at a frequency of approximately 30 Hz to 60 Hz.

Next, for example, when data displayed on the screen is rewritten by a user (that is, in the case where the input image data A is changed), new image data (input image data B) is formed by the application processor. The input image data B is stored in the memory 1953 through the switch 1954. Also during that time, the stored image data A is regularly read from the memory 1952 through the switch 1955. After the completion of storing the new image data (the stored image data B) in the memory 1953, from the next frame for the display 1957, the stored image data B starts to be read, transmitted to the display 1957 through the switch 1955 and the display controller 1956, and displayed on the display 1957. This reading operation is continued until the next new image data is stored in the memory 1952.

By alternately writing and reading image data to and from the memory 1952 and the memory 1953 as described above, images are displayed on the display 1957. Note that the memory 1952 and the memory 1953 are not limited to separate memories, and a single memory may be divided and used. By employing the semiconductor device described in any of the above embodiments for the memory 1952 and the memory 1953, data can be written and read at high speed and held for a long time, and power consumption can be sufficiently reduced.

Figure 22:
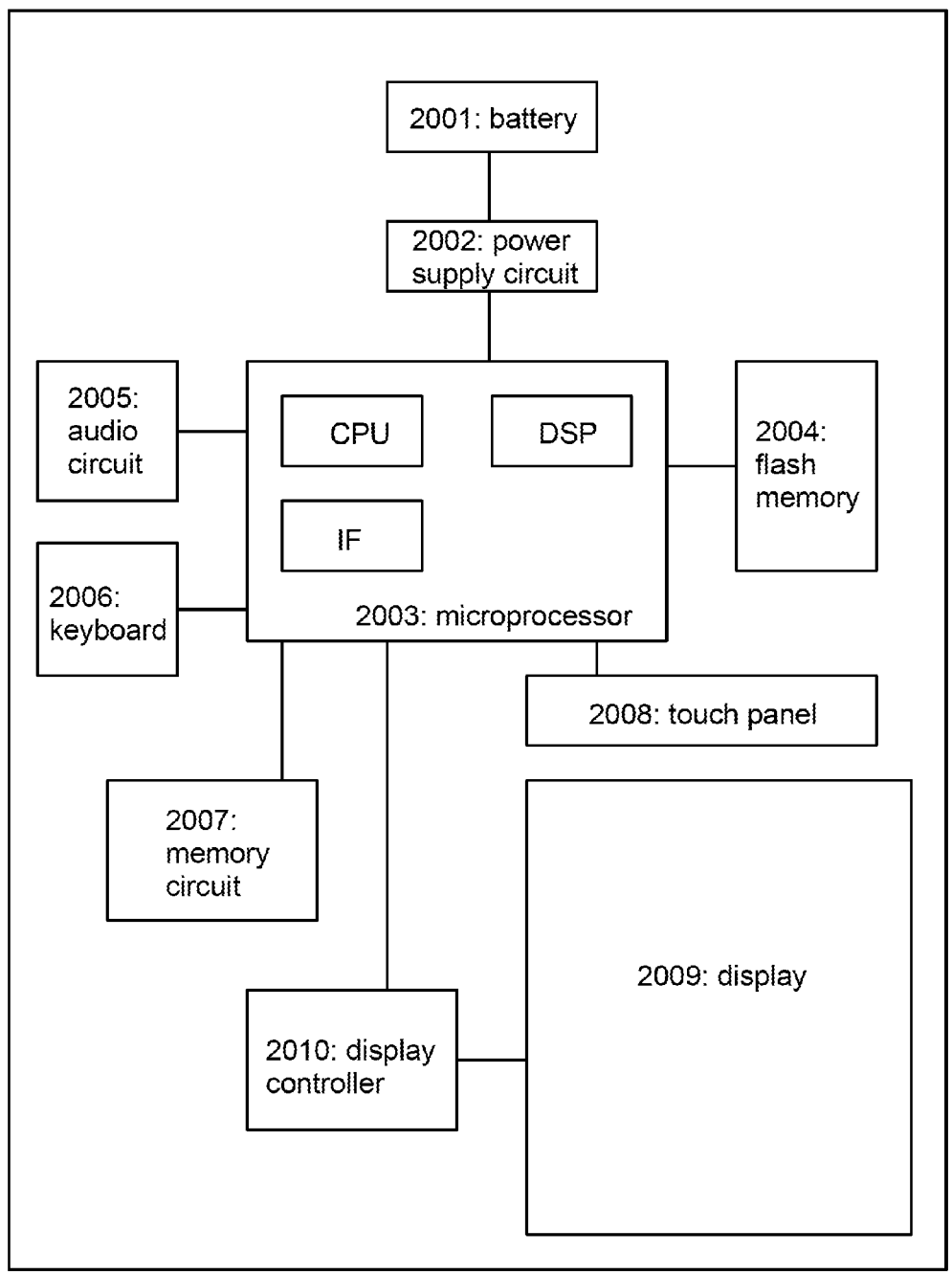
FIG. 22 illustrates an example of a structure of a semiconductor device.

Next, FIG. 22 shows a block diagram of an e-book reader. FIG. 22 includes a battery 2001, a power supply circuit 2002, a microprocessor 2003, a flash memory 2004, an audio circuit 2005, a keyboard 2006, a memory circuit 2007, a touch panel 2008, a display 2009, and a display controller 2010.

Here, the semiconductor device described in any of the above embodiments can be used for the memory circuit 2007 in FIG. 22. The memory circuit 2007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to retain that content for a long period, that content may be copied to the flash memory 2004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the other structures, methods, and the like described in the other embodiments.

Embodiment 8

A semiconductor device disclosed in this specification can be applied to a variety of electronic devices (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment are described.

Figure 23A:
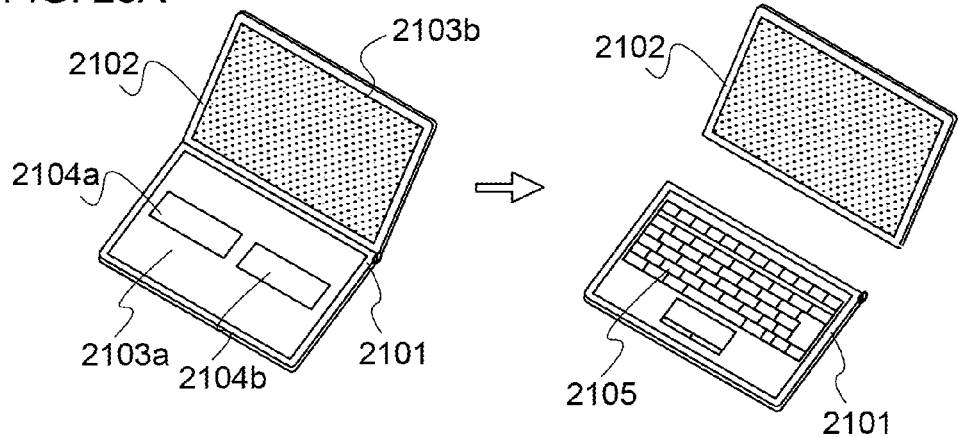
FIGS. 23A to 23E illustrate electronic devices.

FIG. 23A illustrates a portable personal computer which includes a housing 2101, a housing 2102, a first display portion 2103a, a second display portion 2103b, and the like. A variety of electronic components (e.g., CPU, MPU, or a memory element) are incorporated inside the housing 2101 and the housing 2102. Further, electronic circuits (e.g., a driver circuit and a selection circuit) necessary for displaying an image are mounted on the first display portion 2103a and the second display portion 2103b. The semiconductor device described in any of the above embodiments is used in these electronic components and electronic circuits, whereby a portable information terminal with high reliability can be provided. Note that the semiconductor device according to any of the above embodiments is preferably provided in at least one of the housing 2101 and the housing 2102.

At least one of the first display portion 2103a and the second display portion 2103b is a touch panel, and for example, as illustrated in the left in FIG. 23A, which of "touch input" and "keyboard input" is performed can be selected by selection buttons 2104a and 2104b displayed on the first display portion 2103a. Since the selection buttons with a variety of sizes can be displayed, the portable information terminal can be easily used by people of any generation. In the case where "touch input" is selected, for example, a keyboard 2105 is displayed on the first display portion 2103a as illustrated in the right in FIG. 23A. With such a structure, letters can be input quickly by keyboard input as in the case of using a conventional information terminal, for example.

Further, the housing 2101 and the housing 2102 of the portable personal computer in FIG. 23A can be separated as illustrated in the right in FIG. 23A. This structure enables very convenient operations; for example, screen data can be controlled from the housing 2102 while the screen data is shared by a plurality of people with the housing 2101 hung on a wall. Note that in the case where the device is not in use, the housing 2101 and the housing 2102 are preferably made to overlap such that the first display portion 2103a faces the second display portion 2103b. In this manner, the first display portion 2103a and the second display portion 2103b can be protected from an external shock or the like. Further, the second display portion 2103b also functions as a panel having a touch input function, which contributes to a further reduction in weight when the portable personal computer is carried around by carrying one of the display portions as needed.

The portable personal computer illustrated in FIG. 23A can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable personal computer illustrated in FIG. 23A may transmit and receive data wirelessly. Through wireless communication, desired book data or the like can be purchased and downloaded from an electronic book server.

Further, the housing 2101 or the housing 2102 illustrated in FIG. 23A may be equipped with an antenna, a microphone function, or a wireless communication function, so that the portable information terminal may be used as a mobile phone.

Figure 23B:
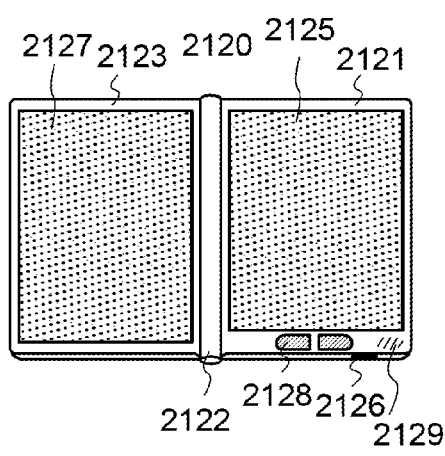

FIG. 23B illustrates an example of an e-book reader. For example, an e-book reader 2120 includes two housings of a housing 2121 and a housing 2123. The housing 2121 and the housing 2123 are combined with a hinge 2122 so that the e-book reader 2120 can be opened and closed with the hinge 2122 as an axis. With such a structure, the e-book reader 2120 can operate like a paper book.

A display portion 2125 and a display portion 2127 are incorporated in the housing 2121 and the housing 2123, respectively. The display portion 2125 and the display portion 2127 may display one image or different images. In the case where the display portion 2125 and the display portion 2127 display different images, for example, text can be displayed on a display portion on the right side (the display portion 2125 in FIG. 23B) and images can be displayed on a display portion on the left side (the display portion 2127 in FIG. 23B). By applying the semiconductor device described in any of the above embodiments, the e-book reader 2120 can have high reliability.

FIG. 23B illustrates an example in which the housing 2121 is provided with an operation portion and the like. For example, the housing 2121 is provided with a power switch 2126, an operation key 2128, a speaker 2129, and the like. The page can be turned with the operation key 2128. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 2120 may have a function of an electronic dictionary.

The e-book reader 2120 may be configured to transmit and receive data wirelessly. Through wireless communication, desired book data or the like can be purchased and downloaded from an electronic book server.

Figure 23C:
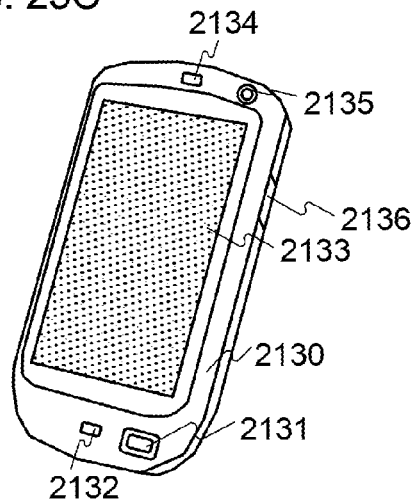

FIG. 23C illustrates a smartphone, which includes a housing 2130, a button 2131, a microphone 2132, a display portion 2133 provided with a touch panel, a speaker 2134, and a camera lens 2135 and functions as a mobile phone. By applying the semiconductor device described in the above-described embodiments, the smartphone can have high reliability.

The display portion 2133 changes the direction of display as appropriate depending on a use mode. Since the camera lens 2135 is provided on the same plane as the display portion 2133, videophone is possible. The speaker 2134 and the microphone 2132 can be used not only for voice calls, but also for video phone calls, recording, playing sound, and the like.

An external connection terminal 2136 can be connected to an AC adapter and various types of cables such as a USB cable, and charging and data communication with a personal computer are possible. Furthermore, a large amount of data can be stored and moved by inserting a storage medium into the external memory slot (not illustrated).

Further, in addition to the above functions, an infrared communication function, a television reception function, or the like may be provided.

Figure 23D:
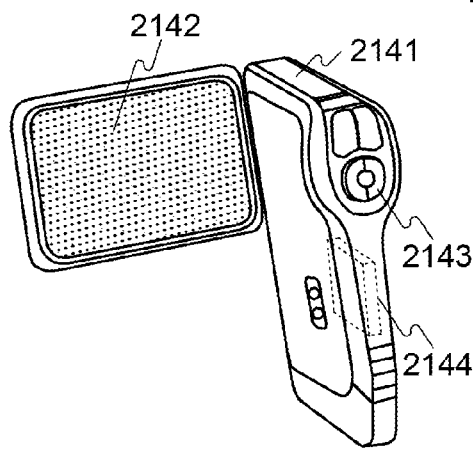

FIG. 23D illustrates a digital video camera which includes a main body 2141, a display portion 2142, an operation switch 2143, a battery 2144, and the like. By applying the semiconductor device described in any of the above embodiments, the digital video camera can have high reliability.

Figure 23E:
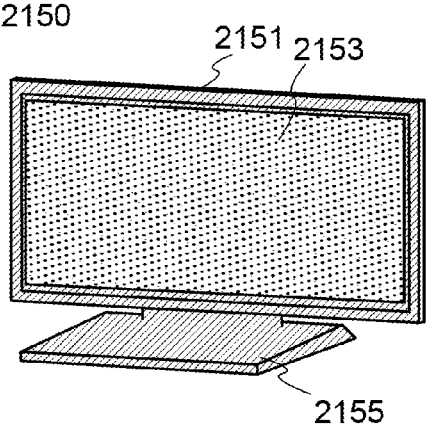

FIG. 23E illustrates an example of a television set. In a television set 2150, a display portion 2153 is incorporated in a housing 2151. The display portion 2153 can display images. In this example, the housing 2151 is supported by a stand 2155. By applying the semiconductor device described in any of the above embodiments, the television set 2150 can have high reliability.

The television set 2150 can be operated with an operation switch of the housing 2151 or a separate remote controller. Further, the remote controller may be provided with a display portion for displaying data output from the remote controller.

Note that the television set 2150 is provided with a receiver, a modem, and the like. Moreover, when the display device is connected to a communication network with or without wires via the modem, one-way (from a sender to a receiver) or two-way (between a sender and a receiver or between receivers) information communication can be performed.

The methods and structures described in this embodiment can be combined as appropriate with any of the methods and structures described in the other embodiments.

This application is based on Japanese Patent Application serial No. 2012-013985 filed with Japan Patent Office on Jan. 26, 2012, the entire contents of which are hereby incorporated by reference.

What is claimed is:
1. A semiconductor device comprising a transistor and a capacitor, the transistor comprising:
  an oxide semiconductor film over an insulating surface;
  a gate insulating film over the oxide semiconductor film;
  a gate electrode over the gate insulating film;
  a first electrode film covering an end portion of the oxide semiconductor film, and in direct contact with the end portion of the oxide semiconductor film; and
  a second electrode film over and in direct contact with the first electrode film, wherein a portion of the second electrode film is in direct contact with a top surface of the oxide semiconductor film,
  the capacitor comprising:
    a lower electrode film;
    an insulating film over the lower electrode film; and
    an upper electrode film over the insulating film.

2. The semiconductor device according to claim 1, further comprising a second transistor under the transistor,
  wherein an active layer of the second transistor comprises silicon, germanium, or a compound semiconductor material, and
  wherein the second transistor is electrically connected to at least the transistor or the capacitor.

3. The semiconductor device according to claim 2, wherein the active layer of the second transistor comprises a film obtained using separation of part of a single crystal semiconductor substrate or a compound semiconductor substrate.

4. The semiconductor device according to claim 2, wherein the second transistor is positioned over a flexible substrate, and wherein the transistor is positioned over the second transistor.

5. The semiconductor device according to claim 1, wherein the oxide semiconductor film includes indium, gallium and zinc.

6. The semiconductor device according to claim 1, wherein the first electrode film and the lower electrode film are over and in direct contact with the insulating surface.

7. The semiconductor device according to claim 1, wherein the insulating film is same as the gate insulating film, and the upper electrode film is same as the gate electrode.

8. The semiconductor device according to claim 1, wherein the semiconductor device is one selected from the group consisting of a portable personal computer, an e-book reader, a smartphone, a digital video camera and a television set.

9. A semiconductor device comprising a transistor, the transistor comprising:
  an oxide semiconductor film over an insulating surface;
  a gate insulating film over the oxide semiconductor film;
  a gate electrode over the gate insulating film;
  a first electrode film covering an end portion of the oxide semiconductor film and in direct contact with the end portion of the oxide semiconductor film; and
  a second electrode film over and in direct contact with the first electrode film, wherein a portion of the second electrode film is in direct contact with a top surface of the oxide semiconductor film.

10. The semiconductor device according to claim 9, further comprising a second transistor under the transistor,
  wherein an active layer of the second transistor comprises silicon, germanium, or a compound semiconductor material, and
  wherein the second transistor is electrically connected to the transistor.

11. The semiconductor device according to claim 10, wherein the active layer of the second transistor comprises a film obtained using separation of part of a single crystal semiconductor substrate or a compound semiconductor substrate.

12. The semiconductor device according to claim 10, wherein the second transistor is positioned over a flexible substrate, and wherein the transistor is positioned over the second transistor.

13. The semiconductor device according to claim 9, wherein the oxide semiconductor film includes indium, gallium and zinc.

14. The semiconductor device according to claim 9, wherein the semiconductor device is one selected from the group consisting of a portable personal computer, an e-book reader, a smartphone, a digital video camera and a television set.

* * * * *